United States Patent
Yamazaki et al.

(10) Patent No.: US 8,284,142 B2
(45) Date of Patent: Oct. 9, 2012

(54) DISPLAY DEVICE

(75) Inventors: Shunpei Yamazaki, Tokyo (JP); Takeshi Osada, Kanagawa (JP); Hidekazu Miyairi, Kanagawa (JP); Yasuhiro Jinbo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 490 days.

(21) Appl. No.: 12/567,413

(22) Filed: Sep. 25, 2009

(65) Prior Publication Data

US 2010/0079425 A1   Apr. 1, 2010

(30) Foreign Application Priority Data

Sep. 30, 2008  (JP) ................................. 2008-252418

(51) Int. Cl.
*G09G 3/36*  (2006.01)
(52) U.S. Cl. ......................................................... 345/92
(58) Field of Classification Search .................... 345/92, 345/76, 83, 98, 100, 107, 204, 206, 209, 345/212, 214, 690
See application file for complete search history.

(56) References Cited

U.S. PATENT DOCUMENTS

| | | | |
|---|---|---|---|
| 4,409,134 A | 10/1983 | Yamazaki | |
| 5,986,724 A * | 11/1999 | Akiyama et al. ................ | 349/41 |
| 6,011,532 A * | 1/2000 | Yanai et al. ..................... | 345/92 |
| 6,028,472 A | 2/2000 | Nagumo | |
| 6,359,605 B1 * | 3/2002 | Knapp et al. .................... | 345/76 |
| 6,518,946 B2 * | 2/2003 | Ode et al. ........................ | 345/98 |
| 6,577,302 B2 * | 6/2003 | Hunter et al. ................... | 345/204 |
| 6,747,627 B1 | 6/2004 | Koyama et al. | |
| 6,943,764 B1 | 9/2005 | Koyama et al. | |
| 6,958,489 B2 * | 10/2005 | Kimura ............................ | 257/40 |
| 7,046,240 B2 * | 5/2006 | Kimura ............................ | 345/212 |
| 7,067,844 B2 | 6/2006 | Yamazaki | |
| 7,142,203 B2 * | 11/2006 | Hiroki et al. ................... | 345/209 |
| 7,176,910 B2 * | 2/2007 | Tsuchi ............................. | 345/204 |
| 7,400,320 B2 * | 7/2008 | Nakajima et al. .............. | 345/204 |
| 7,411,586 B2 * | 8/2008 | Kimura ........................... | 345/214 |
| 7,782,121 B2 * | 8/2010 | Jinta .............................. | 327/536 |
| 8,009,159 B2 * | 8/2011 | Hiroki et al. ................... | 345/209 |
| 8,031,188 B2 * | 10/2011 | Nakajima et al. .............. | 345/204 |
| 2001/0017372 A1 | 8/2001 | Koyama | |
| 2002/0044111 A1 | 4/2002 | Yamazaki et al. | |
| 2009/0021539 A1 * | 1/2009 | Kimura ........................... | 345/690 |
| 2009/0066635 A1 * | 3/2009 | Hong et al. ..................... | 345/107 |
| 2009/0321737 A1 | 12/2009 | Isa et al. | |
| 2010/0096631 A1 | 4/2010 | Miyairi et al. | |
| 2010/0124804 A1 | 5/2010 | Takahashi et al. | |
| 2010/0148177 A1 | 6/2010 | Koyama et al. | |

FOREIGN PATENT DOCUMENTS

| | | |
|---|---|---|
| JP | 2002-049333 | 2/2002 |
| JP | 2005-049832 | 2/2005 |

\* cited by examiner

*Primary Examiner* — Fred Tzeng
(74) *Attorney, Agent, or Firm* — Nixon Peabody LLP; Jeffrey L. Costellia

(57) ABSTRACT

A display device of which frame can be narrowed and of which display characteristics are excellent is provided. In a display device including a switch portion or a buffer portion, a logic circuit portion, and a pixel portion, the pixel portion includes a first inverted staggered TFT and a pixel electrode which is connected to a wiring of the first inverted staggered TFT, the switch portion or the buffer portion includes a second inverted staggered TFT in which a first insulating layer, a semiconductor layer, and a second insulating layer are interposed between a first gate electrode and a second gate electrode, the logic circuit portion includes an inverter circuit including a third inverted staggered thin film transistor and a fourth inverted staggered thin film transistor, and the first to the fourth inverted staggered thin film transistors have the same polarity. The inverter circuit may be an EDMOS circuit.

40 Claims, 29 Drawing Sheets

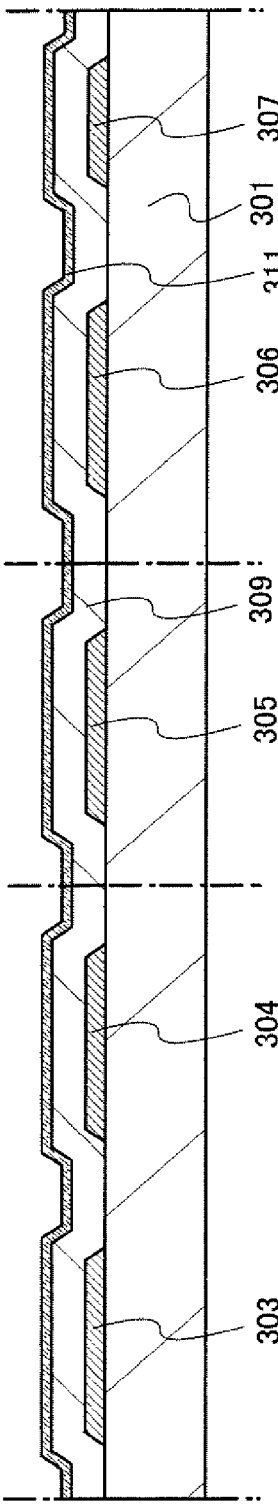
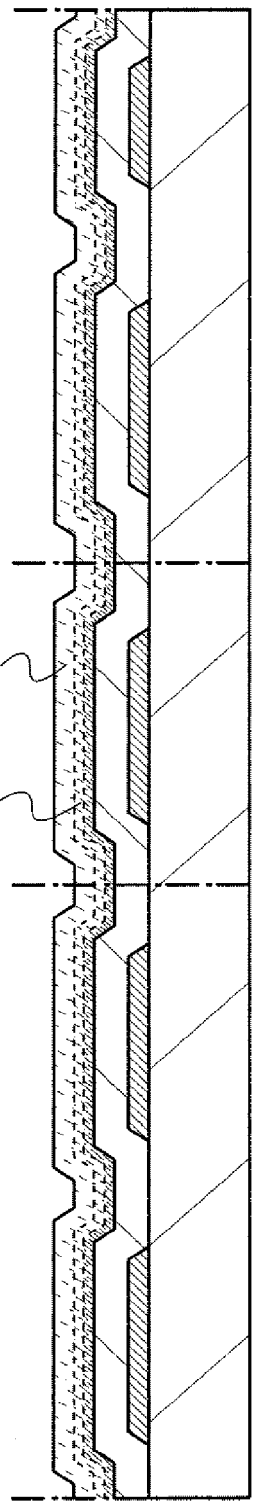
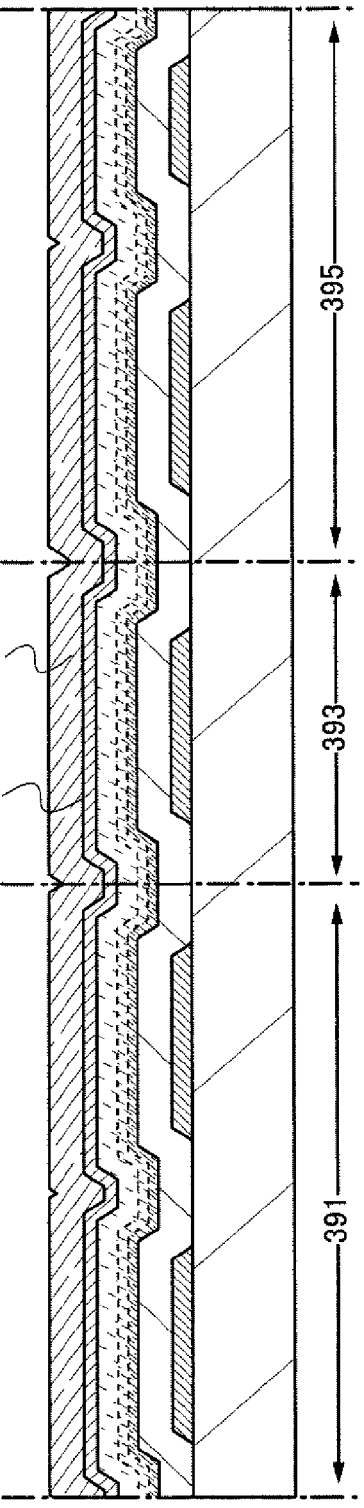
FIG. 15A
FIG. 15B
FIG. 15C

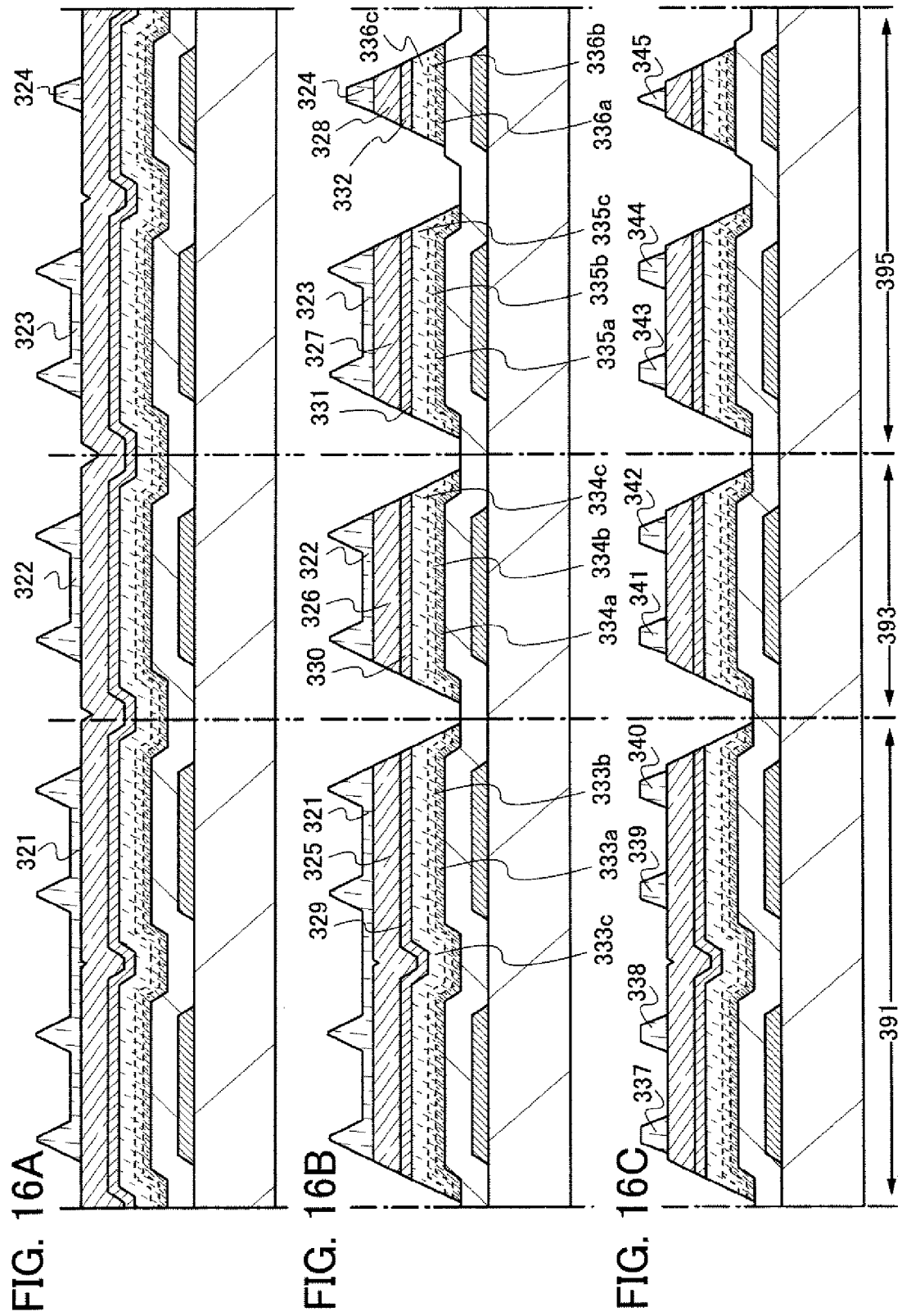

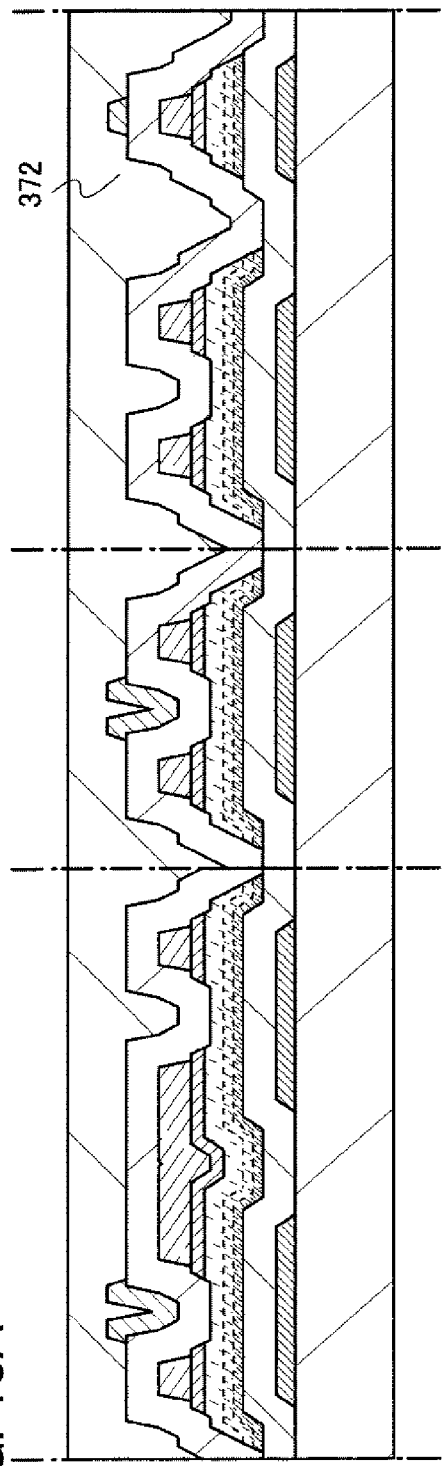
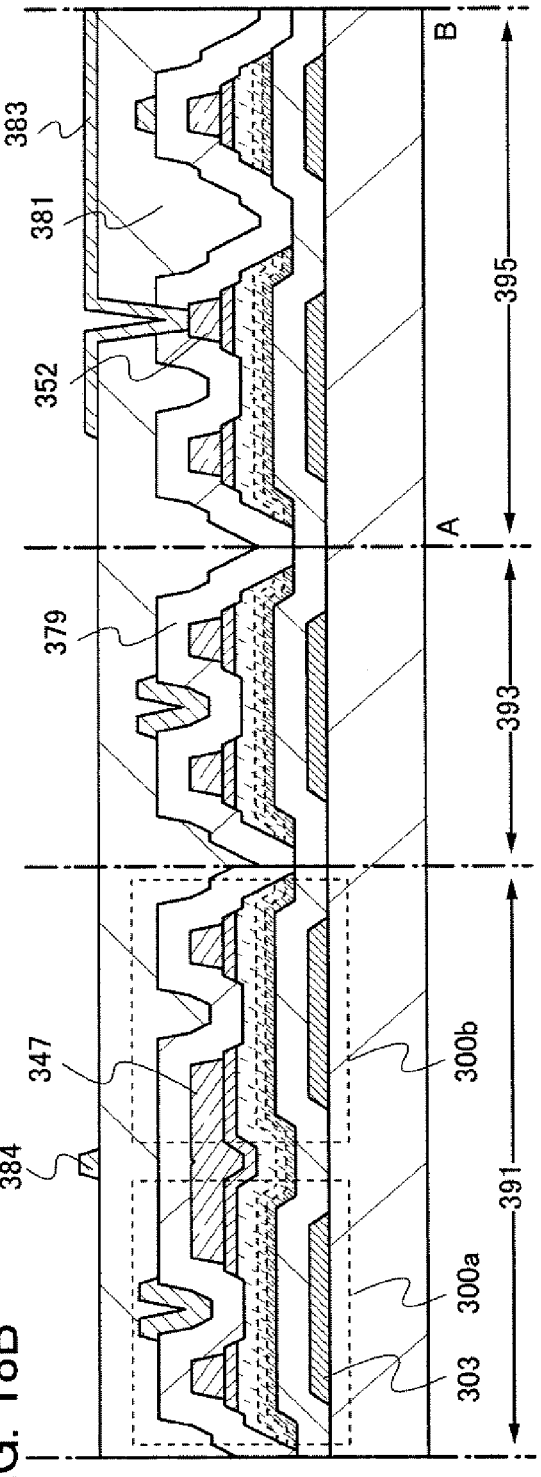

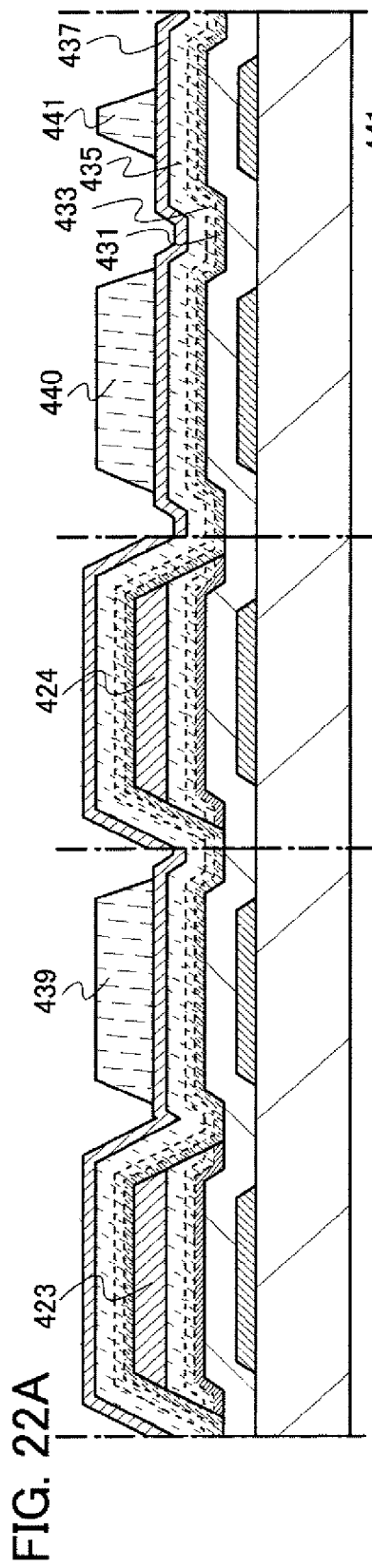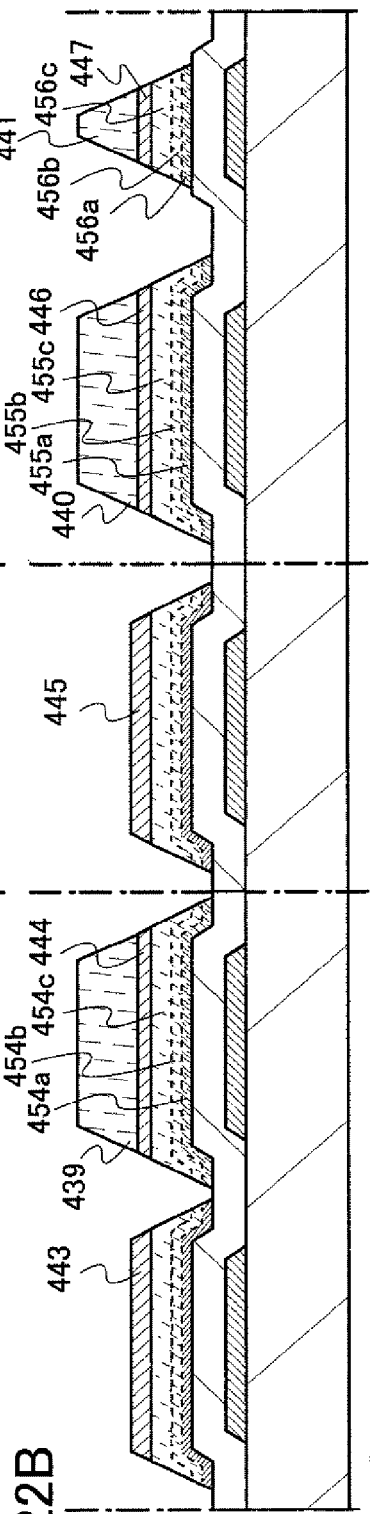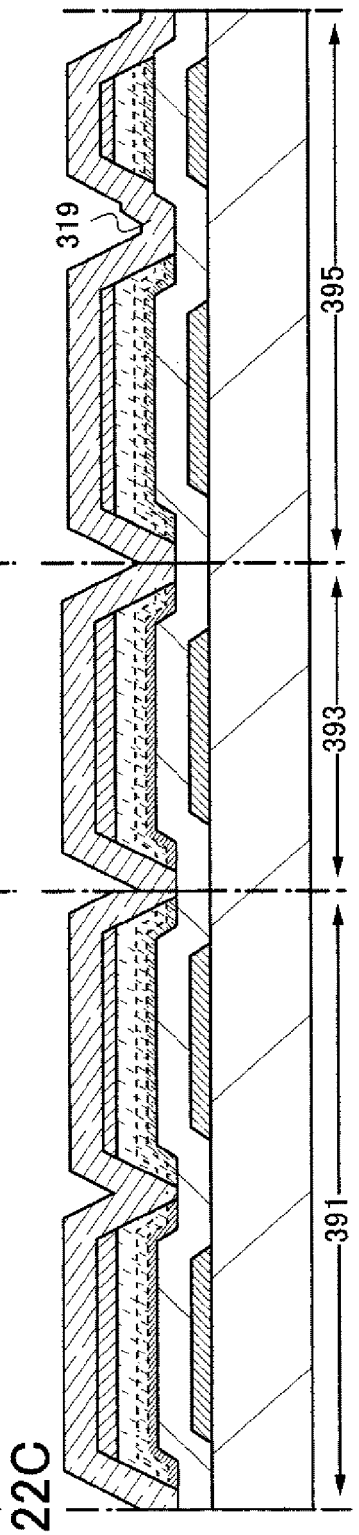

DISPLAY DEVICE

BACKGROUND OF THE INVENTION

1. Field of the Invention

The present invention relates to a display device having an inverted staggered thin film transistor in each of a driver circuit and a pixel portion.

2. Description of the Related Art

As one kind of field-effect transistors, a thin film transistor in which a channel formation region is formed in a semiconductor layer formed over a substrate having an insulating surface is known. Techniques in which amorphous silicon, microcrystalline silicon, or polycrystalline silicon is used for semiconductor layers used in thin film transistors have been disclosed. A typical application of a thin film transistor is a liquid crystal television device in which the thin film transistor has been put to the practical use as a switching transistor for each pixel included in a display panel.

Further, for reduction of the cost of a display device, there is a display device of which the number of external components is reduced and in which thin film transistors formed using amorphous silicon or microcrystalline silicon are used for a gate driver (see Patent Document 1).

REFERENCE

Patent Document

[Patent Document 1] Japanese Published Patent Application No. 2005-049832

SUMMARY OF THE INVENTION

The thin film transistor in which an amorphous silicon layer is used for forming a channel formation region has problems such as a low field-effect mobility and a small on current. Further, when the thin film transistor is used for a long-term, there are problems in that the thin film transistor is deteriorated, the threshold voltage is shifted, and on current is lowered. In the case where a driver circuit such as a gate driver is formed using the thin film transistors in which an amorphous silicon layer is used for the channel formation region, the width of the channel formation region is widened, and the area occupied by the thin film transistors is enlarged. Thus, a sufficient on current is maintained even when on current is lowered due to the shift of the threshold voltage.

Alternatively, the number of the thin film transistors included in the driver circuit is increased and an operating period of each of the thin film transistors is shortened, so that deterioration of the thin film transistors is reduced and a sufficient on current is maintained.

Therefore, in a display device of which driver circuit is formed using thin film transistors in which an amorphous silicon layer is used for the channel formation region, the area occupied by the driver circuit is large, narrowing a frame of the display device is prevented, and the area of a pixel portion which is a display region is reduced.

On the other hand, the thin film transistor in which a microcrystalline silicon layer is used for the channel formation region has problems in that, whereas the field-effect mobility is higher than that of the thin film transistor using amorphous silicon, the off current is high, so that sufficient switching characteristics cannot be obtained.

The thin film transistor in which a polycrystalline silicon layer is used for a channel formation region has characteristics in that the field-effect mobility is far higher than those of the abode-described two kinds of thin film transistors and high on current can be obtained. Because of such characteristics, this thin film transistor can be used not only as a switching transistor provided in a pixel but also as a transistor provided in a driver circuit for which high-speed operation is required.

However, the thin film transistor in which a polycrystalline silicon layer is used for the channel formation region has a problem in that the manufacturing cost becomes higher than that of the thin film transistor using an amorphous silicon layer due to the necessity for a step of crystallizing a semiconductor layer. For example, the laser annealing technique involved in the process for manufacturing a polycrystalline silicon layer has a problem in that the irradiated area with a laser beam is small and large-screen liquid crystal panels cannot be produced efficiently.

In view of the above problems, one object of an embodiment of the present invention is to provide a display device of which manufacturing cost can be reduced and of which display characteristics of an image are excellent. Further, another object of an embodiment of the present invention is to provide a display device of which manufacturing cost can be reduced and of which frame can be narrowed.

The present invention relates to a display device that includes a driver circuit portion and a pixel portion. The driver circuit portion includes a logic circuit portion and a switch portion or a buffer portion. TFTs included in the driver circuit portion and the pixel portion are inverted staggered TFTs having the same polarity. The switch portion or the buffer portion is formed using the inverted staggered TFTs through which a large amount of on current can flow, and the logic circuit portion is formed using an inverter circuit (hereinafter referred to as an EDMOS circuit) including a depletion type TFT and an enhancement type TFT.

As a TFT through which a large amount of on current can flow, a dual-gate type inverted staggered TFT or a depletion type inverted staggered TFT is used.

An EDMOS circuit includes two or more inverted staggered TFTs of which threshold voltages are different from one another, typically a depletion type TFT and an enhancement type TFT. The depletion type TFT is formed using a dual-gate type inverted staggered thin film transistor provided with a first gate electrode, a first gate insulating layer, a semiconductor layer formed over the first gate insulating layer, a second gate insulating layer formed over the semiconductor layer, and a second gate electrode formed over the second gate insulating layer; therefore, the threshold voltage is controlled and the EDMOS circuit can be formed.

Alternatively, as the depletion type TFT, an inverted staggered TFT including a semiconductor layer in which an impurity element serving as a donor is added to the channel formation region is used, and as the enhancement type TFT, a semiconductor layer in which an impurity element serving as a donor is not added to the channel formation region is used; thus, the EDMOS circuit can be formed.

Alternatively, as the depletion type TFT, an inverted staggered TFT including a semiconductor layer in which an impurity element serving as an acceptor is not added to the channel formation region is used, and as the enhancement type TFT, a TFT including a semiconductor layer in which an impurity element serving as an acceptor is added to the channel formation region is used; thus, the EDMOS circuit can be formed.

Further, the inverted staggered TFT manufactured in the display device of the present invention includes a gate electrode, a gate insulating layer formed over the gate electrode, a semiconductor layer formed over the gate insulating layer, an impurity semiconductor layers serving as a source region and a drain region formed over the semiconductor layer, and a wiring. As to the semiconductor layer formed over the gate insulating layer, a microcrystalline layer is formed on the gate insulating layer side, and an amorphous semiconductor layer is formed on the source region and the drain region side. Alternatively, the microcrystalline semiconductor layer is formed on the gate insulating layer side, and the amorphous semiconductor layer is formed on the source region and the drain region side, and further, conical or pyramidal shape microcrystalline semiconductor regions and amorphous semiconductor regions filling the space except the microcrystalline semiconductor regions are formed between the microcrystalline semiconductor layer and the amorphous semiconductor layer. Therefore, in the inverted staggered TFT, on current can be increased and off current thereof can be lowered.

Note that on current refers to current which flows between a source electrode and a drain electrode while a transistor is in an on-state. For example, in the case of an n-type transistor, on current refers to current, which flows between the source electrode and the drain electrode when a gate voltage is higher than a threshold voltage of the transistor.

Further, off current refers to current which flows between the source electrode and the drain electrode while the transistor is in an off-state. For example, in the case of an n-type transistor, off current refers to current that flows between the source electrode and the drain electrode when the gate voltage is lower than the threshold voltage of the transistor.

Note that a display device in this specification means an image display device, a light-emitting device, or a light source (including a lighting device). Further, the display device includes any of the following modules in its category: a module including a connector such as an flexible printed circuit (FPC), tape automated bonding (TAB) tape, or a tape carrier package (TCP); a module having TAB tape or a TCP which is provided with a printed wiring board at the end of the TAB tape or TCP; and a module having an integrated circuit (IC) which is directly mounted on a display element by a chip on glass (COG) method.

According to the present invention, the display characteristics of an image can be improved while the cost of the display device can be reduced. Further, the frame of the display device can be narrowed, and thus, the display region of the display device can be enlarged.

BRIEF DESCRIPTION OF THE DRAWINGS

FIGS. 15A to 15C are cross-sectional views illustrating a method for manufacturing a display device according to an embodiment of the present invention.

FIGS. 16A to 16C are cross-sectional views illustrating a method for manufacturing a display device according to an embodiment of the present invention.

FIGS. 18A and 18B are cross-sectional views illustrating a method for manufacturing a display device according to an embodiment of the present invention.

FIGS. 19A-1 to 19B-2 are views illustrating multi-tone masks which can be applied to a method for manufacturing a display device according to an embodiment of the present invention.

FIGS. 22A to 22C are cross-sectional views illustrating a method for manufacturing a display device according to an embodiment of the present invention.

DETAILED DESCRIPTION OF THE INVENTION

Figure 1A:
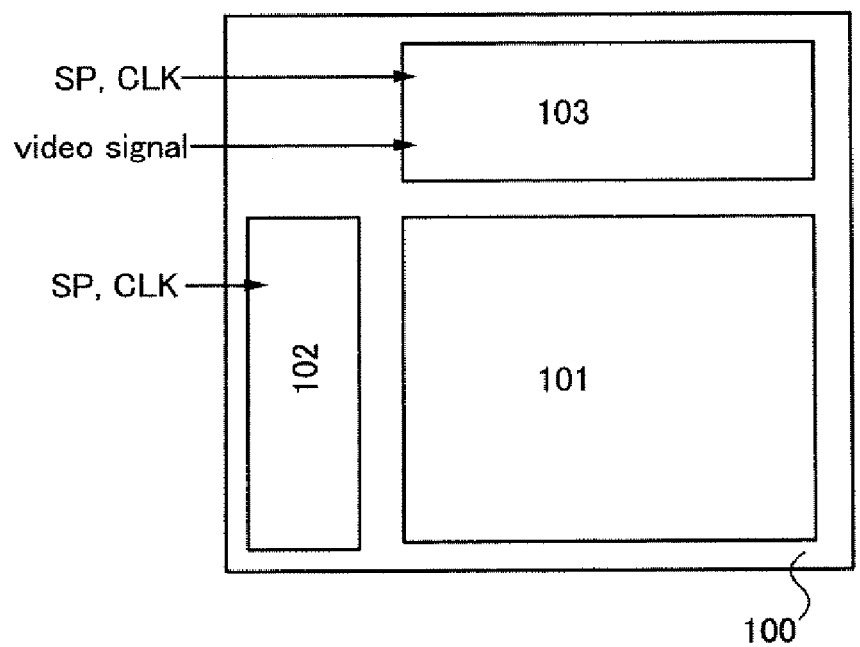
FIGS. 1A and 1B are block diagrams each illustrating a whole display device according to an embodiment of the present invention.

Embodiments of the present invention will be described below with reference to the accompanying drawings. However, the present invention is not limited to the following description. It is easily understood by those skilled in the art that the modes and details of the present invention can be variously changed unless departing from the scope and the spirit of the present invention. Accordingly, the present invention should not be interpreted as being limited to the description of the embodiments and examples to be given below. Note that the same reference numerals are commonly used to denote the same components among different drawings in structures of the present invention described below.

Embodiment 1

In this Embodiment, a display device that is one embodiment of the present invention will be described with reference to a block diagram and the like.

FIG. 1A illustrates an example of a block diagram of an active matrix liquid crystal display device. The liquid crystal display device illustrated in FIG. 1A includes a pixel portion 101 including a plurality of pixels each provided with a display element, a scan line driver circuit 102 controlling a scan line connected to a gate electrode of each pixel, and a signal line driver circuit 103 controlling a video signal input to a selected pixel over a substrate 100.

Figure 1B:
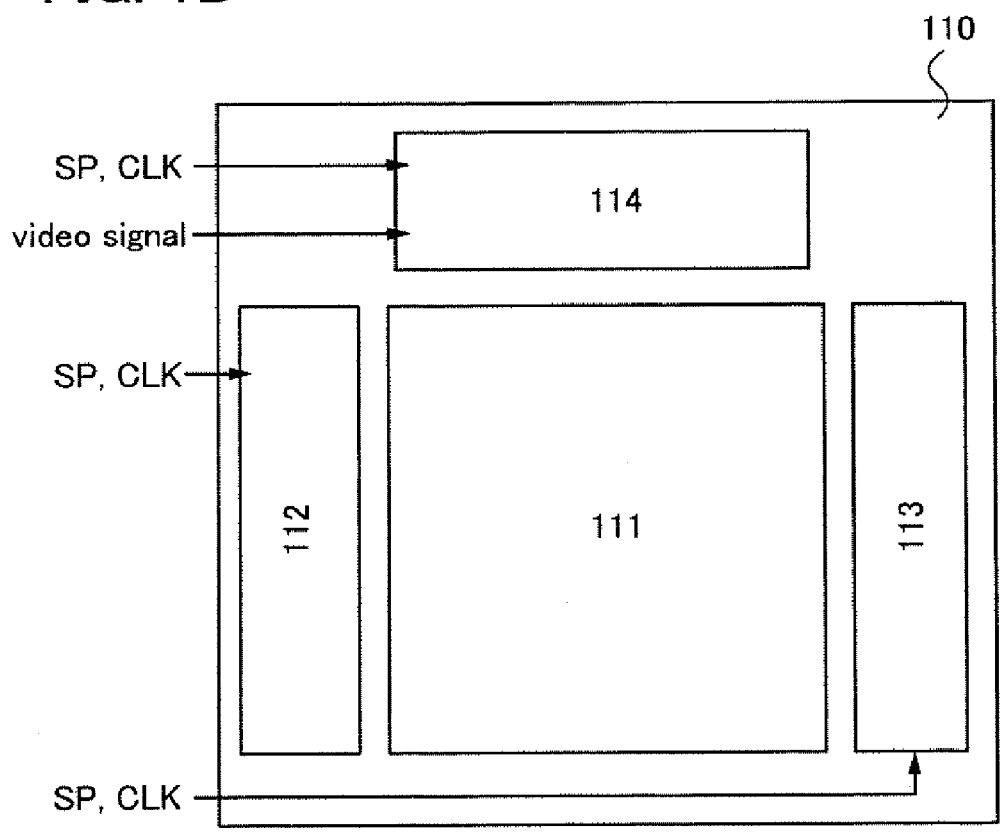

FIG. 1B illustrates an example of a block diagram of an active matrix light-emitting display device to which the present invention is applied. The light-emitting display device illustrated in FIG. 1B includes a pixel portion 111 including a plurality of pixels each provided with a display element, a first scan line driver circuit 112 and a second scan line driver circuit 113 which control a scan line connected to a gate electrode of each pixel, and a signal line driver circuit 114 controlling a video signal input to a selected pixel, over a substrate 110. In the case where two TFTs, i.e., a switching TFT (thin film transistor, hereinafter, referred to as a TFT) and a current controlling TFT are placed in one pixel, in the light-emitting display device illustrated in FIG. 1B, a signal inputted to a first scan line connected to a gate electrode of the switching TFT is generated in the first scan line driver circuit 112 and a signal inputted to a second scan line connected to a gate electrode of the current controlling TFT is generated in the second scan line driver circuit 113. Alternatively, the signal inputted to the first scan line and the signal inputted to the second scan line may be generated in one scan line driver circuit. Further alternatively, for example, a plurality of the first scan lines, which are used to control the operation of a switching element, may be provided in each pixel depending on the number of TFTs included in the switching element. In this case, all signals inputted to a plurality of the first scan lines may be generated in one scan line driver circuit or, by providing a plurality of scan line driver circuits, may be generated in their respective scan line driver circuits.

Note that, although a mode of forming the scan line driver circuit 102, the first scan line driver circuit 112, the second scan line driver circuit 113, and the signal line driver circuits 103 and 114 in the display device is shown here, part of the scan line driver circuit 102, the first scan line driver circuit 112, or the second scan line driver circuit 113 may be mounted using a semiconductor device such as an IC. Further, part of the signal line driver circuits 103 and 114 may be mounted using a semiconductor device such as an IC.

Figure 2:
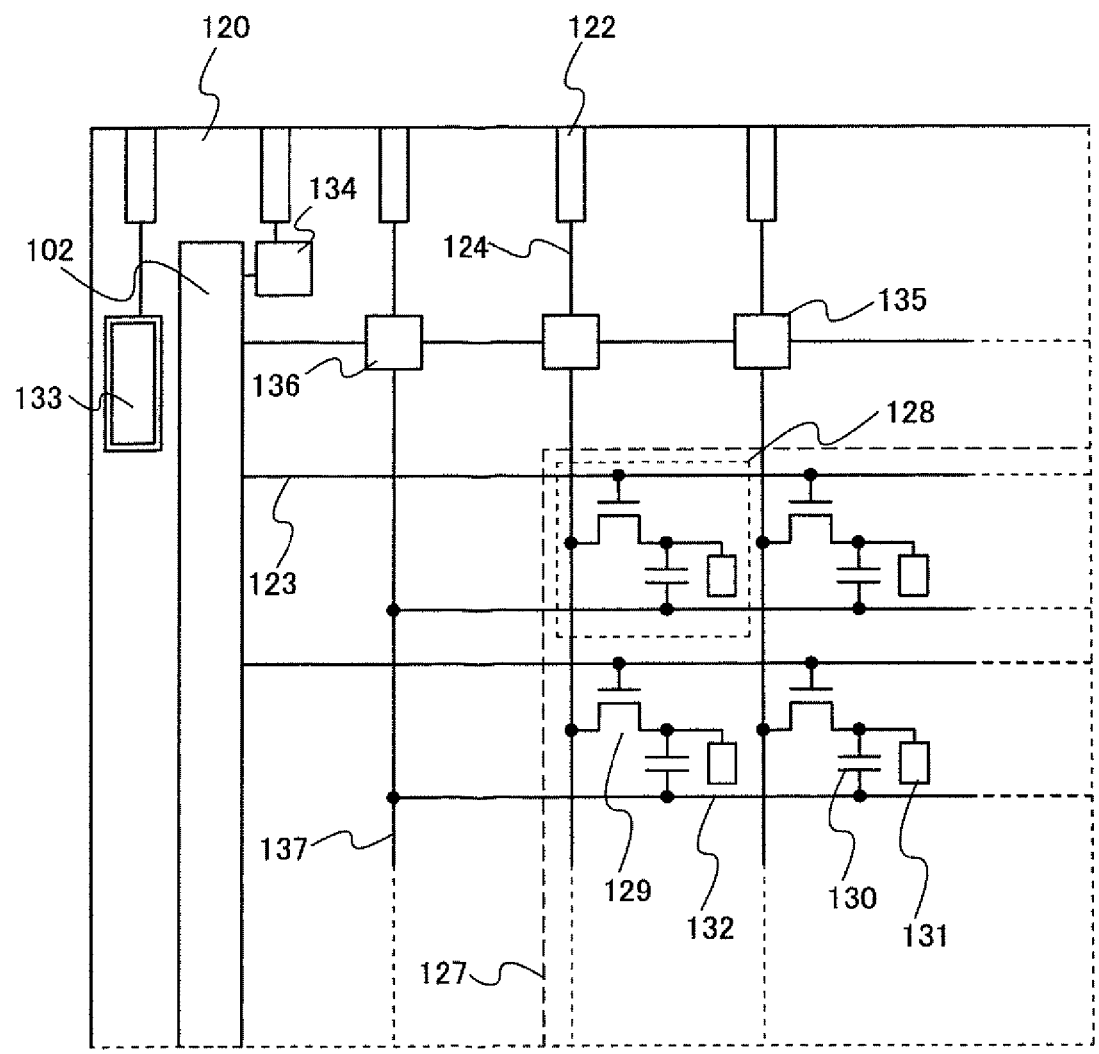
FIG. 2 is a diagram illustrating arrangement of wirings, input terminals, and the like of a display device according to an embodiment of the present invention.

FIG. 2 illustrates positional relations of signal input terminals, scan lines, signal lines, protection circuits including nonlinear elements, and a pixel portion, which are included in the display device. A scan line 123 and a signal line 124 are placed to cross each other and a pixel portion 127 is formed over a substrate 120 having an insulating surface. Note that the pixel portion 127 corresponds to the pixel portion 101 in FIG. 1A or the pixel portion 111 in FIG. 1B.

The pixel portion 127 is formed by arranging a plurality of pixels 128 in a matrix. A pixel TFT 129 connected to the scan line 323 and the scan line 124, a storage capacitor portion 130, and a pixel electrode 131 are included in the pixel 128.

As to the pixel structure described here, in the storage capacitor portion 130, one electrode is connected to the pixel TFT 129 and the other electrode is connected to a capacitor line 132. The pixel electrode 131 serves as one electrode which drives a display element (e.g. a liquid crystal element, a light-emitting element, a contrast medium (an electronic ink), or the like). The other electrode of the display element is connected to a common terminal 133.

The protection circuits are provided between the pixel portion 127 and signal line input terminals 122. Further, the protection circuits are provided between the scan line driver circuit and the pixel portion 127. In this Embodiment, the plural protection circuits are provided to avoid a break of the pixel TFT 129 or the like due to a surge voltage which is applied to the scan line 123, the signal line 124, and a capacitor wiring 137 by static electricity or the like. Therefore, the protection circuits are formed such that charge is transferred to a common wiring when a surge voltage is applied.

In this Embodiment, an example of positions is shown, where the protection circuit 134 for the scan line 123, the protection circuit 135 for the signal line 124, and the protection circuit 136 for the capacitor wiring 137 are provided. However, the positions where the protection circuits are provided are not limited to the above-mentioned positions. Further, in the case where the scan line driver circuit is not mounted using a semiconductor device such as an IC, the protection circuit 134 is not necessarily provided on the scan line 123 side.

By the use of a TFT of the present invention for these circuits, there are advantages as below.

It is preferable that the pixel TFTs have high switching characteristics. By improving the switching characteristics of the pixel TFTs, the contrast ratio of a display device can be increased. In order to improve the switching characteristics, it is effective that on current is increased and off current is decreased. In the pixel TFT to which the present invention is applied, on current is large and off current is small, so that the switching characteristics thereof can be high, and therefore a thin film transistor with a high contrast ratio can be achieved.

The driver circuit is roughly divided into a logic circuit portion and a switch portion or a buffer portion. Preferably, a TFT provided in the logic circuit portion has a structure that can control a threshold voltage. On the other hand, a TFT provided in the switch portion or the buffer portion has preferably a large amount of on current. Accordingly, the threshold voltage of the TFT provided in the logic circuit portion can be controlled and on current of the TFT provided in the switch portion or in the buffer portion can be large. Moreover, the area occupied by the driver circuit can be reduced and the frame of the display device can be narrowed.

A protection circuit was one of the causes that prevent a frame of a display device from being narrowed because it is provided in the periphery of a pixel portion. However, as regards the display device described in this specification, the area of the protection circuits can be reduced; thus, inhibiting the narrow frame of the display device can be suppressed.

Embodiment 2

In this Embodiment, circuit diagrams of driver circuits of the display device described in Embodiment 1 will be described with reference to FIG. 3, FIG. 4, FIG. 5, and FIG. 6.

First, a shift register circuit included in the scan line driver circuit shown in Embodiment 1 will be described.

Figure 3:
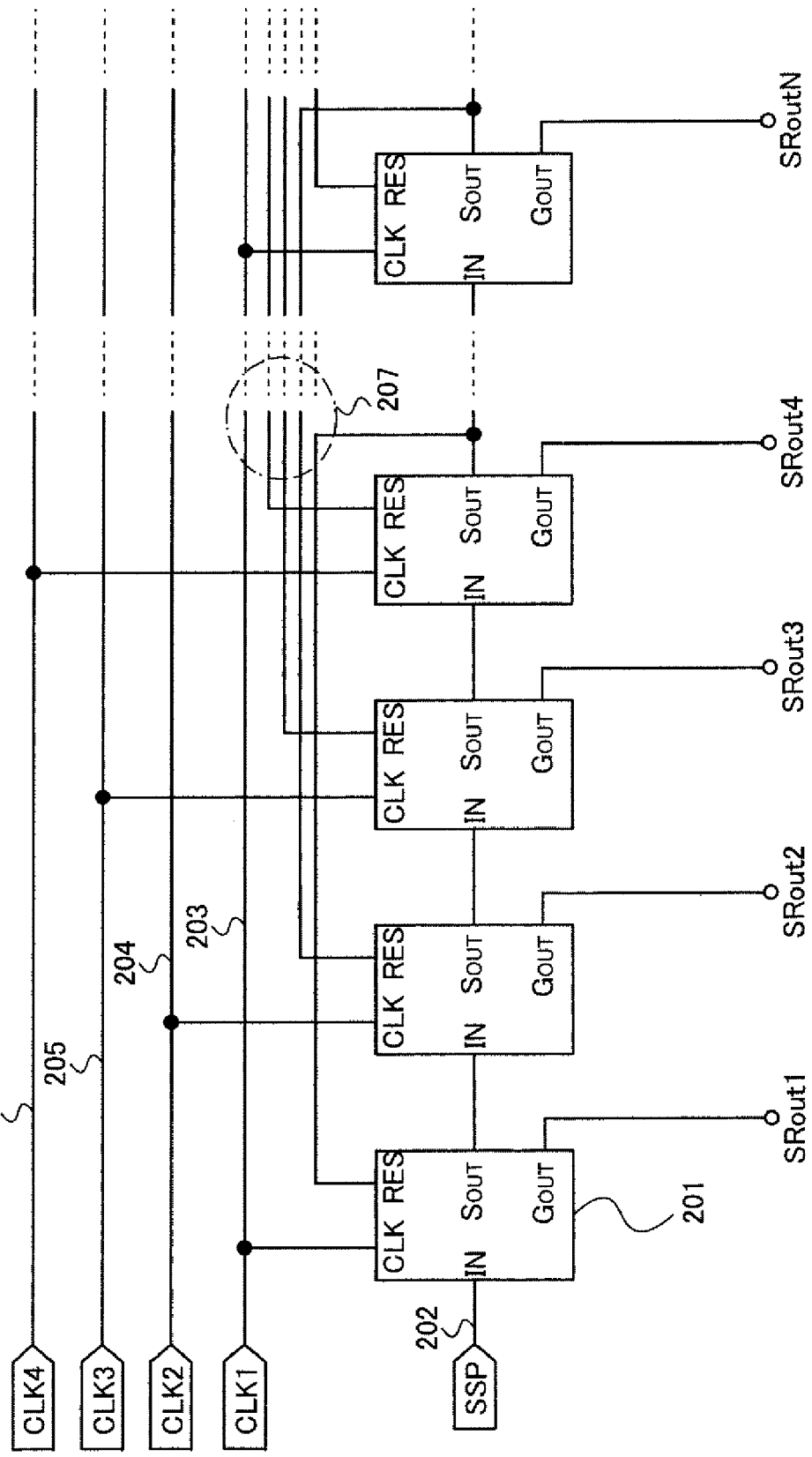
FIG. 3 is a block diagram illustrating a structure of a shift register circuit.

The shift register circuit illustrated in FIG. 3 includes a plurality of flip-flop circuits 201, control signal lines 202, 203, 204, 205, and 206, and reset lines 207.

As in the shift register circuit illustrated in FIG. 3, a start pulse SSP is inputted to an input terminal IN of the flip-flop circuit 201 of the first stage through the control signal line 202. An output signal terminal $S_{out}$ of the flip-flop circuit 201 of the previous stage is connected to an input terminal IN of the flip-flop circuit 201 of the subsequent stages. A reset terminal RES of the N-th stage (N is a natural number) is connected to the output signal terminal $S_{out}$ of the flip-flop circuit of the (N+3-th) stage through the reset line 207. Provided that a first clock signal CLK1 is inputted to a clock terminal CLK of the flip-flop circuit 201 of the N-th stage through the control signal line 203, a second clock signal CLK2 is inputted to a clock terminal CLK of the flip-flop circuit 201 of the (N+1-th) stage through the control signal line 204. A third clock signal CLK3 is inputted to a clock terminal CLK of the flip-flop circuit 201 of the (N+2-th) stage through the control signal line 205. A fourth clock signal CLK4 is inputted to a clock terminal CLK of the flip-flop circuit 201 of the (N+3-th) stage through the control signal line 206. The first clock signal CLK1 is inputted to the clock terminal CLK of the flip-flop circuit 201 of the (N+4-th) stage through the control signal line 203. Further, the flip-flop circuit 201 of the N-th stage outputs $SR_{out}N$ of the flip-flop circuit of the N-th stage from a gate output terminal $G_{out}$.

Note that, although the connection of the flip-flop circuits 201 to a power supply and a power supply line is not illustrated, a power supply potential $V_{dd}$ and a power supply potential GND are supplied to each flip-flop circuit 201 through the power supply line.

Note that the power supply potential described in this specification corresponds to a potential difference in the case where a reference potential is set at 0 V; therefore, in some cases, the power supply potential is referred to as a power supply voltage.

Note that, in this specification, the phase that "A and B are connected" includes the case where A and B are electrically connected in addition to the case where A and B are directly connected. Here, the phase that "A and B are electrically connected" refers to the following situation: in the case where an object which causes some sort of electric action exists between A and B, A and B have substantially the same potential through the object. Specifically, electrical connection between A and B refers to the case where A and B can be regarded to have the same potential in consideration of the circuit operation, such as the case where A and B are connected through a switching element such as a TFT, and A and B have substantially the same potential by the conduction of the switching element, or the case where A and B are connected through a resistor, and a potential difference generated between the both edges of the resistor does not affect operation of a circuit that includes A and B.

Figure 4:
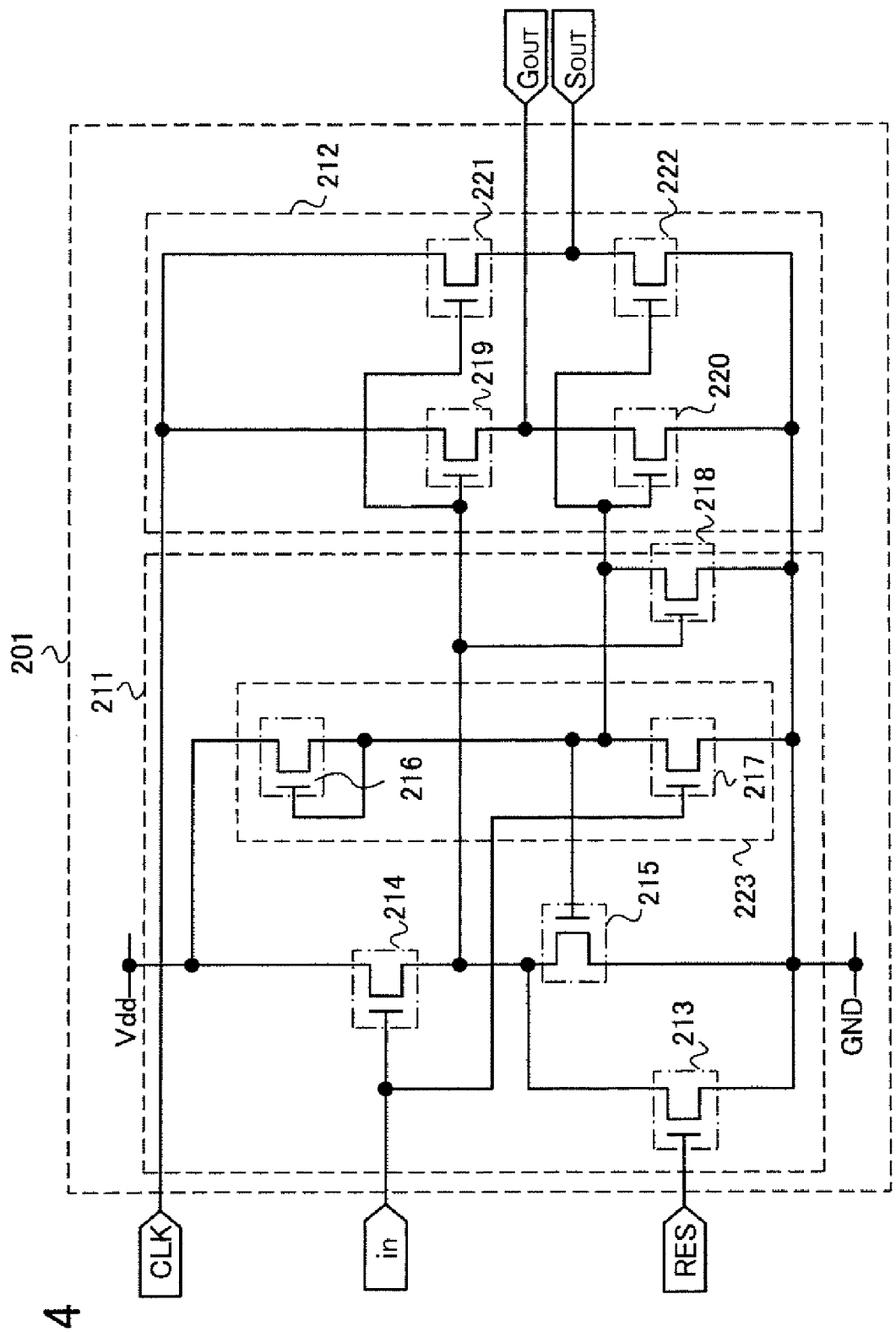
FIG. 4 is a diagram illustrating an example of a flip-flop circuit.

Next, one mode of the flip-flop circuit 201 included in the shift register circuit illustrated in FIG. 3 is shown in FIG. 4. The flip-flop circuit 201 illustrated in FIG. 4 includes a logic circuit portion 211 and a switch portion 212. The logic circuit portion 211 includes TFTs 213 to 218. The switch portion 212 includes TFTs 219 to 222. Note that the logic circuit portion 211 is a circuit for converting a signal outputted to the switch portion 212, which is a next stage circuit in response to a signal inputted from the outside. In addition, the switch portion 212 is a circuit for switching on and off of a TFT serving as a switch in accordance with a signal inputted from the outside and the logic circuit portion 211, and for outputting a current corresponding to the size and the structure of the TFT.

In the flip-flop circuit 201, the input terminal IN is connected to a gate terminal of the TFT 214 and a gate terminal of the TFT 217. The reset terminal is connected to a gate terminal of the TFT 213. The clock terminal CLK is connected to a first terminal of the TFT 219 and a first terminal of the TFT 221. A power supply line to which a power supply potential $V_{dd}$ is supplied is connected to a first terminal of the TFT 214 and a second terminal of the TFT 216. A power supply line to which a power supply potential GND is supplied is connected to a second terminal of the TFT 213, a second terminal of the TFT 215, a second terminal of the TFT 217, a second terminal of the TFT 218, a second terminal of the TFT 220, and a second terminal of the TFT 222. A first terminal of the TFT 213, a second terminal of the TFT 214, a first terminal of the TFT 215, a gate terminal of the TFT 218, a gate terminal of the TFT 219, and a gate terminal of the TFT 221 are connected to one another. A first terminal and a gate terminal of the TFT 216 are connected to a gate terminal of the TFT 215, a first terminal of the TFT 217, a first terminal of the TFT 218, a gate terminal of the TFT 220, and a gate terminal of the TFT 222. The gate output terminal $G_{out}$ is connected to a second terminal of the TFT 219 and a first terminal of the TFT 220. An output signal terminal $S_{out}$ is connected to a second terminal of the TFT 221 and a first terminal of the TFT 222.

Note that, here, the case where all the TFTs 213 to 222 are n-type TFTs will be described. However, the TFTs 213 to 222 may be p-type TFTs.

A TFT is an element including at least three terminals, a gate, a drain, and a source. The TFT includes a channel formation region between a drain region and a source region, and current can flow through the drain region, the channel formation region, and the source region. Here, there is a case that the positions of the source and the drain are switched depending on a structure, operating conditions, or the like of the TFT, so it is difficult to define which is the source or the drain; therefore, the region that serves as a source and the region that serves as a drain are not referred to as a source and a drain, and for example, are expressed as a first terminal and a second terminal respectively. In this case, a terminal that serves as a gate is expressed as a gate terminal.

Figure 5:
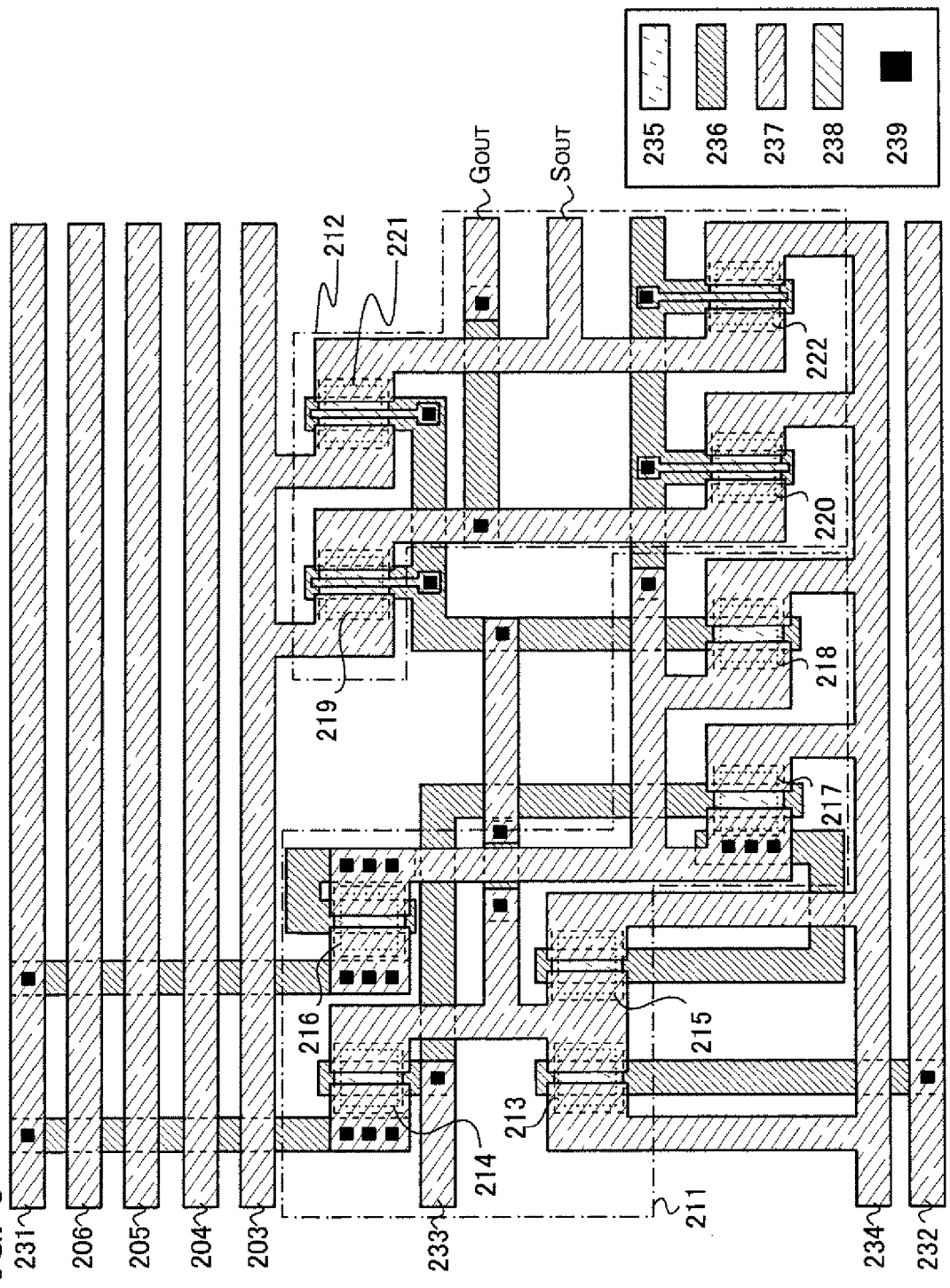
FIG. 5 is a layout view (top view) of the flip-flop circuit.

Next, an example of a layout diagram of the flip-flop circuit 201 illustrated in FIG. 4 is shown in FIG. 5.

The flip-flop circuit in FIG. 5 includes a power supply line 231 to which a power supply potential $V_{dd}$ is supplied, a reset line 232, the control signal line 203, the control signal line 204, the control signal line 205, the control signal line 206, a control signal line 233, a power supply line 234 to which a power supply potential GND is supplied, the logic circuit portion 211, and the switch portion 212. The logic circuit portion 211 includes the TFTs 213 to 218. The switch portion 212 includes the TFTs 219 to 222. Further, FIG. 5 illustrates a wiring connected to the gate output terminal $G_{out}$ and a wiring connected to the output signal terminal $S_{out}$.

In FIG. 5, a semiconductor layer 235, a first wiring layer 236, a second wiring layer 237, a third wiring layer 238, contact holes 239 are illustrated. Note that the first wiring layer 236 may be formed with a layer for forming the gate electrode, the second wiring layer 237 may be formed with a layer for forming the source electrode or the drain electrode of a TFT, and the third wiring layer 238 may be formed with a layer for forming the pixel electrode in the pixel portion.

However, the present invention is not limited to this, and for example, the third wiring layer 238 may be formed as a wiring layer that is different from the layer for forming the pixel electrode.

The connection relations of circuit elements in FIG. 5 are as described in FIG. 4. Note that in FIG. 5, the flip-flop circuit to which the first clock signal is inputted is illustrated and the connections of the flip-flop circuit and the control signal lines 204 to 206 are not illustrated.

In this Embodiment, an EDMOS circuit 223 can be formed by controlling the threshold voltage of the TFT 216 or the TFT 217 included in the logic circuit portion 211 in the layout diagram of the flip-flop circuit in FIG. 5. Typically, one feature of the present invention is that the EDMOS circuit 223 in which the TFT 216 is a depletion type TFT and the TFT 217 is an enhancement type TFT is formed, and the TFTs 219 to 222 included in the switch portion 212 are formed using dual-gate type TFTs or depletion type TFTs.

A semiconductor layer including an impurity element serving as a donor is used for a channel formation region of the depletion type TFT 216, and a semiconductor layer to which an impurity element serving as a donor is not added is used for a channel formation region of the enhancement type TFT 217; thus, the EDMOS circuit 223 can be formed.

Alternatively, a semiconductor layer to which an impurity element serving as an acceptor is not added is used for the channel formation region of the depletion type TFT 216, and a semiconductor layer including an impurity element serving as an acceptor is used for the channel formation region of the enhancement type TFT 217; thus the EDMOS circuit 223 can be formed.

Further alternatively, by forming the depletion type TFT 216 or the enhancement type TFT 217 as a dual-gate TFT and controlling a potential of a back gate electrode, the depletion type TFT 216 or the enhancement type TFT 217 can be formed; thus, the EDMOS circuit 223 can be formed.

Accordingly, TFTs of the display device can be formed using only TFTs having one polarity such as n-type TFTs or p-type TFTs.

The TFT 216 in the logic circuit portion 211 is a TFT which allows current to flow depending on a power supply potential $V_{dd}$. By setting the TFT 216 as a dual-gate TFT or a depletion type TFT to increase the amount of flowing current, reduction in size of the TFT can be achieved without deteriorating performance of the TFT.

As to the TFTs included in the switch portion 212, the amount of current flowing through the TFTs can be increased and switching of on and of can be conducted at high speed, so that the area occupied by the TFTs can be reduced without deteriorating performance of the TFTs. Accordingly, the area occupied by the circuit including the TFTs can also be reduced. Note that the TFTs 219 to 222 in the switch portion 212 may be formed as a dual-gate TFT in which the semiconductor layer 235 is interposed between the first wiring layer 236 and the third wiring layer 238 as illustrated in FIG. 5.

In FIG. 5, although an example of a dual-gate TFT having a structure in which the semiconductor layer 235 is interposed between the first wiring layer 236 and the third wiring layer 238, which is connected to the first wiring layer 236 through contact holes 239 and has the same potential as the first wiring layer 236, is shown, the present invention is not limited to this structure. For example, a structure in which another control signal line is provided with respect to the third wiring layer 238, and the potential of the third wiring layer 238 is controlled independently from the first wiring layer 236 may be employed. The threshold voltage of the TFT is controlled by the third wiring layer 238, and the amount of current flowing through the TFT is increased, whereby, the area occupied by the TFT, moreover, the area occupied by the circuit including the TFTs can be reduced without deteriorating performance of the TFTs.

Note that as to the layout diagram of the flip-flop circuit of FIG. 5, the shape of the channel formation regions of the TFTs 213 to 222 may be U-shape (reversed C shape, horseshoe shape). Further, although the size of each TFT is the same in FIG. 5, the size of each TFT connected to the output signal terminal $S_{out}$ or the gate output terminal $G_{out}$ may be changed as appropriate in accordance with the level of the load of the next stage.

Figure 6:
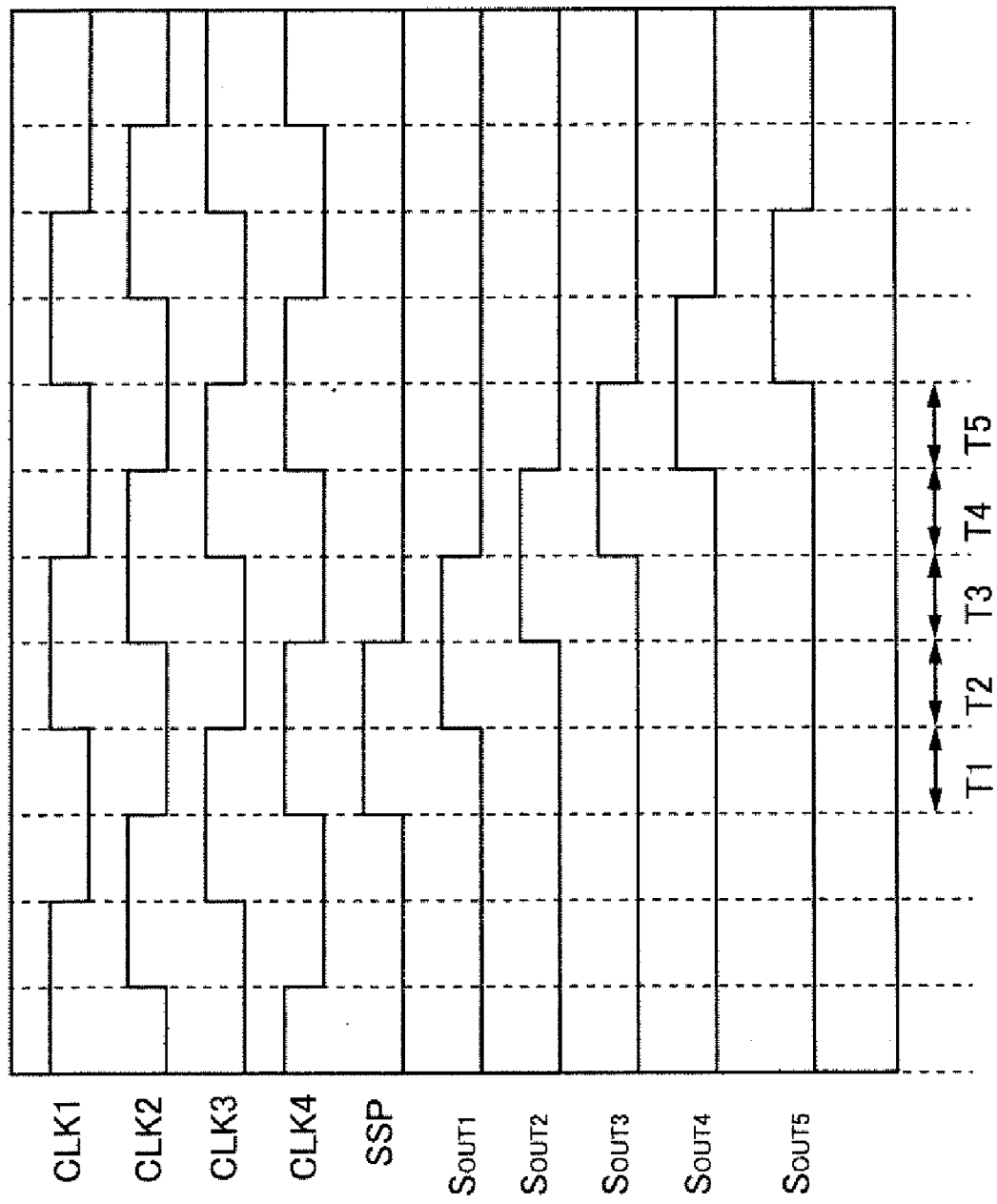
FIG. 6 is a timing chart illustrating operation of the shift register circuit.

Next, operation of the shift register circuit illustrated in FIG. 3 is described with reference to a timing chart illustrated in FIG. 6. FIG. 6 illustrates the start pulse SSP, the first clock signal CLK1 to the fourth clock signal CLK4 which are supplied to the control signal lines 202 to 206 respectively illustrated in FIG. 3, and $S_{out}1$ to $S_{out}5$ which are outputted from the output signal terminals $S_{out}$ of the flip-flop circuits of the first stage to the fifth stage respectively. Note that the same reference numerals of the elements used in FIG. 4 and FIG. 5 will be used in FIG. 6.

FIG. 6 is a timing chart in the case where each TFT included in the flip-flop circuit is an n-type TFT. Further, the first clock signal CLK1 and the fourth clock signal CLK4 are, as illustrated, shifted by a quarter wavelength (a period sectioned by a dotted line).

First, in a period T1, a start pulse SSP of an H level is inputted to the flip-flop circuit of the first stage, and the logic circuit portion 211 turns on the TFT 219 and the TFT 221 in the switch portion and turns off the TFT 220 and the TFT 222 in the switch portion. At this time, the first clock signal CLK1 has an L level, and $S_{out}1$ has an L level.

Note that, in the period T1, the flip-flop circuits of the second stage and the subsequent stages do not operate, and output an L level signal because signals are not inputted to the IN terminals of these flip-flop circuits. In this description, it is assumed that each flip-flop circuit of the shift register circuit in an initial state outputs an L level signal.

Next, in a period T2, the logic circuit portion 211 of the flip-flop circuit of the first stage controls the switch portion 212 in a manner similar to that in the period T1. In the period T2, the first clock signal CLK1 has an H level, and $S_{out}1$ has an H level. Further, in the period T2, $S_{out}1$ of an H level is inputted to the IN terminal of the flip-flop circuit of the second stage, and the logic circuit portion 211 turns on the TFT 219 and the TFT 221 and turns off the TFT 220 and the TFT 222 in the switch portion. At this time, the second clock signal CLK2 has an L level, and $S_{out}2$ has an L level.

Note that, in the period T2, the flip-flop circuits of the third stage and the subsequent stages do not operate, and output an L level signal because signals are not inputted to the IN terminals of these flip-flop circuits.

Next, in the period T3, the logic circuit portion 211 of the flip-flop circuit of the first stage controls the switch portion 212 in order to keep the state of the period T2; therefore, in the period T3, the first clock signal CLK1 has an H level, and $S_{out}1$ has an H level. Further, in the period T3, the logic circuit portion 211 of the flip-flop circuit of the second stage controls the switch portion 212 in a manner similar to that in the period T2. In the period T3, the second clock signal CLK2 is an H level, and $S_{out}2$ is an H level. Further, in the period T3, $S_{out}2$ of an H level is inputted to the IN terminal of the flip-flop circuit of the third stage, and the logic circuit portion 211 turns on the TFT 219 and the TFT 221 and turns off the TFT 220 and the TFT 222. At this time, the third clock signal CLK3 has an L level, and $S_{out}3$ has an L level.

Note that, in the period T3, the flip-flop circuits of the fourth stage and the subsequent stages do not operate, and output an L level signal because signals are not inputted to the IN terminals of these flip-flop circuits.

Next, in the period T4, the first clock signal CLK1 has an L level, and $S_{out}1$ has an L level. In the period T4, the logic circuit portion 211 of the flip-flop circuit of the second stage controls the switch portion 212 in order to keep the state of the period T3; therefore, in the period T4, the second clock signal CLK2 has an H level, and $S_{out}2$ has an H level. Further, in the period T4, the logic circuit portion 211 of the flip-flop circuit of the third stage controls the switch portion 212 in a manner similar to that in the period T3. In the period T4, the third clock signal CLK3 has an H level, and $S_{out}3$ has an H level. Further, in the period T4, $S_{out}3$ of an H level is inputted to the IN terminal of the flip-flop circuit of the fourth stage, the logic circuit portion 211 turns on the TFT 219 and the TFT 221 in the switch portion 212 and turns off the TFT 220 and the TFT 222 in the switch portion 212. At this time, the fourth clock signal CLK4 has an L level, and $S_{out}4$ has an L level.

Note that, in the period T4, the flip-flop circuits of the fifth stage and the subsequent stages do not operate, and output an L level signal because signals are not inputted to the IN terminals of these flip-flop circuits.

Next, in the period 15, the logic circuit portion 211 of the flip-flop circuit of the first stage controls the switch portion 212 in order to keep the state of the period T4; therefore, in the period T5, the first clock signal CLK1 has an L level, and $S_{out}1$ has an L level. Further, in the period T5, the logic circuit portion 211 of the flip-flop circuit of the second stage controls the switch portion 212 in a manner similar to that in the period T4. In the period T5, the second clock signal CLK2 has an L level, and $S_{out}2$ has an L level. Further, in the period T5, the logic circuit portion 211 of the flip-flop circuit of the third stage controls the switch portion 212 in order to keep the state of the period T4; therefore, in the period T5, the third clock signal CLK3 has an H level, and $S_{out}3$ has an H level. Further, in the period T5, the logic circuit portion 211 of the flip-flop circuit of the fourth stage controls the switch portion 212 in a manner similar to that in the period T4. In the period T5, the fourth clock signal CLK4 has an H level, and $S_{out}4$ has an H level. The relation of wirings of the flip-flop circuit of the fifth stage and the subsequent stages is the same as those of the flip-flop circuit of the first stage to the fourth stage, and the timing at which a signal is inputted to the flip-flop circuit of the fifth stage and the subsequent stages is also the same as that of the first stage to the fourth stage, so the description is omitted.

As shown in the shift register circuit illustrated in FIG. 3, $S_{out}4$ also serves as the reset signal of the flip-flop circuit of the first stage. In the period T5, $S_{out}4$ has an H level and this signal is inputted to a reset terminal RES of the flip-flop circuit of the first stage. The input of the reset signal turns off the TFT 219 and the TFT 221 in the switch portion 212 and turns on the TFT 220 and the TFT 222 in the switch portion 212. Then, $S_{out}1$ of the flip-flop circuit of the first stage outputs an L level signal until a next start pulse SSP is inputted.

By the aforementioned operation, in the flip-flop circuits of the second stage and the subsequent stages, a reset in the logic circuit portion is conducted in accordance with a reset signal outputted from the flip-flop circuit of the next stage, and the shift register circuit outputs signals which are shifted by a quarter wavelength of the clock circuit such as $S_{out}1$ to $S_{out}5$.

Further, as a flip-flop circuit, an EDMOS circuit in which an enhancement type TFT and a depletion type TFT are combined is provided in the logic circuit portion 211, and a dual-gate TFT is provided in the switch portion 212, so that the amount of current flowing through the TFTs included in the logic circuit portion 211 can be increased, and the area occupied by TFTs, moreover, the area occupied by the circuit including the TFTs can be reduced without deteriorating performance of the TFTs. Furthermore, as to the TFTs included in the switch portion 212, the amount of current flowing through the TFTs can be increased and switching of on and off can be conducted at high speed, so that the area occupied by the TFTs, moreover, the area occupied by the circuit including the TFTs can be reduced without deteriorating performance of the TFTs. Accordingly, the frame of the display device can be narrowed and the display device can be downsized and have higher performance.

Further, a latch circuit, a level shifter circuit, or the like can be provided in the signal line driver circuit described in Embodiment 1. A buffer portion is provided in the last stage sending a signal from the signal line driver circuit to the pixel portion, and a signal of which the amount of current is amplified is sent from the signal line driver circuit to the pixel portion. By providing a TFT through which a large amount of on current flows, typically a dual-gate TFT or a depletion type TFT in the buffer portion, the area of the TFT can be reduced and the area occupied by the signal line driver circuit can be reduced. Accordingly, the frame of the display device can be narrowed and the display device can be downsized and have higher performance. Note that a shift register circuit, which is part of the signal line driver circuit, is preferably mounted on the display device using an IC, or the like because the shift register circuit is required to operate at high speed.

Embodiment 3

In this Embodiment, as to the display device described in Embodiments 1 and 2, structures of the logic circuit portion, the switch portion, and the thin film transistor in the pixel portion will be described. As for a thin film transistor used for a display device, an n-type transistor has higher carrier mobility than a p-type transistor. It is preferable that all thin film transistors formed over the same substrate have the same polarity because the number of manufacturing steps can be reduced. In this Embodiment, an n-type thin film transistor will be described.

Figure 7:
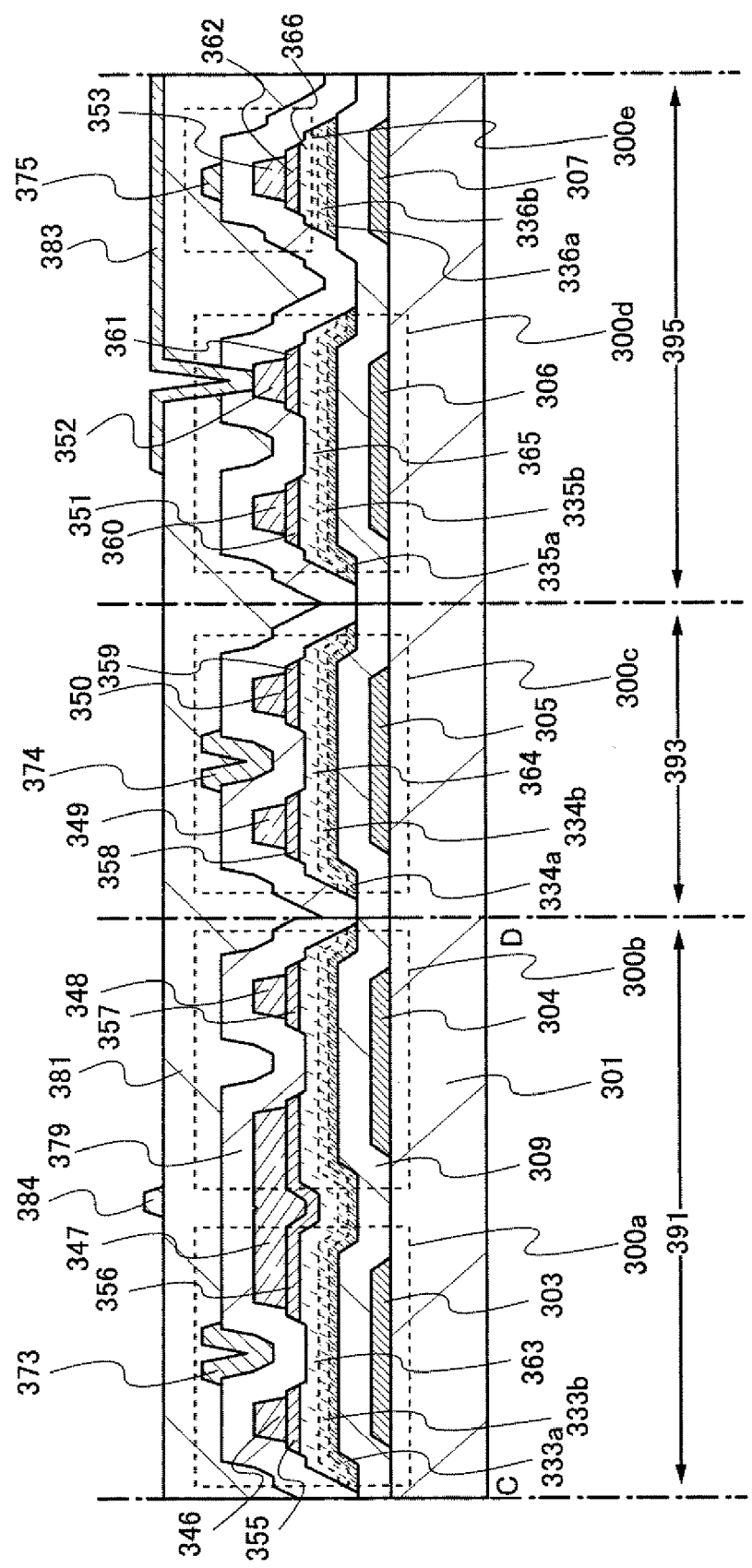
FIG. 7 is a cross-sectional view of a display device according to an embodiment of the present invention.
Figure 8A:
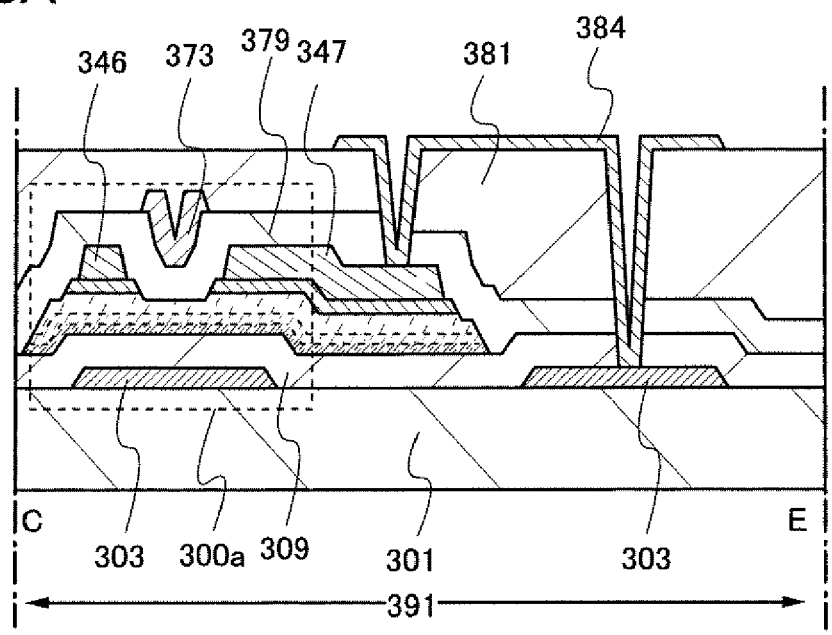
FIGS. 8A and 8B are a cross-sectional view and a top view, respectively, which illustrate a display device according to an embodiment of the present invention.

FIG. 7 and FIG. 8A each illustrate a cross-sectional view of one mode (structure 1) of a logic circuit portion 391, a switch portion 393, and a pixel portion 395 in the display device according to this Embodiment.

An EDMOS circuit is used for the logic circuit portion 391 in the display device illustrated in FIG. 7. One of a depletion type TFT and an enhancement type TFT in the EDMOS circuit is a dual-gate TFT 300a including a gate electrode 303 and a back gate electrode 373. The other of a depletion type TFT and an enhancement type TFT in the EDMOS circuit is a TFT 300b. Note that C-D in the cross-sectional view of the logic circuit portion 391 illustrated in FIG. 7 and C-E in the cross-sectional view of the logic circuit portion 391 illustrated in FIG. 8A correspond to C-D and C-E in a top view of FIG. 8B respectively.

In the switch portion 393 in the display device illustrated in FIG. 7, a dual-gate TFT 300c including a gate electrode 305 and a back gate electrode 374 is formed.

A switching element in the pixel portion 395 in the display device illustrated in FIG. 7 is a TFT 300d. Further, a capacitor 300e is formed by including a second gate insulating layer 379, a capacitor wiring 353, and a wiring 375.

The TFT 300a includes, over a substrate 301, the gate electrode 303, a first semiconductor layer 333a, a second semiconductor layer 333b, a third semiconductor layer 363, a first gate insulating layer 309 provided between the gate electrode 303 and the first semiconductor layer 333a, impurity semiconductor layers 355 and 356 which are in contact with the third semiconductor layer 363 and function as a source region and a drain region, and wirings 346 and 347 which are in contact with the impurity semiconductor layers. The second gate insulating layer 379 is farmed, which covers the first semiconductor layer 333a, the second semiconductor layer 333b, the third semiconductor layer 363, the first gate insulating layer 309, the impurity semiconductor layers 355 and 356, and the wirings 346 and 347 which are in contact with the impurity semiconductor layers. The back gate electrode 373 is provided to face the gate electrode 303 with the second gate insulating layer 379 interposed therebetween.

The TFT 300b includes, over the substrate 301, the gate electrode 304, the first semiconductor layer 333a, the second semiconductor layer 333b, the third semiconductor layer 363, the first gate insulating layer 309 provided between the gate electrode 304 and the first semiconductor layer 333a, impurity semiconductor layers 356 and 357 which are in contact with the third semiconductor layer 363 and function as a source region and a drain region, and wirings 347 and 348 which are in contact with the impurity semiconductor layers.

As illustrated in FIG. 8A, the gate electrode 303 of the TFT 300a and the wiring 347 of the TFT 300a and the TFT 300b are connected with a wiring 384, which is formed over an insulating layer 381 at the same time as a pixel electrode 383 is formed.

The TFT 300c includes, over the substrate 301, the gate electrode 305, the first semiconductor layer 334a, the second semiconductor layer 334b, the third semiconductor layer 364, the first gate insulating layer 309 provided between the gate electrode 305 and the first semiconductor layer 334a, impurity semiconductor layers 358 and 359 which are in contact with the third semiconductor layer 364 and function as a source region and a drain region, and wirings 349 and 350 which are in contact with the impurity semiconductor layers. The second gate insulating layer 379 is formed, which covers the first semiconductor layer 334a, the second semiconductor layer 334b, the third semiconductor layer 364, the first gate insulating layer 309, the impurity semiconductor layers 358 and 359, the wirings 349 and 350. The back gate electrode 374 is provided to face the gate electrode 305 with the second gate insulating layer 379 interposed therebetween.

The TFT 300d includes, over the substrate 301, the gate electrode 306, the first semiconductor layer 335a, the second semiconductor layer 335b, the third semiconductor layer 365, the first gate insulating layer 309 provided between the gate electrode 306 and the first semiconductor layer 335a, impurity semiconductor layers 360 and 361 which are in contact with the third semiconductor layer 365 function as a source region and a drain region, and wirings 351 and 352 which are in contact with the impurity semiconductor layers.

Further, the capacitor 300e is formed by including the second gate insulating layer 379, the capacitor wiring 353, and the wiring 375.

As for the substrate 301, a plastic substrate with heat resistance that can resist a process temperature in this manufacturing step or the like can be used in addition to a glass substrate and a ceramic substrate. In the case where the substrate does not need a light-transmitting property, a metal substrate such as a stainless steel alloy, on the surface on which an insulating layer is provided, may be used. As for a glass substrate, for example, a non-alkali glass substrate formed using barium borosilicate glass, aluminoborosilicate glass, aluminosilicate glass, or the like may be used. Further, as for the substrate 301, a glass substrate with any of the following sizes can be used: the 3rd generation (550 mm×650 mm), the 3.5th generation (600 mm×720 mm or 620 mm×750 mm), the 4th generation (680×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), or the 10th generation (2950 mm×3400 mm).

The gate electrodes 303 to 306 and the capacitor wiring 307 can be formed with a single layer or a stacked layer using a metal material such as molybdenum, titanium, chromium, tantalum, tungsten, aluminum, copper, neodymium, or scandium, or an alloy material including any of these materials as a main component. Alternatively, a semiconductor layer typified by polycrystalline silicon doped with an impurity element such as phosphorus, or an AgPdCu alloy may be used.

For example, as for a two-layer structure of the gate electrodes 303 to 306 and the capacitor wiring 307, a two-layer structure in which a molybdenum layer is stacked over an aluminum layer, a two-layer structure in which a molybdenum layer is stacked over a copper layer, a two-layer structure in which a titanium nitride layer or a tantalum nitride is stacked over a copper layer, or a two-layer structure in which a titanium nitride layer and a molybdenum layer are stacked is preferable. As for a three-layer structure of the gate electrodes 303 to 306 and the capacitor wiring 307, a stacked-layer structure in which a tungsten layer or a tungsten nitride layer, a layer of an alloy of aluminum and silicon or a layer of an alloy of aluminum and titanium, and a titanium nitride layer or a titanium layer are stacked is preferable. When a metal layer that functions as a barrier layer is stacked over a layer with low electric resistance, electric resistance can be low and diffusion of metal elements from the metal layer into a semiconductor layer can be prevented.

The first gate insulating layer 309 can be formed with a single layer or a stacked layer using a silicon oxide layer, a silicon nitride layer, a silicon oxynitride layer, or a silicon nitride oxide layer by a CVD method, a sputtering method, or the like. By use of silicon oxide or silicon oxynitride to form the first gate insulating layer 309, in the case where the first semiconductor layers 333a to 335a are microcrystalline semiconductor layers, fluctuation in the threshold voltage of the thin film transistors can be reduced.

Note that, in this specification, silicon oxynitride means silicon that includes more oxygen than nitrogen. Preferably, in the case where measurements are performed using Rutherford backscattering spectrometry (RBS) and hydrogen forward scattering (HFS), silicon oxynitride includes oxygen, nitrogen, silicon, and hydrogen at percentages ranging from 50 at. % to 70 at. %, 0.5 at. % to 15 at. %, 25 at. % to 35 at. %, and 0.1 at. % to 10 at. %, respectively. Further, silicon nitride oxide means silicon that includes more nitrogen than oxygen. Preferably, in the case where measurements are performed using RBS and HFS, silicon nitride oxide includes oxygen, nitrogen, silicon, and hydrogen at percentages ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The first semiconductor layers 333a to 336a are formed using a microcrystalline semiconductor layer. A microcrystalline semiconductor means a semiconductor having an intermediate structure between amorphous and crystalline structures (including a single crystal and a polycrystal). A microcrystalline semiconductor is a semiconductor having a third state that is stable in terms of free energy and a crystalline semiconductor having short-range order and lattice distortion, in which column-like crystals or needle-like crystals having a grain size of 2 nm to 200 nm inclusive, preferably 10 nm to 80 nm inclusive, more preferably 20 nm to 50 nm inclusive, have grown in a direction normal to the substrate surface. Accordingly, there is a case where crystal grain boundaries are formed at the interface of column-like crystals or needle-like crystals.

The Raman spectrum of a microcrystalline silicon, which is a typical example of a microcrystalline semiconductor, is shifted to a lower wavenumber side than 520 cm$^{-1}$ that represents single crystal silicon. That is, the peak of the Raman spectrum of a microcrystalline silicon exists between 520 cm$^{-1}$ and 480 cm$^{-1}$ which represent that of single crystal silicon and that of amorphous silicon, respectively. A microcrystalline semiconductor contains hydrogen or halogen of at least 1 at. % to terminate dangling bonds. Moreover, a rare gas element such as helium, argon, krypton, or neon may be contained to further promote lattice distortion, so that stability is enhanced and a favorable microcrystalline semiconductor can be obtained. Such a microcrystalline semiconductor is disclosed in, for example, U.S. Pat. No. 4,409,134.

It is preferable that the concentration of oxygen and nitrogen contained in the first semiconductor layers 333a to 336a measured by secondary ion mass spectrometry is less than 1×10$^{18}$ atoms/cm$^3$ because the crystallinity of the first semiconductor layers 333a to 336a can be improved.

The third semiconductor layers 363 to 366 are formed using an amorphous semiconductor layer, an amorphous semiconductor layer including halogen, or an amorphous semiconductor layer including nitrogen. Nitrogen of the amorphous semiconductor layer including nitrogen may exist, for example, as an NH group or an NH$_2$ group. The amorphous semiconductor layer is formed using amorphous silicon.

In the case where the third semiconductor layers 363 to 365 are formed with an amorphous semiconductor layer including nitrogen, a band tail slope in a band gap is steeper, the band gap becomes wide, and a tunnel current does not easily flow as compared to a conventional amorphous semiconductor layer. Accordingly, off current of the thin film transistor can be reduced.

Figure 9A:
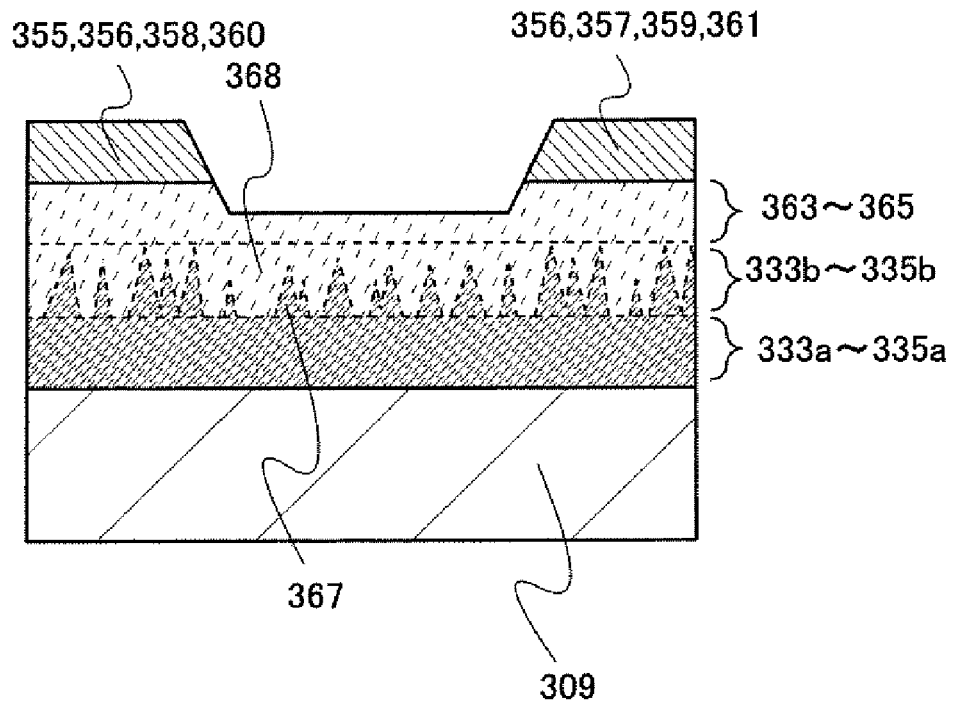
FIGS. 9A and 9B are cross-sectional views each illustrating a thin film transistor of a display device according to an embodiment of the present invention.
Figure 9B:
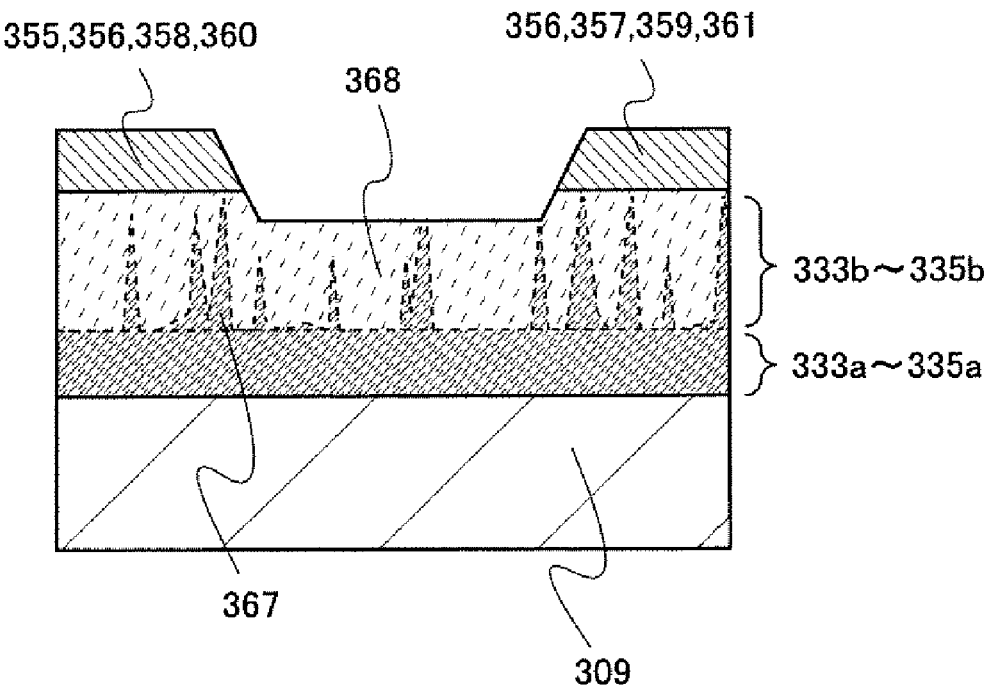

In FIGS. 9A and 9B, enlarged views of a portion between the first gate insulating layer 309 and the impurity semiconductor layers 355 to 361 which function as a source region and a drain region of FIG. 7 are illustrated.

As FIG. 9A illustrates, the second semiconductor layers 333b to 335b are provided between the first semiconductor layers 333a to 335a and the third semiconductor layers 363 to 365. The second semiconductor layers 333b to 335b include microcrystalline semiconductor regions 367 and amorphous semiconductor regions 368 filling the space except the microcrystalline semiconductor regions 367. Specifically, the second semiconductor layers 333b to 335b are fanned including the microcrystalline semiconductor regions 367, which grow with a convex shape from the first semiconductor layers 333a to 335a, and the amorphous semiconductor regions 368 which are formed of the same material as that of the third semiconductor layers 363 to 365. Further, the second semiconductor layers 333b to 335b may include using an amorphous semiconductor region including halogen or an amorphous semiconductor region including nitrogen instead of the amorphous semiconductor region 368.

The off current of the thin film transistor can be reduced by forming the third semiconductor layers 363 to 365 using an amorphous semiconductor layer, an amorphous semiconductor layer including halogen, an amorphous semiconductor layer including nitrogen, or an amorphous semiconductor layer including an NH group each having a low conductivity and a high resistivity. As to the second semiconductor layers 333b to 335b, because the second semiconductor layers 333b to 335b include the conical or pyramidal microcrystalline semiconductor regions 367, resistance of the vertical direction (the film thickness direction) in the case where the thin film transistor is in on-state and voltage is applied to the wiring thereof, that is, resistance between the semiconductor layer and the source region or the drain region, can be lowered, and on current of the thin film transistor can be increased.

As illustrated in FIG. 9B, a structure that the second semiconductor layers 333b to 335b are provided between the first semiconductor layers 333a to 335a and the impurity semiconductor layers 355 to 361 may be employed. That is, the third semiconductor layers are not formed between the second semiconductor layers 333b to 335b and the impurity semiconductor layers 355 to 361. The second semiconductor layers 333b to 335b include the microcrystalline semiconductor regions 367, and the amorphous semiconductor regions 368 filling the space except the microcrystalline semiconductor regions 367. Specifically, the second semiconductor layers 333b to 335b are formed using the microcrystalline semiconductor regions 367 that grow with a convex shape from the first semiconductor layers 333a to 335a and the amorphous semiconductor region 368. In the structure illustrated in FIG. 9B, it is preferable that the proportion of the microcrystalline semiconductor regions 367 as compared to the amorphous semiconductor regions 368 is low. Further, it is preferable that the proportion of the microcrystalline semiconductor regions 367 is low in a region between each pair of the impurity semiconductor layers 355, 356, 358, and 360 and the impurity semiconductor layers 356, 357, 359, and 361, that is, in a region in which carriers flow. Accordingly, off current of the thin film transistor can be reduced. As to the second semiconductor layers 333b to 335b, resistance of the vertical direction (the film thickness direction) in the case where the thin film transistor is in on-state and voltage is applied to the wiring thereof, that is, resistance between the semiconductor layer and the source region or the drain region, can be lowered, and on current of the thin film transistor can be increased.

The microcrystalline semiconductor region 367 is a crystal grain having a convex shape whose top gets narrower from the first gate insulating layer 309 toward the third semiconductor layers 363 to 365. Alternatively, the microcrystalline semiconductor region 367 may be a crystal grain having a convex shape whose top gets wider from the first gate insulating layer 309 toward the third semiconductor layers 363 to 365.

In the second semiconductor layers 333b to 335b, in the case where the microcrystalline semiconductor region 367 is a crystal grain having a convex shape whose top gets narrower from the first gate insulating layer 309 toward the third semiconductor layers 363 to 365, the proportion of the microcrystalline semiconductor regions 367 on the first semiconductor layers 333a to 335a side is higher than that of the third semiconductor layers 363 to 365 side. This is because the microcrystalline semiconductor region 367 grows from the surface of the first semiconductor layers 333a to 335a in the film thickness direction, and in the case where the flow rate of hydrogen to silane in the source gas is low or the concentration of the source gas including nitrogen is high, the growth of the crystal grains of the microcrystalline semiconductor regions 367 is suppressed, the shape thereof becomes conical or pyramidal, and gradually only amorphous semiconductor regions are deposited.

The second semiconductor layers 333b to 335b preferably include nitrogen. This is because defects are reduced in the case where nitrogen, typically an NH group or an $NH_2$ group, is combined with dangling bonds of silicon atoms in the interface between the crystal grains included in the microcrystalline semiconductor region 367, and in the interface between the microcrystalline semiconductor region 367 and the amorphous semiconductor region 368. Accordingly, the nitrogen concentration of the second semiconductor layers 333b to 335b is set at greater than or equal to $1 \times 10^{19}$ atoms/$cm^3$ and less than or equal to $1 \times 10^{21}$ atoms/$cm^3$, preferably, greater than or equal to $1 \times 10^{20}$ atoms/$cm^3$ and less than or equal to $1 \times 10^{21}$ atoms/$cm^3$, and therefore, the dangling bonds of silicon atoms can be easily combined with nitrogen, preferably an NH group, so that a carrier can also flow easily. Alternatively, the dangling bonds of the semiconductor atoms in the aforementioned interface are terminated with the $NH_2$ group, so that the defect level is disappeared. As a result, resistances of the vertical direction (the film thickness direction) are reduced in the case where the thin film transistor is in on-state and voltage is applied between the source electrode and drain electrode. That is, the field effect mobility and on current of the thin film transistor are increased.

By reducing the concentration of oxygen of the second semiconductor layers 333b to 335b, bonding inhibiting carrier transfer in the interface between the microcrystalline semiconductor region 367 and the amorphous semiconductor region 368 or the interface between the crystal grains, can be reduced.

Note that, hereupon, the first semiconductor layers 333a to 335a refer to the regions of which thicknesses are approximately the same. The interface between the first semiconductor layers 333a to 335a and the second semiconductor layers 333b to 335b refers to a region obtained by extending the nearest region to the first gate insulating layer 309 in flat portion of the interface between the microcrystalline semiconductor region 367 and the amorphous semiconductor region 368.

The off current of the TFTs can be suppressed by setting the total thickness of the first semiconductor layers 333a to 335a and the second semiconductor layers 333b to 335b, that is, the length from the interface with the first gate insulating layer 309 to the top of the projection of the second semiconductor layers 333b to 335b, to be greater than or equal to 3 nm and less than or equal to 80 nm, preferably, greater than or equal to 5 nm and less than or equal to 30 nm.

The impurity semiconductor layers 355 to 362 are formed with amorphous silicon to which phosphorus is added, microcrystalline silicon to which phosphorus is added, or the like. Note that, in the case of forming a p-type thin film transistor is formed as a thin film transistor, the impurity semiconductor layers 355 to 362 are formed with microcrystalline silicon to which boron is added, amorphous silicon to which boron is added, or the like. Note that, in the case where the second semiconductor layers 333b to 336b or the third semiconductor layers 363 to 366 have an ohmic contact with wirings 346 to 352 and the capacitor wiring 353, the impurity semiconductor layers 355 to 362 are not necessarily formed.

Further, in the case where the impurity semiconductor layers 355 to 362 are formed with microcrystalline silicon to which phosphorus is added or microcrystalline silicon to which boron is added, a microcrystalline semiconductor layer, typically a microcrystalline semiconductor layer, is formed between the second semiconductor layers 333b to 336b or the third semiconductor layers 363 to 366 and the impurity semiconductor layers 355 to 362, so that characteristics of the interface can be improved. As this result, resistance generated in the interface between the impurity semiconductor layers 355 to 362 and the second semiconductor layers 333b to 336b or the third semiconductor layers 363 to 366 can be reduced. Accordingly, the amount of current flowing in a source region, a semiconductor layer, and a drain region of the thin film transistor is increased, and on current and a field effect mobility of the thin film transistor can be increased.

The wirings 346 to 352 and the capacitor wiring 353 can be formed with a single layer structure or a stacked-layer structure of aluminum, copper, titanium, neodymium, scandium, molybdenum, chromium, tantalum, tungsten, or the like. Alternatively, an aluminum alloy to which an element to prevent a hillock is added (e.g., an Al—Nd alloy which can be used for the gate electrodes 303 to 306 and the capacitor wiring 307) may be used. Further alternatively, crystalline silicon to which an impurity element serving as a donor is added may be used. Further, the wirings 346 to 352 and the capacitor wiring 353 may have a stacked-layer structure obtained as follows; a layer, which is in contact with the crystalline silicon to which an impurity element serving as a donor is added, is formed using titanium, tantalum, molybdenum, tungsten, or nitride of any of these elements, and then aluminum or an aluminum alloy is formed thereover. Furthermore, a stacked layer structure may be employed in which upper and lower surfaces of aluminum or an aluminum alloy may each be covered with titanium, tantalum, molybdenum, tungsten, or nitride thereof.

The second gate insulating layer 379 can be formed in a manner similar to the first gate insulating layer 309.

The back gate electrodes 373 and 374 and the wiring 375 can be formed in a manner similar to the wirings 346 to 352 and the capacitor wiring 353.

The insulating layer 381 can be formed using an inorganic insulating layer or an organic resin layer. Examples of the inorganic insulating layer include silicon oxide, silicon oxynitride, silicon nitride oxide, carbon typified by DLC (diamond-like carbon). Examples of the organic resin layer include acrylic, epoxy, polyimide, polyamide, polyvinylphenol, benzocyclobutene. Alternatively, siloxane polymer can be used.

The pixel electrode 383 and the wiring 384 can be formed using indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like.

Alternatively, the pixel electrode 383 and the wiring 384 can be formed using a conductive composition containing a conductive high molecule (also referred to as a conductive polymer) having a light-transmitting property. As to the wiring 384 and the pixel electrode 383, it is preferable that the shirt resistance be less than or equal to 10000 Ω/square and the light transmittance is greater than or equal to 70% at a wavelength of 550 nm. Further, the resistivity of the conductive high molecule contained in the conductive composition is preferably less than or equal to 0.1 Ω·cm.

As the conductive high molecule, a so-called π electron conjugated conductive high molecule can be used. For example, polyaniline or a derivative thereof, polypyrrole or a derivative thereof, polythiophene or a derivative thereof, copolymer of two or more kinds of those materials are given.

In a dual-gate TFT, the threshold voltage can be controlled by changing the potentials of the gate electrode 303 and the back gate electrode 373. In the logic circuit portion 391, one of a depletion type TFT and an enhancement type TFT is set to be the dual-gate TFT 300a, and the other of the depletion type TFT and the enhancement type TFT is set to be the TFT 300b illustrated in FIG. 7; thus the EDMOS circuit can be formed.

Further, when a dual-gate TFT is employed, there are two channels where carriers flow, that is, around an interface with the first gate insulating layer 309 and around an interface with the second gate insulating layer 379, so that the amount of carrier transfer is increased and on current of the thin film transistor can be increased. Accordingly, the dual-gate TFT 300c which can increase the on current is formed in the switch portion 393, so that the area of the TFT can be reduced and the area of the driver circuit of the display device can be narrowed.

Figure 10:
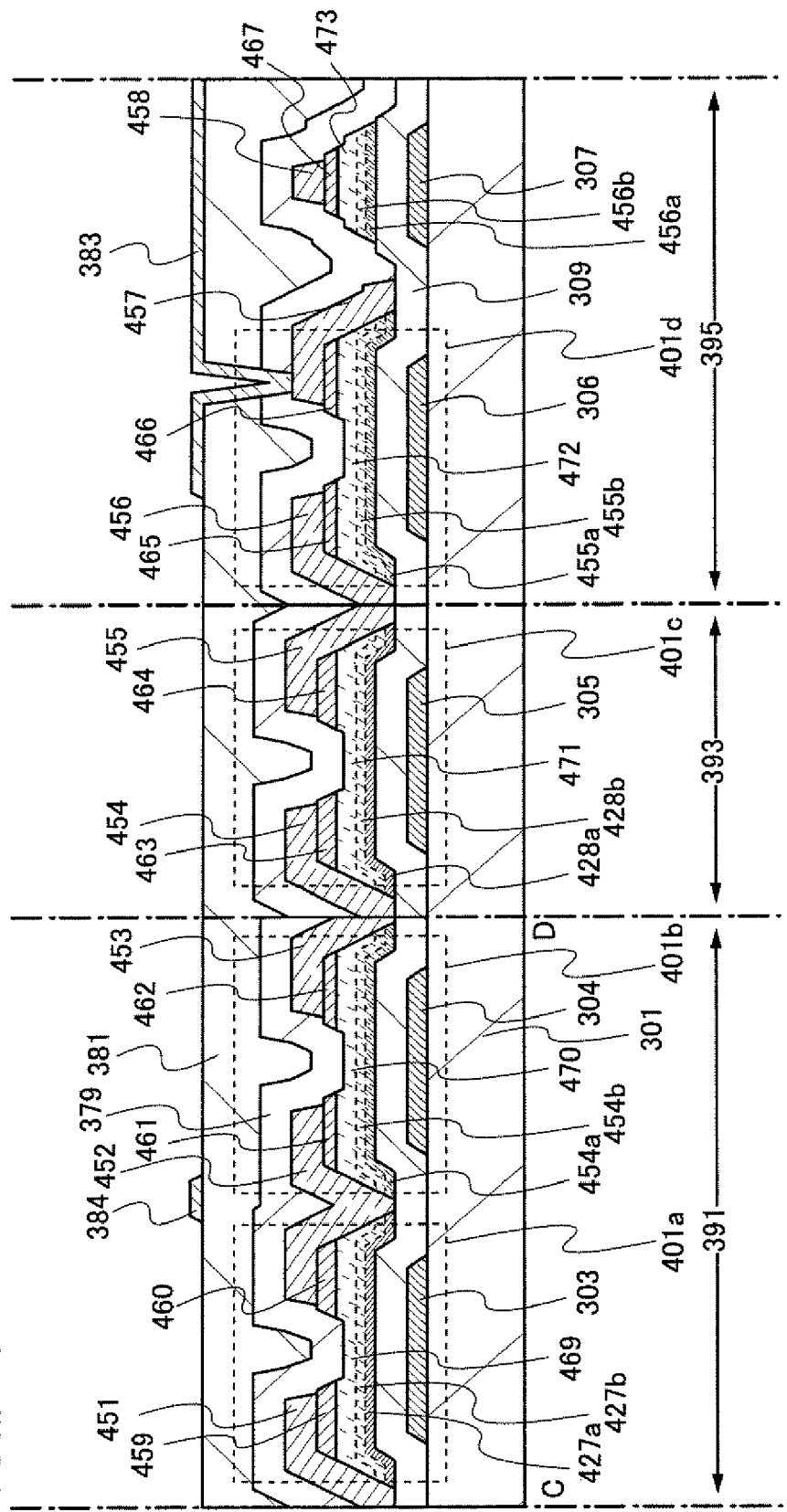
FIG. 10 is a cross-sectional view illustrating a display device according to an embodiment of the present invention.
Figure 11A:
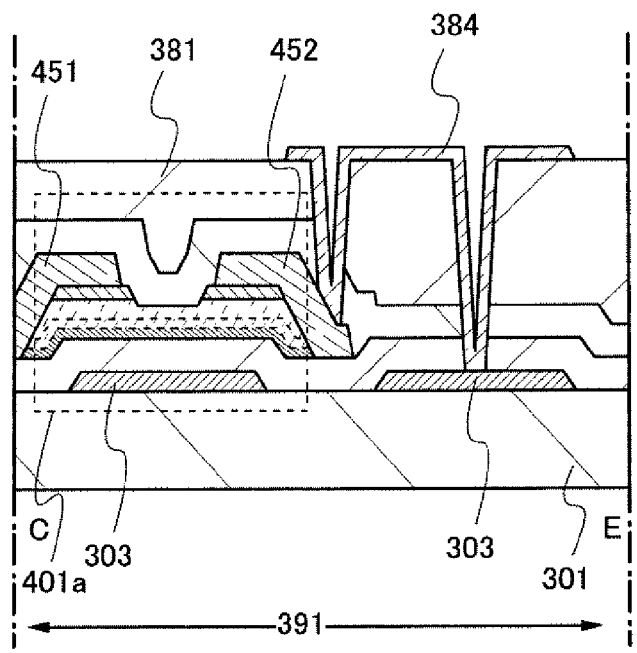
FIGS. 11A and 11B are a cross-sectional view and a top view, respectively, which illustrate a display device according to an embodiment of the present invention.
Figure 11B:
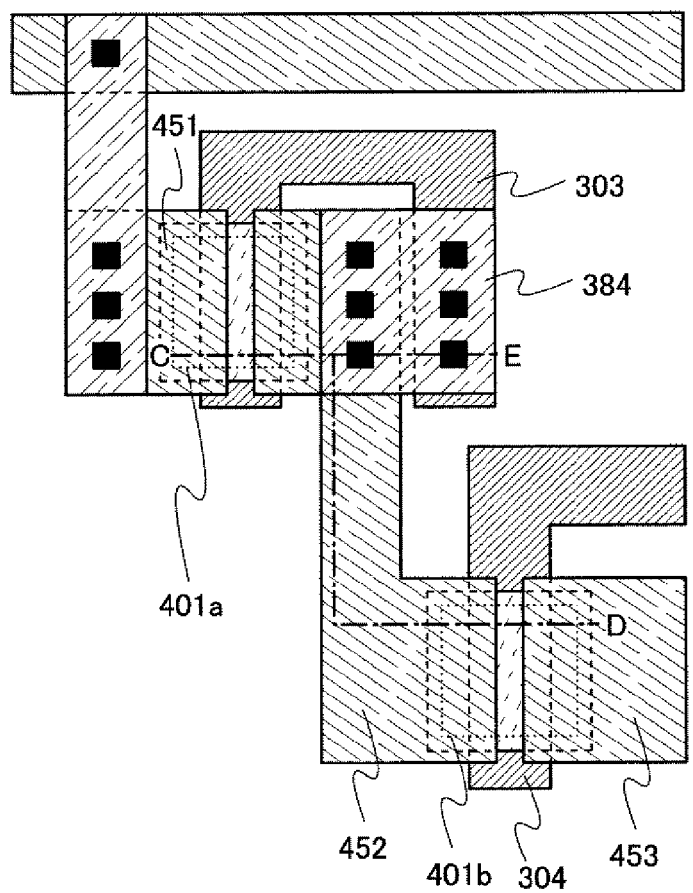

Next, FIG. 10 and FIGS. 11A and 11B each illustrate a cross-sectional view of one mode (structure 2) of the logic circuit portion 391, the switch portion 393, and the pixel portion 395 in the display device according to this Embodiment.

FIG. 10 illustrates an EDMOS circuit of the logic circuit portion 391 in the display device. As a depletion type TFT 401a in the EDMOS circuit, a TFT including a first semiconductor layer in which an impurity element imparting one conductivity type is added to the channel formation region is formed. An enhancement type TFT 401b is also formed. Note that C-D in a cross-sectional view of the logic circuit portion 391 illustrated in FIG. 10 and C-E in a cross-sectional view of the logic circuit portion 391 illustrated in FIG. 11A correspond to C-D and C-E in a top view of FIG. 11B respectively.

In the switch portion 393 in the display device illustrated in FIG. 10, a TFT including the first semiconductor layer in which an impurity element imparting one conductivity type is added to the channel formation region, hereupon, a depletion type TFT 401c including the first semiconductor layer to which an impurity element serving as a donor is added is formed.

The TFT 401a includes, over a substrate 301, a gate electrode 303, a first semiconductor layer 427a to which an impurity element imparting one conductivity type is added, a second semiconductor layer 427b, a third semiconductor layer 469, a first gate insulating layer 309 provided between the gate electrode 303 and the first semiconductor layer 427a to which an impurity element imparting one conductivity type is added, impurity semiconductor layers 459 and 460 which are in contact with the third semiconductor layer 469 and function as a source region and a drain region, and wirings 451 and 452 which are in contact with the impurity semiconductor layers 459 and 460 respectively.

The TFT 401b includes, over the substrate 301, a gate electrode 304, a first semiconductor layer 454a, a second semiconductor layer 454b, a third semiconductor layer 470, the first gate insulating layer 309 provided between the gate electrode 304 and the first semiconductor layer 454a, impurity semiconductor layers 461 and 462 which are in contact with the third semiconductor layer 470 and function as a source region and a drain region, and wirings 452 and 453 which are in contact with the impurity semiconductor layers 461 and 462 respectively.

As FIG. 11A illustrates, the gate electrode 303 of the TFT 401a and the wiring 452 of the TFT 401a and the TFT 401b are connected with the wiring 384, which is formed over the insulating layer 381 at the same time as the pixel electrode 383 is formed.

The TFT 401c includes, over the substrate 301, a gate electrode 305, a first semiconductor layer 428a to which an impurity element imparting one conductivity type is added, a second semiconductor layer 428b, a third semiconductor layer 471, the first gate insulating layer 309 provided between the gate electrode 305 and the first semiconductor layer 428a, impurity semiconductor layers 463 and 464 which are in contact with the third semiconductor layer 471 and function as a source region and a drain region, and wirings 454 and 455 which are in contact with the impurity semiconductor layers 463 and 464.

The TFT 401d includes, over the substrate 301, a gate electrode 306, a first semiconductor layer 455a, a second semiconductor layer 455b, a third semiconductor layer 472, the first gate insulating layer 309 provided between the gate electrode 306 and the first semiconductor layer 455a, impurity semiconductor layers 465 and 466 which are in contact with the third semiconductor layer 472 and function as a source region and a drain region, and wirings 456 and 457 which are in contact with the impurity semiconductor layers 465 and 466.

As to the first semiconductor layers 427a and 428a to which an impurity element imparting one conductivity type is added, hereupon, an impurity element serving as a donor is added. As the impurity element serving as a donor, an element belonging to Group 15 of the periodic table, typically, phosphorus, arsenic, antimony, or the like is used. Hereupon, as the first semiconductor layer 427a to which an impurity element imparting one conductivity type is added, a microcrystalline semiconductor layer to which phosphorus, which is an impurity element serving as a donor, is added is formed.

The first semiconductor layers 454a to 456a can be formed in a manner similar to the first semiconductor layers 333a to 336a shown in the aforementioned (structure 1).

The second semiconductor layers 427b, 428b, and 454b to 456b can be formed in a manner similar to the second semiconductor layers 333b to 336b shown in the aforementioned (structure 1).

The third semiconductor layers 469 to 473 can be formed in a manner similar to the third semiconductor layers 363 to 366 shown in the aforementioned (structure 1).

Note that, although a structure is shown here, in which the third semiconductor layers 469 to 473 are provided between the second semiconductor layers 427b, 428b, and 454b to 456b and the impurity semiconductor layers 459 to 467 as illustrated in FIG. 9A, the third semiconductor layers 469 to 473 are not necessarily formed as illustrated in FIG. 9B.

The impurity semiconductor layers 459 to 467 can be formed in a manner similar to the impurity semiconductor layers 355 to 362 shown in the aforementioned (structure 1).

The wirings 451 to 458 can be formed in a manner similar to the wirings 346 to 353 shown in the aforementioned (structure 1).

Note that although a TFT including the first semiconductor layer in which an impurity element imparting one conductivity type is added to the channel formation region is used as the depletion type TFT 401a of an EDMOS circuit in FIG. 10, a TFT with a structure described as follows may be employed: the channel formation region of the depletion type TFT 401a is formed in a manner similar to the first semiconductor layer 454a of the TFT 401b, and the enhancement type TFT 401b includes the first semiconductor layer in which an impurity element imparting one conductivity type, typically an impurity element serving as an acceptor, is added to the channel formation region. As the impurity element serving as an acceptor, an element belonging to Group 13 of the periodic table, typically, boron, or the like is used.

Hereupon, in the logic circuit portion 391, the depletion type TFT or the enhancement type TFT includes a semiconductor layer in which an impurity element imparting one conductivity type is added to the channel formation region; therefore, an EDMOS circuit can be formed.

Further, a depletion type TFT can increase on current because the threshold voltage of a depletion type TFT is shifted to negative side. A depletion type TFT, which can increase on current, is formed for a TFT in the switch portion 393, so that the area of the TFT can be reduced and the area of the driver circuit in the display device can be narrowed.

Figure 12:
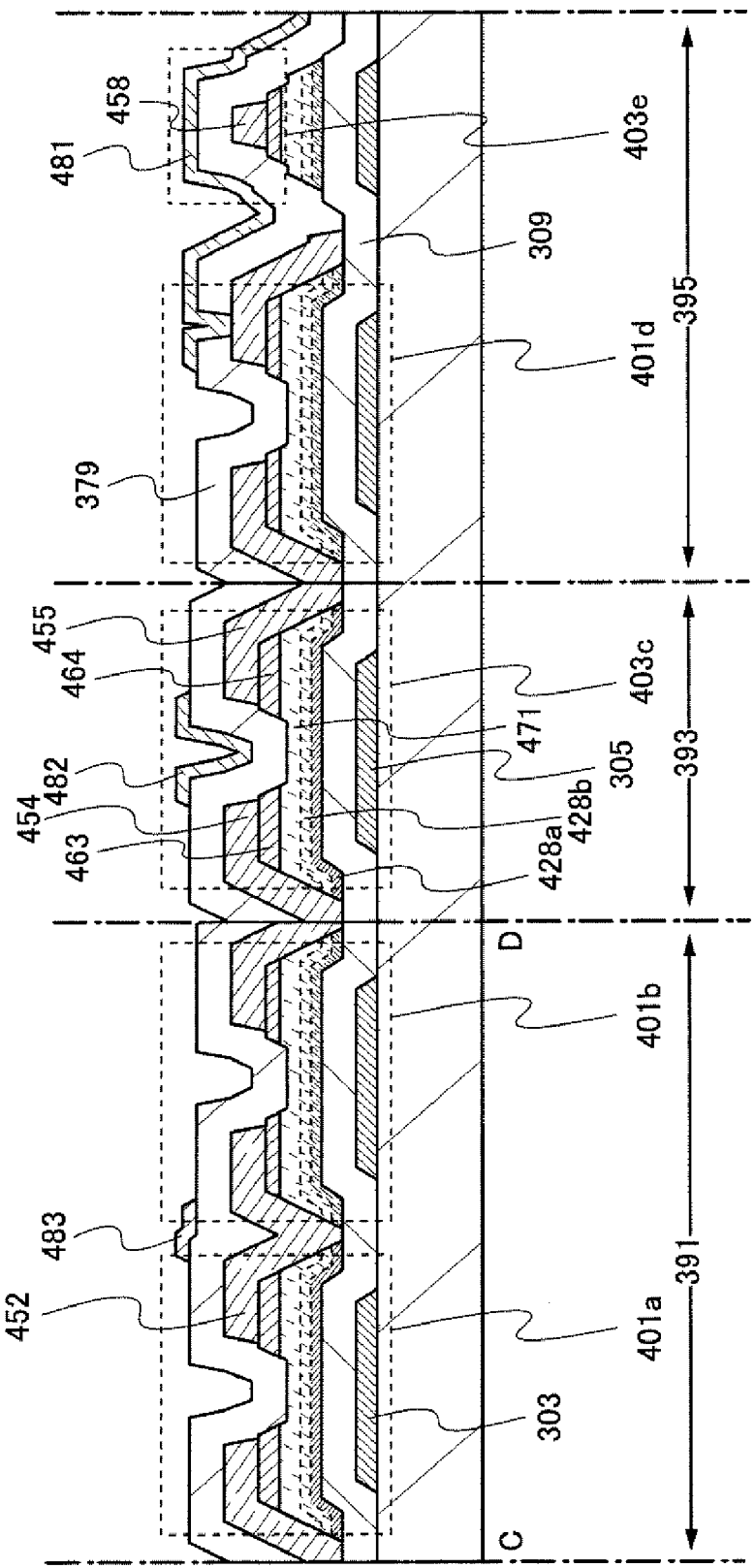
FIG. 12 is a cross-sectional view illustrating a display device according to an embodiment of the present invention.
Figure 13A:
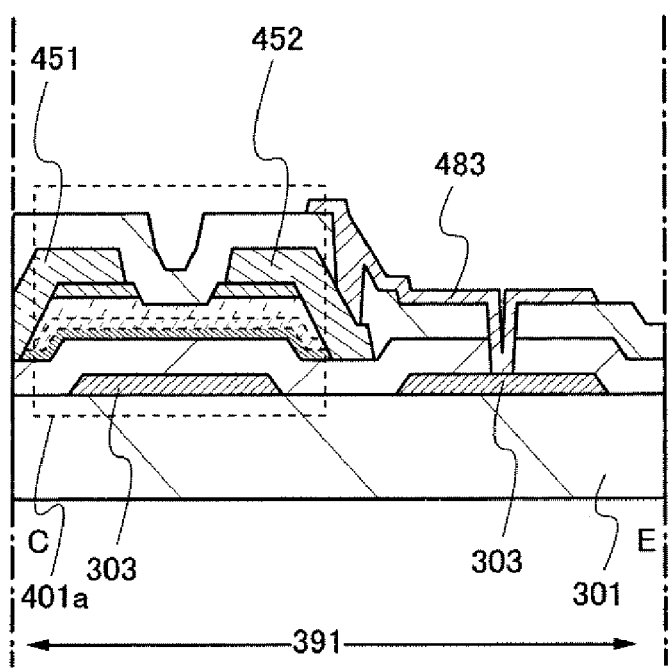
FIGS. 13A and 13B are a cross-sectional view and a top view, respectively, which illustrate a display device according to an embodiment of the present invention.
Figure 13B:
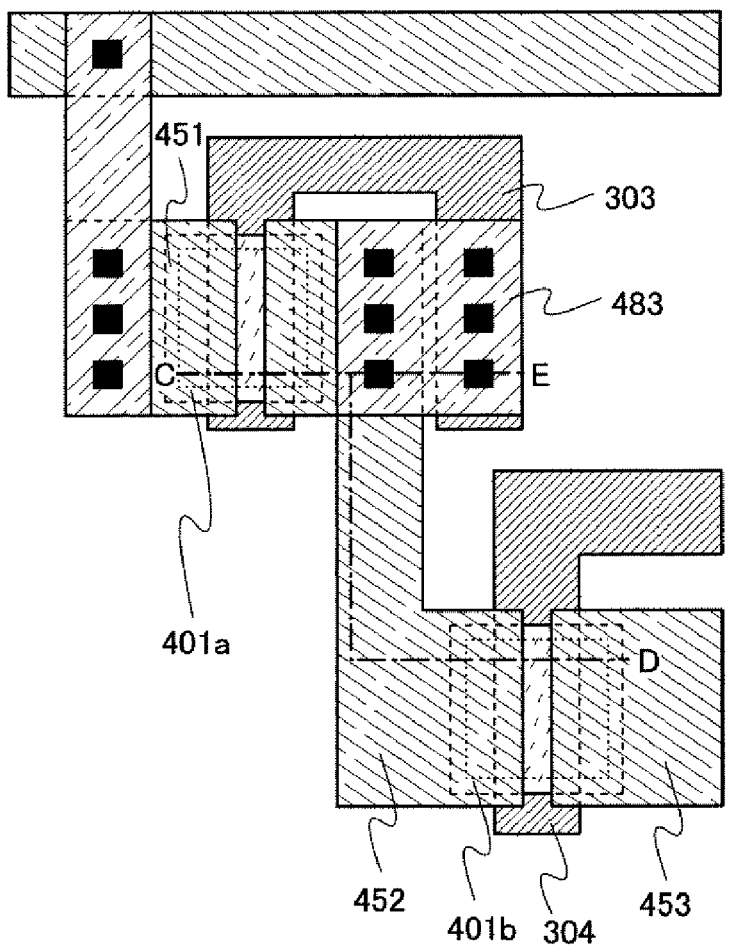

Next, FIG. 12 and FIGS. 13A and 13B each illustrate a cross-sectional view of one mode (structure 3) of the logic circuit portion 391, the switch portion 393, and the pixel portion 395 in the display device according to this Embodiment.

FIG. 12 illustrates an EDMOS circuit of the logic circuit portion 391 in the display device. As a depletion type TFT 401a of the EDMOS circuit, as shown in the aforementioned (structure 2), the TFT including the first semiconductor layer in which an impurity element imparting one conductivity type is added to the channel formation region is formed. The TFT 401b shown in (structure 2) is formed as an enhancement type TFT 401b. Note that C-D in a cross-sectional view of the logic circuit portion 391 illustrated in FIG. 12 and C-E in a cross-sectional view of the logic circuit portion 391 illustrated in FIG. 13A correspond to C-D and C-E in a top view FIG. 13B respectively.

In the switch portion 393 in the display device illustrated in FIG. 12, a dual-gate TFT 403c including the gate electrode 305 and a back gate electrode 482 is formed.

A switching element of a pixel in the pixel portion 395 in the display device illustrated in FIG. 12 is formed using a TFT 401d. Further, a capacitor 403e is formed including a pixel electrode 481 connected to the wiring of the TFT 401d, the wiring 458, and a second gate insulating layer 379.

The TFT 401a illustrated in FIG. 12 is different from the TFT 401a illustrated in FIG. 10 in that the gate electrode 303 and the wiring 452 connecting the TFT 401a and the TFT 401b are connected through a wiring 483, which is formed at the same time as the pixel electrode 481 is formed over the second gate insulating layer 379 as illustrated in FIG. 13A.

The TFT 403c includes, over the substrate 301, the gate electrode 305, the first semiconductor layer 428a to which an impurity element imparting one conductivity type is added, the second semiconductor layer 428b, the third semiconductor layer 471, the first gate insulating layer 309 provided between the gate electrode 305 and the first semiconductor layer 428a, the impurity semiconductor layers 463 and 464 which are in contact with the third semiconductor layer 471 and function as a source region and a drain region, and the wirings 454 and 455 which are in contact with the impurity semiconductor layers 463 and 464. The TFT 403c also includes the back gate electrode 482 to face the gate electrode 305 with the second gate insulating layer 379 interposed therebetween. The back gate electrode 482 can be formed at the same time as the pixel electrode 481.

Further, the dual-gate TFT 300c shown in the aforementioned (structure 1) may be formed instead of the TFT 403c.

The pixel electrode 481 connected to the TFT 401d is formed over the second gate insulating layer 379.

The capacitor 403e is formed by including the wiring 458, the second gate insulating layer 379, and the pixel electrode 481.

In the display device illustrated in FIG. 12, the back gate electrode 482, and the wiring 483 connecting the gate electrode 303 and the wiring 452 can be formed at the same time as the pixel electrode 481 is formed; therefore, the number of photomasks can be reduced.

Figure 14A:
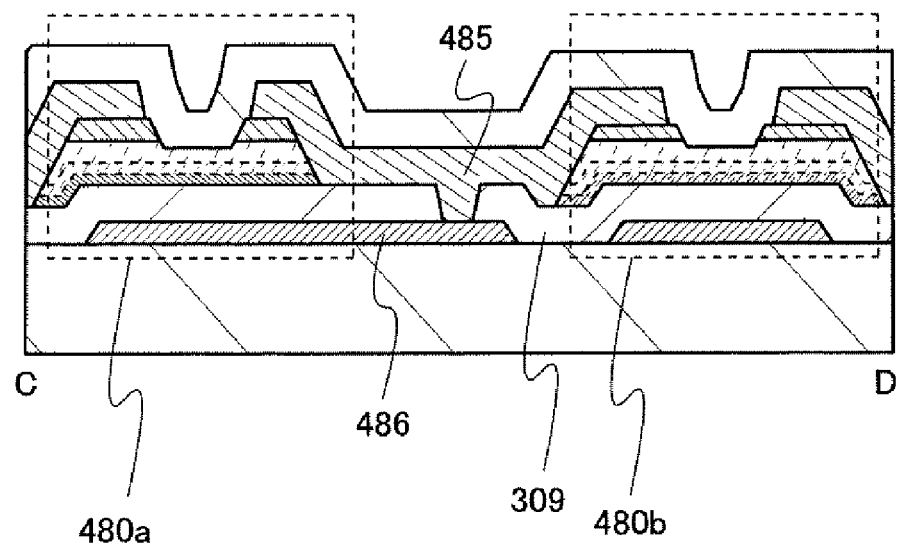
FIGS. 14A and 14B are a cross-sectional view and a top view, respectively, which illustrate a driver circuit of a display device according to an embodiment of the present invention.
Figure 14B:
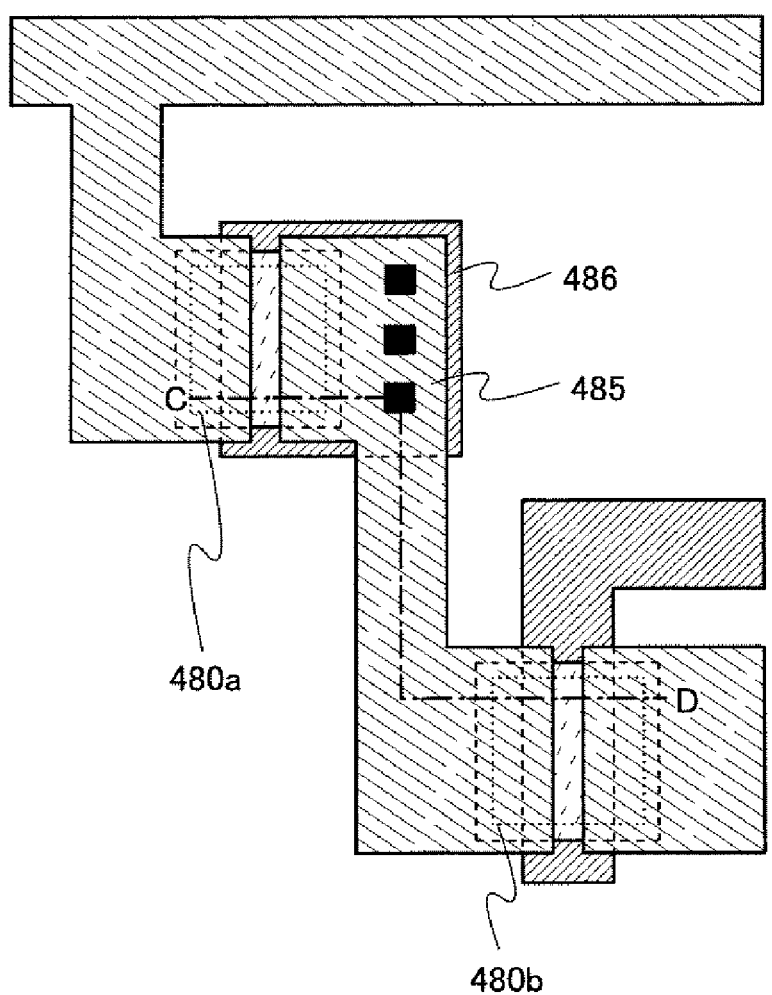

Next, FIGS. 14A and 14B illustrate a cross-sectional view of one mode (structure 4) of an EDMOS circuit applicable to the aforementioned (structure 1) to (structure 3).

FIG. 14A illustrates an EDMOS circuit of the logic circuit portion 391 in the display device. As a depletion type TFT 480a of the EDMOS circuit, as shown in the aforementioned (structure 2) and (structure 3), a TFT including the first semiconductor layer in which an impurity element imparting one conductivity type is added to the channel formation region is formed. An enhancement type TFT 480b is also formed with the same structure as the TFT 300b shown in (structure 1). Note that C-D in a cross-sectional view of the logic circuit portion 391 illustrated in FIG. 14A corresponds to C-D in a top view of FIG. 14B.

In the EDMOS circuit illustrated in FIGS. 14A and 14B, a gate electrode 486 of the depletion type TFT 480a is directly connected to a wiring 485 connecting the depletion type TFT 480a and the enhancement type TFT 480b in an opening portion formed in the first gate insulating layer 309.

Because the gate electrode 486 and the wiring 485 are connected directly, a contact resistance of the gate electrode 486 and the wiring 485 can be lower than in the EDMOS circuits illustrated in FIG. 7, FIGS. 8A and 8B, FIGS. 9A and 9B, FIG. 10, FIGS. 11A and 11B, and FIG. 12.

Note that in the case where a field effect mobility of a TFT is less than $5\ cm^2 V \cdot sec$, typically $0.5\ cm^2 V \cdot sec$ to $3\ cm^2 V \cdot sec$, as shown in (structure 1) to (structure 3), by connecting a depletion type TFT and an enhancement type TFT and forming a wiring connected to a gate electrode of the depletion type TFT at the same time as a back gate electrode or a pixel electrode is formed, the number of masks can be reduced. On the other hand, in the case where a field effect mobility of a TFT is greater than or equal to $5\ cm^2 V \cdot sec$, as illustrated in FIGS. 14A and 14B, the wiring connecting the depletion type TFT and the enhancement type TFT is directly connected to the gate electrode of the depletion type TFT in the opening portion formed in the first gate insulating layer 309, so that increase in a contact resistance can be reduced and high-speed operation of the TFT can be maintained.

Note that the TFTs in the EDMOS circuits in (structure 1) to (structure 4) can be appropriately applied to an inverter, a shift register, a buffer circuit, a protection circuit, a diode, and the like.

As to the TFTs shown in (structure 1) to (structure 4), a structure in which only the first semiconductor layer and the third semiconductor layer are stacked between the first gate insulating layer and the impurity semiconductor layer may be employed.

As to the aforementioned display device, the TFTs formed in the driver circuit and the pixel portion are TFTs with inverted staggered structure, and each TFT can be formed with one polarity, such as an n-type TFT or a p-type TFT, and further, part of the driver circuit can be formed over the substrate; therefore, the cost of the display device can be reduced. Further, by providing a dual-gate TFT or a depletion type TFT for a TFT that needs a large amount of current, the area of the TFT can be reduced, the frame of the display device can be narrowed, and a display region can be enlarged. In the pixel portion, a TFT of which on current is high and off current is low is used for the switching element of each pixel, so that a display device with high contrast and high image quality can be achieved.

Embodiment 4

Now, a manufacturing method of the display device in FIG. 7 will be described with reference to FIGS. 15A to 15C, FIGS. 16A to 16C, FIGS. 17A and 17B, and FIGS. 18A and 18B. In this Embodiment, a manufacturing method of an n-type thin film transistor (method 1) will be described.

As illustrated in FIG. 15A, the gate electrodes 303 to 306 and the capacitor wiring 307 are formed over the substrate 301. Next, the first gate insulating layer 309 and a first semiconductor layer 311 are formed in this order covering the gate electrodes 303 to 306 and the capacitor wiring 307.

As the substrate 301, the substrate 301 described in Embodiment 3 can be used appropriately.

The gate electrodes 303 to 306 and the capacitor wiring 307 are formed using the material of the gate electrodes 303 to 306 and the capacitor wiring 307 described in Embodiment 3 appropriately. The gate electrodes 303 to 306 and the capacitor wiring 307 can be formed as follows: a conductive layer is formed over the substrate 301 using the aforementioned material by a sputtering method or a vacuum evaporation method, then a mask is formed over the conductive layer by photolithography, an inkjet method, or the like, and the conductive layer is etched using the mask. Alternatively, the gate electrodes 303 to 306 and the capacitor wiring 307 can be formed by discharging a conductive nanopaste of silver, gold, copper, or the like to the substrate by an inkjet method and baking the conductive nanopaste. In order to improve adhesion between the gate electrodes 303 to 306 and the capacitor wiring 307 and the substrate 301, a layer of a nitride of the aforementioned metal material may be provided between the substrate 301 and the gate electrodes 303 to 306 and the capacitor wiring 307. Hereupon, a conductive layer is formed over the substrate 301 and etched with a resist mask formed using a photomask.

Note that side surfaces of the gate electrodes 303 to 306 and the capacitor wiring 307 are preferably a tapered shape. This is because an insulating layer, a semiconductor layer, and a wiring layer, which are formed over the gate electrode 303 in subsequent steps are not disconnected. In order to form the side surfaces of the gate electrodes 303 to 306 and the capacitor wiring 307 into a tapered shape, etching is performed while a resist mask is being reduced.

Further, the gate wiring (the scan line) and the capacitor wiring can be formed at the same time as the step for forming the gate electrodes 303 to 306. Note that a "scan line" means a wiring arranged to select a pixel, while a "capacitor wiring" means a wiring connected to one electrode of a storage capacitor of a pixel. However, the present invention is not limited to this and one or both of the gate wiring and the capacitor wiring may be provided in a different step from the gate electrodes 303 to 306.

The first gate insulating layer 309 can be formed with the same material as the first gate insulating layer 309 described in Embodiment 3 appropriately. The first gate insulating layer 309 can be formed by a CVD method, a sputtering method, or the like. Alternatively, the first gate insulating layer 309 may be formed with a microwave plasma CVD apparatus with a high frequency of the greater than or equal to 1 GHz or the like. In the case where the first gate insulating layer 309 is formed with the microwave plasma CVD apparatus, a thin film transistor with high reliability can be obtained because a withstand voltage between the gate electrodes and the source and drain electrodes can be improved. Alternatively, in the case where a silicon oxide layer is formed as the first gate insulating layer 309 by a CVD method using an organosilane gas, a hydrogen content of the first gate insulating layer can be reduced and fluctuation of the threshold voltage of the thin film transistor can be reduced. As the organosilane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

The first semiconductor layer 311 is formed using microcrystalline silicon, microcrystalline silicon germanium, microcrystalline germanium, or the like. The first semiconductor layer 311 is formed with a thickness of greater than or equal to 1 nm and less than or equal to 20 nm, preferably, greater than or equal to 3 nm and less than or equal to 10 nm.

The first semiconductor layer 311 is formed by glow discharge plasma with a mixture of a deposition gas including silicon or germanium and hydrogen in a reaction chamber of the plasma CVD apparatus. Alternatively, the first semiconductor layer 311 is formed by glow discharge plasma with a mixture of a deposition gas including silicon or germanium, hydrogen, and a rare gas such as helium, neon, or krypton. When microcrystalline silicon, microcrystalline silicon germanium, microcrystalline germanium or the like is formed, the deposition gas containing silicon or germanium is diluted with hydrogen so that the flow rate of hydrogen is 10 to 2000 times, preferably 10 to 200 times that of the deposition gas containing silicon or germanium.

As typical examples of the deposition gas including silicon or germanium, $SiH_4$, $Si_2H_6$, $GeH_4$, $Ge_2H_6$ are given.

Note that, before the first semiconductor layer 311 is formed, while a gas in the treatment chamber of the CVD apparatus is exhausted, the deposition gas including silicon or germanium is introduced to a treatment chamber and impurity elements in the treatment chamber are removed. In that case, impurity elements, at the interface between the first gate insulating layer 309 and the first semiconductor layer of the thin film transistor which is formed in a later step can be reduced and electric characteristics of the thin film transistor can be improved.

Next, as illustrated in FIG. 15B, a second semiconductor layer 313 and a third semiconductor layer 315 are formed over the first semiconductor layer 311. Here, the second semiconductor layer 313 and the third semiconductor layer 315 are formed under the condition that crystals grow partially from the first semiconductor layer 311. The second semiconductor layer 313 and the third semiconductor layer 315 are formed by glow discharge plasma with a mixture of a deposition gas including silicon or germanium and hydrogen in a reaction chamber of the plasma CVD apparatus. At this time, instead of the condition of forming the first semiconductor layer 311, the layers are formed under the condition that the flow ratio of hydrogen to the deposition gas including silicon or germanium is reduced, which is a condition that crystal growth is reduced; thus, crystal growth of the second semiconductor layer 313 is suppressed, and as a film is deposited, the third semiconductor layer 315 which does not include microcrystalline semiconductor regions can be formed.

Alternatively, in a reaction chamber of the plasma CVD apparatus, the second semiconductor layer 313 and the third semiconductor layer 315 are formed by glow discharge plasma with a mixture of a deposition gas including silicon or germanium, hydrogen, and a gas including nitrogen. At this time, instead of the condition of forming the first semiconductor layer 311, the layers are formed under the condition that the flow ratio of hydrogen to the deposition gas including silicon or germanium is reduced and the gas including nitrogen is mixed; thus, crystal growth of the second semiconductor layer 313 is suppressed, and the third semiconductor layer 315 which does not include microcrystalline semiconductor regions can be formed.

In this Embodiment, in an early stage of deposition of the second semiconductor layer 313, the first semiconductor layer 311 serves as a seed crystal and a film is deposited over the entire surface. After that, crystal growth is partially suppressed and conical or pyramidal shape microcrystalline semiconductor regions are formed (a middle stage of deposition). Further, crystal growth of the conical or pyramidal shape microcrystalline semiconductor regions is suppressed and the third semiconductor layer 315 that does not include microcrystalline semiconductor regions is formed (a later stage of deposition). Accordingly, the first semiconductor layer described in Embodiment 3 corresponds to a film that is formed at an initial stage of deposition of the first semiconductor layer 311 and the second semiconductor layer 313 in this Embodiment. The second semiconductor layer described in Embodiment 3 corresponds to the conical or pyramidal shape microcrystalline semiconductor regions and the amorphous semiconductor regions, which are formed in the middle stage of deposition of the second semiconductor layer 313 in this Embodiment. The third semiconductor layer described in Embodiment 3 corresponds to the third semiconductor layer 315 that is formed in the later stage of deposition in this Embodiment.

Next, as illustrated in FIG. 15C, a semiconductor layer to which an impurity element imparting one conductivity type is added (hereinafter, referred to as an impurity semiconductor layer 317) is formed over the third semiconductor layer 315, and a conductive layer 319 is formed over the impurity semiconductor layer 317.

The impurity semiconductor layer 317 is formed by glow discharge plasma with a mixture of a deposition gas including silicon or germanium, hydrogen, and phosphine (diluted with hydrogen or silane) in a reaction chamber of the plasma CVD apparatus. By diluting the deposition gas including silicon or germanium with hydrogen, amorphous silicon to which phosphorus is added, microcrystalline silicon to which phosphorus is added, amorphous silicon germanium to which phosphorus is added, microcrystalline silicon germanium to which phosphorus is added, amorphous germanium to which phosphorus is added, microcrystalline germanium to which phosphorus is added, or the like is formed.

The materials and the stacked-layer structure of the wirings 346 to 352 and the capacitor wiring 353 in Embodiment 3 can be appropriately employed for the conductive layer 319. The conductive layer 319 is formed by a CVD method, a sputtering method, or a vacuum evaporation method. Alternatively, the conductive layer 319 may be formed as follows: a conductive nanopaste of silver, gold, copper, or the like is discharged by using a screen printing method, an inkjet method, or the like, and baked.

Next, as illustrated in FIG. 16A, second resist masks 321 to 324 are formed over the conductive layer 319.

The resist masks 321 to 323 each include regions having different thicknesses. Such resist masks can be formed by use of a multi-tone mask. The use of the multi-tone mask is preferable because the numbers of photomasks is reduced and the number of manufacturing steps is reduced. In this Embodiment, a multi-tone mask can be used in a step of forming a pattern of the semiconductor layer and a step of separating the semiconductor layer into a source region and a drain region.

A multi-tone mask is a mask capable of light exposure with multi-level light intensity, and typically, light exposure is performed with three levels of light intensity to provide an exposed region, a half-exposed region, and an unexposed region. By use of the multi-tone mask, one-time light exposure and development process allow a resist mask with plural thicknesses (typically, two levels of thicknesses) to be formed; therefore, by the use of a multi-tone mask, the number of photomasks can be reduced.

Figures 1, 19A:
Figures 2, 19A:
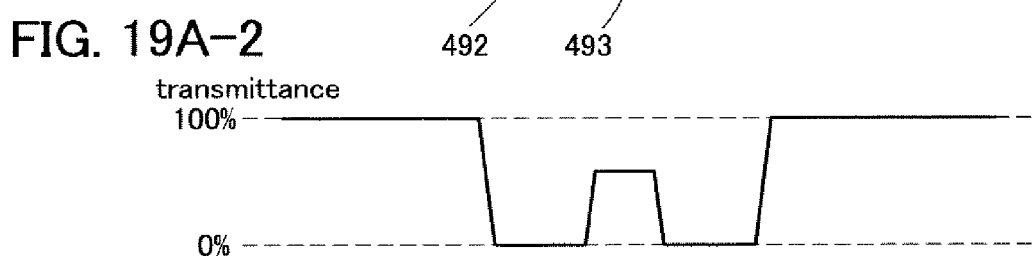
Figures 1, 19B:
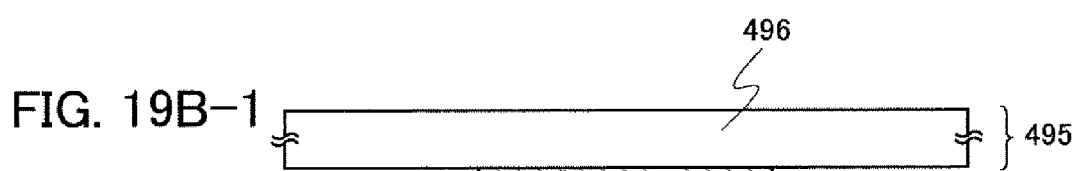
Figures 2, 19B:
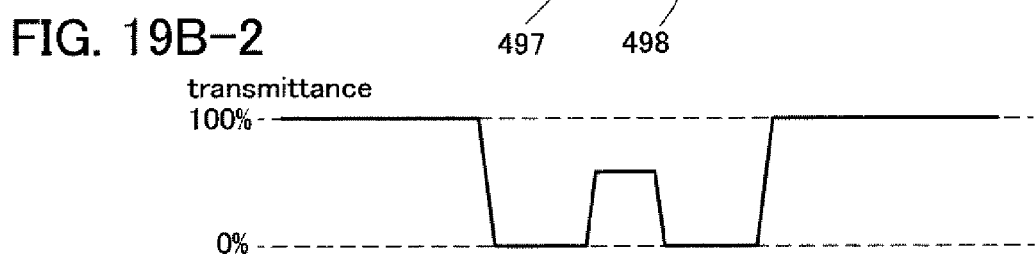

FIGS. 19A-1 and 19B-1 are cross-sectional views of typical multi-tone masks. FIG. 19A-1 illustrates a gray-tone mask 490 and FIG. 19B-1 illustrates a half-tone mask 495.

The gray-tone mask 490 illustrated in FIG. 19A-1 includes a light-blocking portion 492 formed using a light-blocking film on a substrate 491 having a light-transmitting property, and a diffraction grating portion 493 provided with a pattern of the light-blocking film.

The transmittance of light is controlled at the diffraction grating portion 493 in such a manner that slits, dots, mesh, or the like are provided at an interval less than or equal to the resolution limit of light used for light exposure. Note that the slits, dots, or mesh provided at the diffraction grating portion 493 may be provided periodically or non-periodically.

As the substrate 491 having a light-transmitting property, quartz or the like can be used. The light-blocking film for forming the light-blocking portion 492 and the diffraction grating portion 493 may be formed using metal, preferably, chromium, chromium oxide, or the like.

In the case where the gray-tone mask 490 is irradiated with light for light exposure, as illustrated in FIG. 19A-2, the transmittance of part of the gray-tone mask 490 which overlaps with the light-blocking portion 492 is 0%, and the transmittance of part of the gray-tone mask 490 where both the light-blocking portion 492 and the diffraction grating portion 493 are not provided is 100%. Further, the transmittance at the diffraction grating portion 493 is substantially in the range of 10% to 70%, which can be adjusted by the interval of slits, dots, or mesh of the diffraction grating, or the like.

The half-tone mask 495 illustrated in FIG. 19B-1 includes a semi-light-transmitting portion 497 formed using a semi-light-transmitting film on a substrate 496 having a light-transmitting property, and a light-blocking portion 498 formed using a light-blocking film.

The semi-light-transmitting portion 497 can be formed using a film of MoSiN, MoSi, MoSiO, MoSiON, CrSi, or the like. The light-blocking portion 498 may be formed using metal that is a material similar to the light-blocking film of the gray-tone mask and preferably provided using chromium, chromium oxide, or the like.

In the case where the half-tone mask 495 is irradiated with light for light exposure, as illustrated in FIG. 19B-2, the transmittance of part of the half-tone mask 495 which overlaps with the light-blocking portion 498 is 0%, and the transmittance of part of the half-tone mask 495 where both the light-blocking portion 498 and the semi-light-transmitting portion 497 are not provided is 100%. Further, the transmittance in the semi-light-transmitting portion 497 is substantially in the range of 10% to 70%, which can be adjusted by the kind, the thickness, or the like of the semi-light-transmitting portion 497 to be formed.

By light exposure and development using the multi-tone mask, a resist mask that includes regions having different thicknesses can be formed.

Next, the first semiconductor layer 311, the second semiconductor layer 313, the third semiconductor layer 315, the impurity semiconductor layer 317, and the conductive layer 319 are etched using the resist masks 321 to 324. By this step, the first semiconductor layer 311, the second semiconductor layer 313, the third semiconductor layer 315, the impurity semiconductor layer 317, and the conductive layer 319 are divided to be used for each element, so that the first semiconductor layers 333a to 336a, the second semiconductor layers 333b to 336b, the third semiconductor layers 333c to 336c, the impurity semiconductor layers 329 to 332, and the conductive layers 325 to 328 are formed (see FIG. 16B).

Next, the resist masks 321 to 324 are reduced in size, so that the resist masks 337 to 344, which are separated and the resist mask 345 that is reduced are formed. In order to reduce the resist masks, ashing with oxygen plasma may be used. Here, the resist masks 321 to 323 are subjected to ashing in order to be separated over the gate electrodes; thus, resist masks 337 to 344 can be formed (see FIG. 16C).

Figure 17A:
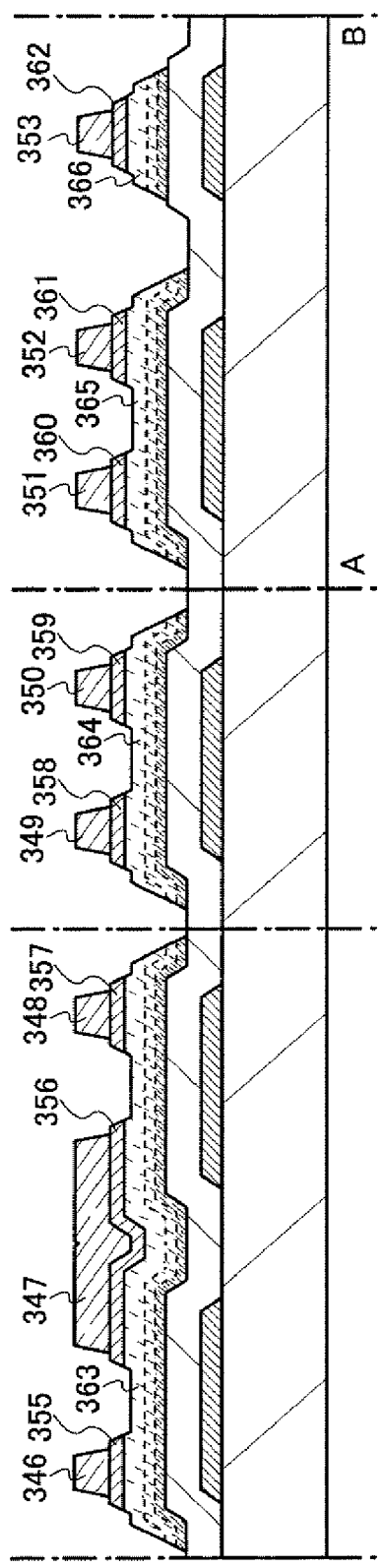
FIGS. 17A and 17B are cross-sectional views illustrating a method for manufacturing a display device according to an embodiment of the present invention.
Figure 17B:
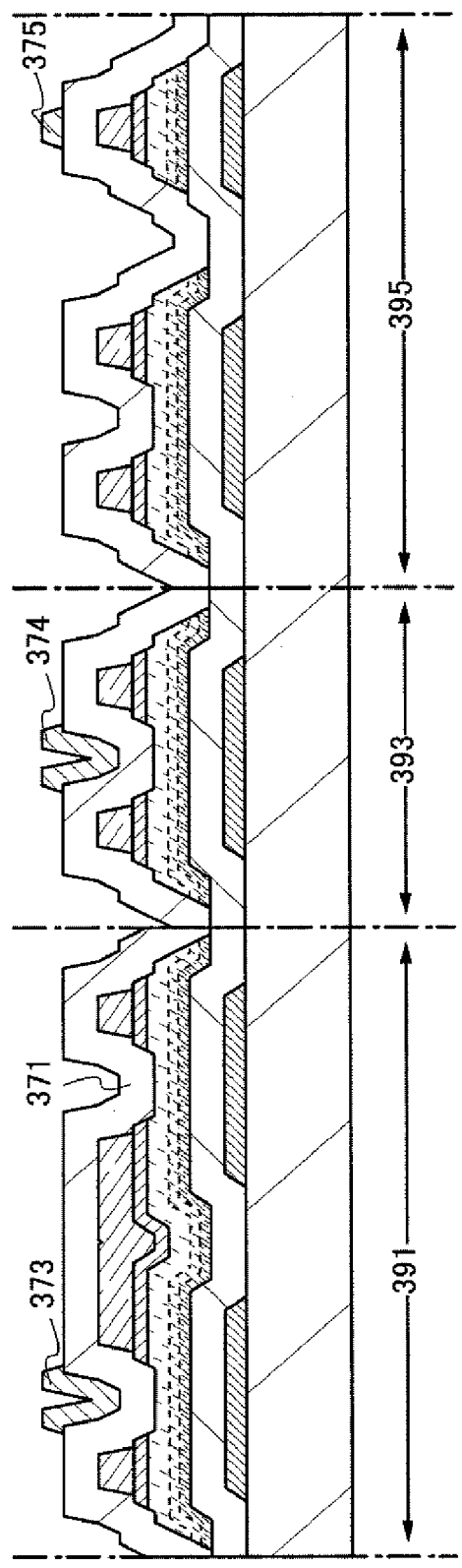

Next, the conductive layers 325 to 328 are etched using the resist masks 337 to 345 in order to form wirings 346 to 352 and the capacitor wiring 353 (see FIG. 17A). It is preferable to employ wet etching as the etching of the conductive layers 325 to 328. By wet etching, the conductive layers 325 to 328 are isotropically etched. As a result, the side surface of the wirings 346 to 352 and the capacitor wiring 353 are reduced to an inner side than the side surface of the resist masks 337 to 345. The wirings 346 to 352 serve as not only a source electrode and a drain electrode but also as a signal line. However, without limitation thereto, a signal line may be provided separately from source and drain electrodes.

Figure 20A:
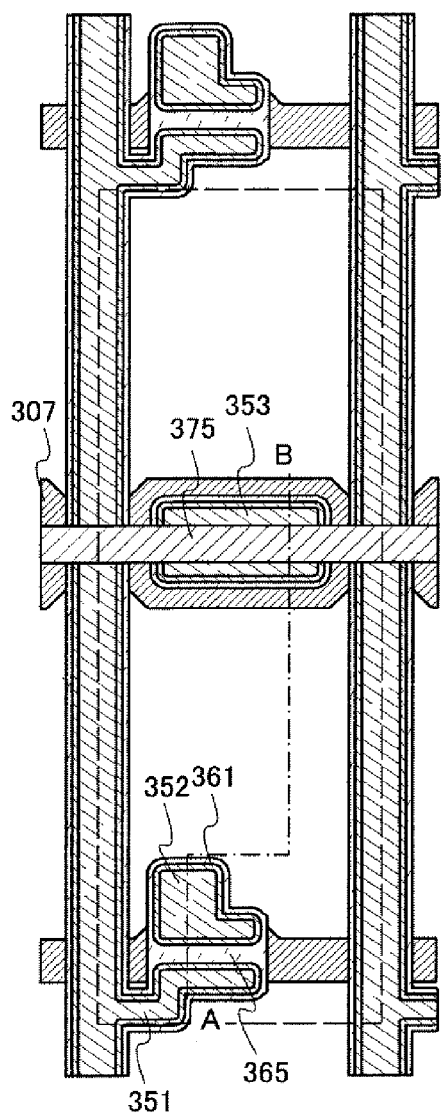
FIGS. 20A and 20B are plan views illustrating a method for manufacturing a display device according to an embodiment of the present invention.

Next, part of each of the third semiconductor layers 333c to 336c and the impurity semiconductor layers 329 to 332 is etched using the resist masks 337 to 345. Here, dry etching is employed. The third semiconductor layers 363 to 366, which each serves as a buffer layer, and the impurity semiconductor layers 355 to 362 are formed up to this step. After this step, the resist masks 337 to 345 are removed (see FIG. 17A). Note that a cross-sectional view illustrating a pixel portion 395 in FIG. 17A corresponds to a cross-sectional view along a line A-B of the pixel portion in a plane view of FIG. 20A.

In this case, after the conductive layers 325 to 328 are etched by wet etching, part of each of the third semiconductor layers 333c to 336c and the impurity semiconductor layers 329 to 332 is etched by dry etching while the resist masks 337 to 345 remain. Thus, the conductive layers 325 to 328 are isotropically etched, and the side surfaces of the wirings 346 to 352 and the capacitor wiring 353 do not match the side surfaces of the impurity semiconductor layers 355 to 362, that is, the side surfaces of the impurity semiconductor layers 355 to 362 are formed outside of the wirings 346 to 352 and the capacitor wiring 353.

After the resist masks 337 to 345 are removed, it is preferable that dry etching be performed on the third semiconductor layers 363 to 366. The dry etching condition is set such that an exposed part of each of the third semiconductor layers 363 to 366 is not damaged and the etching rate to the third semiconductor layers 363 to 366 is low. That is, condition that an exposed surface of each of the third semiconductor layers 363 to 366 is hardly damaged and the thickness thereof is hardly reduced is employed. As an etching gas, $Cl_2$, $CF_4$, $N_2$, or the like is used. An etching method is not particularly limited and an inductively coupled plasma (ICP) method, a capacitively coupled plasma (CCP) method, an electron cyclotron resonance (ECR) method, or a reactive ion etching (RIE) method, or the like can be used.

Next, the surfaces of the third semiconductor layers 363 to 366 may be irradiated with water plasma, ammonia plasma, nitrogen plasma, or the like.

The water plasma treatment can be performed in such a manner that a gas containing water as its main component typified by water vapor ($H_2O$ vapor) is introduced into a reaction space and generate plasma.

As described above, dry etching is further performed under the condition that the third semiconductor layers 363 to 366 are not damaged after the impurity semiconductor layers 355 to 362 are formed, so that impurities such as residues or the like on the third semiconductor layers 363 to 366 can be removed. Further, by performing the water plasma treatment after the dry etching, residues on the resist masks can be removed. By the water plasma treatment, insulation between the source region and the drain region can be secured, and thus in a thin film transistor which is completed, the off current can be reduced, and variation in the electric characteristics can be reduced.

Through the above-described steps, the thin film transistor can be manufactured.

Next, a second gate insulating layer 371 is formed. After that, over the first gate insulating layer 309, back gate electrodes 373 and 374, and a capacitor wiring 375 are formed in a region where the dual-gate TFT 300a of the logic circuit portion 391 is formed, a region where the dual-gate TFT 300c of the switch portion 393 is formed, and a region where the capacitor of the pixel portion 395 is formed, respectively.

The second gate insulating layer 371 can be formed in a manner similar to the first gate insulating layer 309.

The materials and the manufacturing method of the wirings 346 to 352 and the capacitor wiring 353 can be appropriately used for forming the back gate electrodes 373 and 374, and the capacitor wiring 375.

Next, as illustrated in FIG. 18A, an insulating layer 372 is formed. The insulating layer 381 described in Embodiment 3 can be appropriately used for forming the insulating layer 372.

Figure 20B:
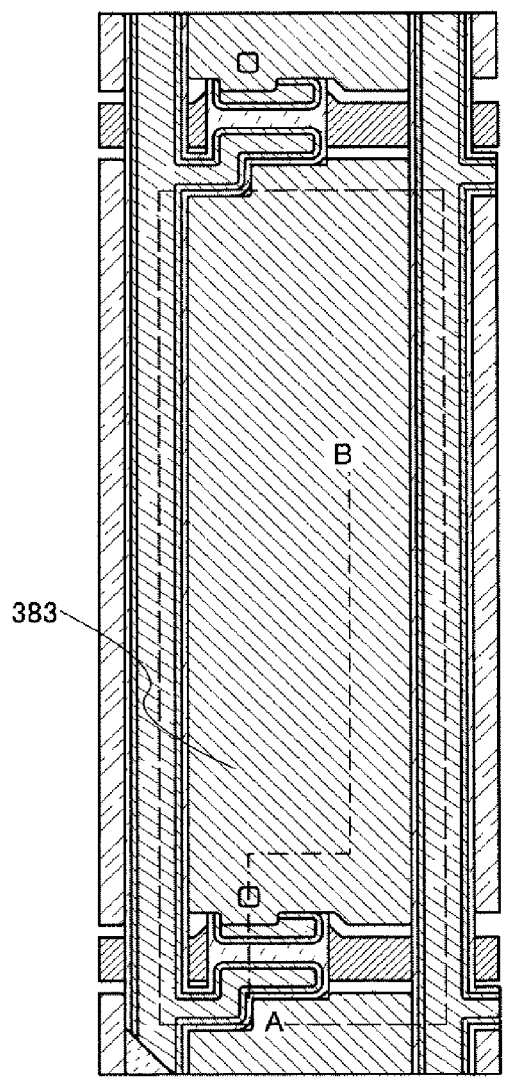

Next, the insulating layer 372 and of the second gate insulating layer 371 are partly etched to form an opening through which the wiring 347 connecting the dual-gate TFT 300a and the TFT 300b of the logic circuit portion 391, the gate electrode 303, and the wiring 352 of the pixel portion 395 are exposed. The opening can be formed by photolithography. After that, a wiring 347 and a pixel electrode 383 are formed over the insulating layer 372. Through the opening, the wiring 347 connects the wiring 347 connecting the dual-gate TFT 300a and the TFT 300b to the gate electrode 303, and the pixel electrode 383 connects to the wiring 352 of the pixel portion 395 (see FIG. 18B, and see FIG. 8A about the connection of the wiring 347 and the gate electrode 303). Note that a cross-sectional view of the pixel portion 395 illustrated in FIG. 18A corresponds to a cross-sectional view along A-B of the pixel portion in a plane view of FIG. 20B.

A thin film is formed using the materials described in Embodiment 3 by a sputtering method, and the film is etched using a resist mask that is formed by a photolithography process, so that the wiring 384 and the pixel electrode 383 can be formed. Alternatively, a conductive composition including a conductive high molecule having a light-transmitting property is applied or printed, and baked to form the wiring 384 and the pixel electrode 383. Note that a cross-sectional view of the pixel portion 395 illustrated in FIG. 17A corresponds to a cross sectional view along A-B of the pixel portion in a plane view of FIG. 20A.

By connecting the wiring 347 connecting the dual-gate TFT 300a and the TFT 300b of the logic circuit portion 391 to the gate electrode 303 through the wiring 384, an EDMOS circuit including the TFT 300a and the TFT 300b can be formed.

Figure 8B:
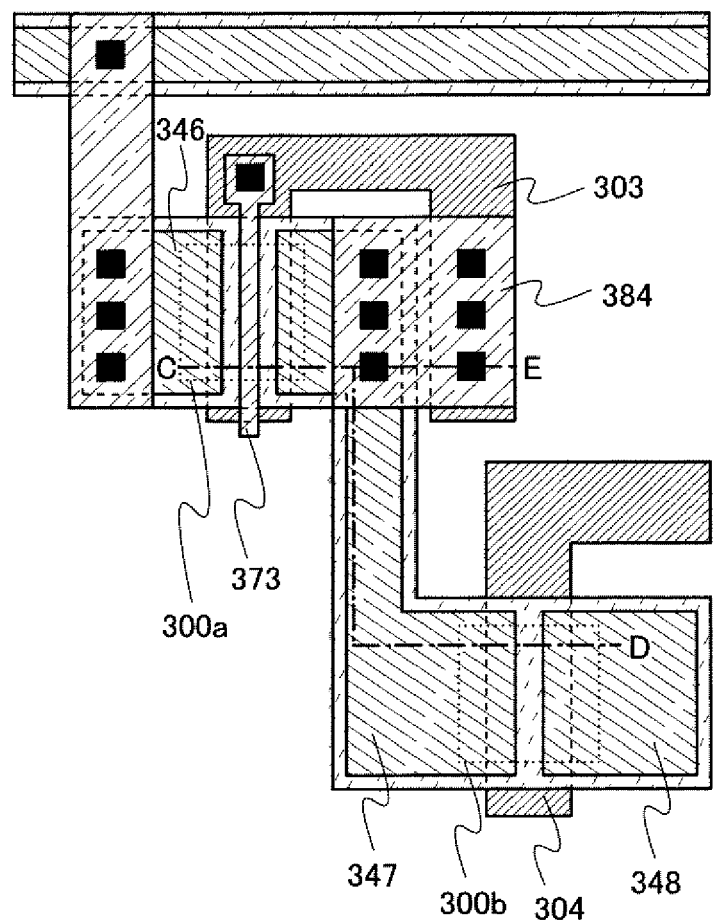

Through the above-described steps, the display device illustrated in FIGS. 8A and 8B can be manufactured.

Next, a manufacturing method of the display device in FIG. 10 (method 2) will be described with reference to FIGS. 21A to 21C, FIGS. 22A to 22C, and FIGS. 23A and 23B.

Figure 21A:
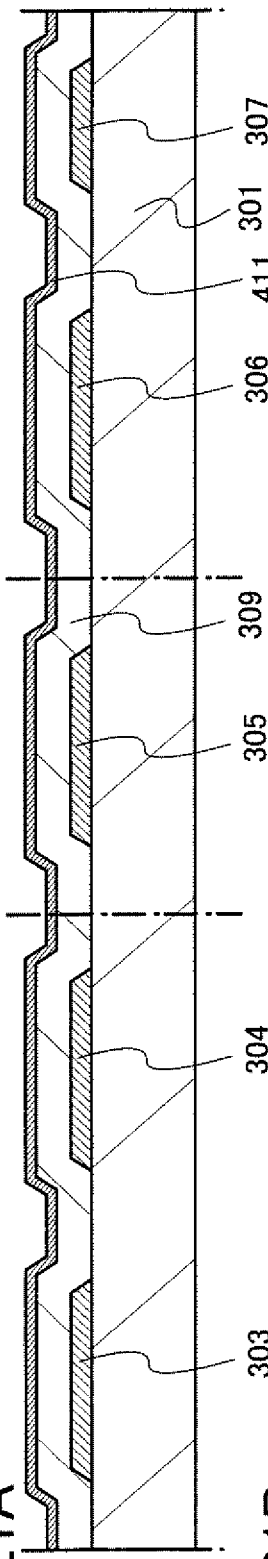
FIGS. 21A to 21C are cross-sectional views illustrating a method for manufacturing a display device according to an embodiment of the present invention.

As illustrated in FIG. 21A, the gate electrodes 303 to 306 and the capacitor wiring 307 are formed over the substrate 301. Next, the first gate insulating layer 309 and the first semiconductor layer 411 to which an impurity element imparting one conductivity type is added are formed covering the gate electrodes 303 to 306 and the capacitor wiring 307.

As the substrate 301, the substrate 301 described in Embodiment 3 can be used appropriately.

The gate electrodes 303 to 306 and the capacitor wiring 307 and the first gate insulating layer 309 can be formed in a manner similar to the aforementioned (method 1).

The first semiconductor layer 411 to which an impurity element imparting one conductivity type is added is formed by adding an impurity element serving as a donor or an acceptor to the first semiconductor layer 311. As the impurity element serving as a donor, an element belonging to Group 15 of the periodic table, typically, phosphorus, arsenic, antimony, or the like is used. As the impurity element serving as an acceptor, an element belonging to Group 13 of the periodic table, typically, boron, or the like is used. Hereupon, as a method for forming the first semiconductor layer 411 to which an impurity element imparting one conductivity type is added, a microcrystalline semiconductor layer to which phosphorus, which is an impurity element serving as a donor, is added is described.

A semiconductor layer is formed by mixing a gas containing an impurity element imparting one conductivity type to a source gas of the first semiconductor layer 411 to which an impurity element imparting one conductivity type is added. Typically, the semiconductor layer is formed by glow discharge plasma with a mixture of a deposition gas containing silicon or germanium, hydrogen, and phosphine in a reaction chamber of the plasma CVD apparatus. Alternatively, the semiconductor layer is formed by glow discharge plasma with a mixture of a deposition gas including silicon or germanium, hydrogen, phosphine, and a rare gas such as helium, neon, or krypton. As the first semiconductor layer 411 to which an impurity element imparting one conductivity type is added, microcrystalline silicon including phosphorus, microcrystalline silicon germanium including phosphorus, microcrystalline germanium including phosphorus, or the like is formed.

Alternatively, a microcrystalline semiconductor layer is formed after the surface of the first gate insulating layer 309 is exposed to a gas containing an impurity element imparting one conductivity type; thus, the microcrystalline semiconductor layer is formed while taking in an impurity element imparting one conductivity type. Typically, the surface of the first gate insulating layer 309 is exposed to phosphine; thus, phosphorus is adsorbed to the surface of the first gate insulating layer 309. After that, the microcrystalline semiconductor layer is formed in a manner similar to the first semiconductor layer 311 described in the (method 1), so that microcrystalline silicon including phosphorus, microcrystalline silicon germanium including phosphorus, microcrystalline germanium including phosphorus, or the like can be formed.

Alternatively, after a microcrystalline semiconductor layer is formed over the first gate insulating layer 309, plasma is generated under a gas atmosphere containing an impurity element imparting one conductivity type, and the microcrystalline semiconductor layer is exposed to plasma containing an impurity element imparting one conductivity type; thus, the first semiconductor layer 411 to which an impurity element imparting one conductivity type is added can be formed. Typically, after the microcrystalline semiconductor layer is formed in a manner similar to the first semiconductor layer 311 described in (method 1), the microcrystalline semiconductor layer is exposed to phosphorus plasma, so that microcrystalline silicon including phosphorus, microcrystalline silicon germanium including phosphorus, microcrystalline germanium including phosphorus, or the like can be formed.

Figure 21B:
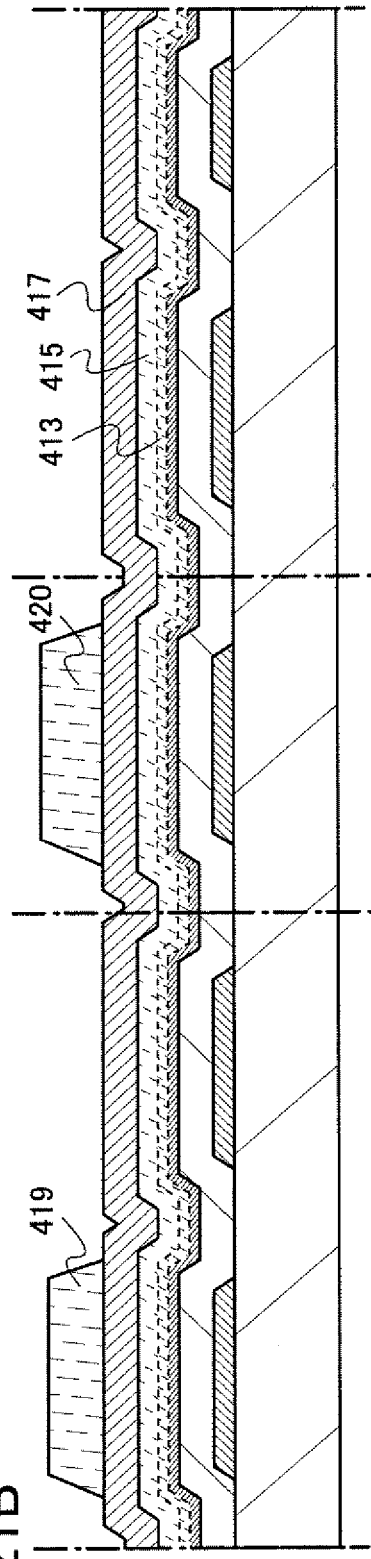
Figure 21C:
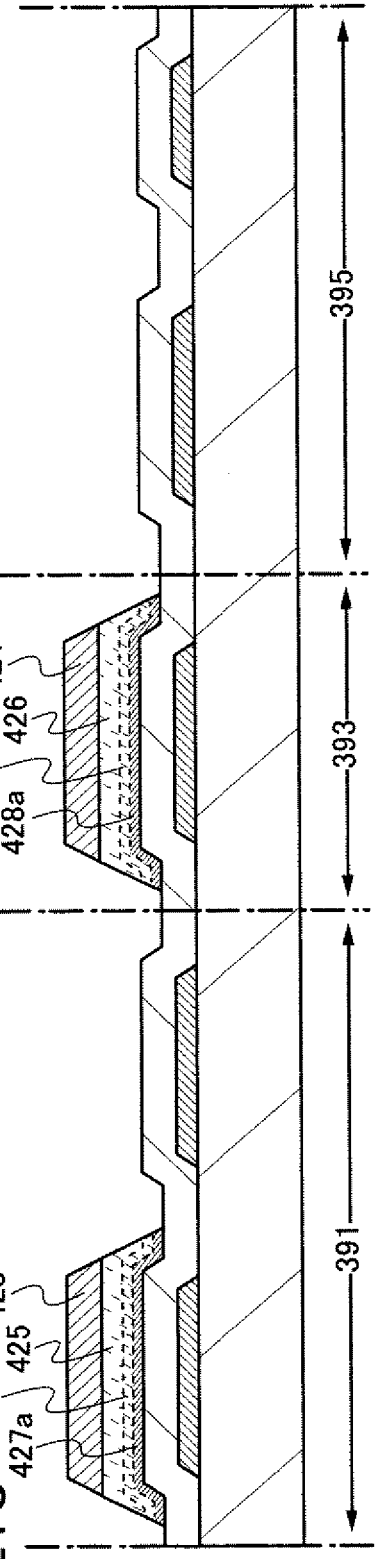

Next, after the second semiconductor layer 413, the third semiconductor layer 415, and the impurity semiconductor layer 417 are formed over the first semiconductor layer 411, resist masks 419 and 420 are formed over the impurity semiconductor layer 417 (see FIG. 21B).

Here, the second semiconductor layer 413, the third semiconductor layer 415, and the impurity semiconductor layer 417 are formed in a manner similar to the aforementioned the second semiconductor layer 313, the third semiconductor layer 315, and the impurity semiconductor layer 317 described in (method 1).

Note that the thickness of the impurity semiconductor layer 417 is reduced by the subsequent steps of etching a fourth semiconductor layer 431, a fifth semiconductor layer 433, a sixth semiconductor layer 435, and an impurity semiconductor layer 437. Accordingly, it is preferable that the impurity semiconductor layer 417 be formed thickly, typically, with a thickness of about 30 nm to 150 nm.

The resist masks 419 and 420 are formed in a region to be a TFT 401a of the logic circuit portion 391 later and a region to be a TFT 401c of the switch portion 393 later respectively.

Next, the first semiconductor layer 411, the second semiconductor layer 413, the third semiconductor layer 415, and the impurity semiconductor layer 417 are etched using the resist masks 419 and 420. By this step, the first semiconductor layer 411, the second semiconductor layer 413, the third semiconductor layer 415, and the impurity semiconductor layer 417 are divided to be used for each element, so that the first semiconductor layers 427a and 428a, the second semiconductor layers 427b and 428b, the third semiconductor layers 425 and 426, and the impurity semiconductor layers 423 and 424 are formed. After that, the resist masks 419 and 420 are removed (see FIG. 21C).

As illustrated in FIG. 22A, the fourth semiconductor layer 431, the fifth semiconductor layer 433, the sixth semiconductor layer 435, and the impurity semiconductor layer 437 are formed, and resist masks 439 and 440 are formed thereover.

The fourth semiconductor layer 431, the fifth semiconductor layer 433, the sixth semiconductor layer 435, and the impurity semiconductor layer 437 can be formed in a mariner similar to the first semiconductor layer 311, the second semiconductor layer 313, the third semiconductor layer 315, and the impurity semiconductor layer 317 described in the aforementioned (method 1) respectively.

The resist masks 439 and 440 are formed in a region to be a TFT 401b of the logic circuit portion 391 later and in a region to be a TFT 401d of the pixel portion 395 later respectively.

Next, the fourth semiconductor layer 431, the fifth semiconductor layer 433, the sixth semiconductor layer 435, and the impurity semiconductor layer 437 are etched using the resist masks 439 and 440. By this step, the fourth semiconductor layer 431, the fifth semiconductor layer 433, the sixth semiconductor layer 435, and the impurity semiconductor layer 437 are divided to be used for each element, so that the fourth semiconductor layers 454a to 456a, the fifth semiconductor layers 454b to 456b, the sixth semiconductor layers 454c to 456c, and the impurity semiconductor layers 444, 446, and 447 are formed. By the etching, the impurity semiconductor layers 423 and 424 are also etched, so that impurity semiconductor layers 443 and 445 whose thicknesses are reduced are formed. This is because the fourth semiconductor layer 431, the fifth semiconductor layer 433, the sixth semiconductor layer 435, and the impurity semiconductor layer 437 are sufficiently etched and over etching is performed after the etching of the fourth semiconductor layer 431 is completed so as not to leave residues. Accordingly, the impurity semiconductor layers 423 and 424 are also etched by the over etching (see FIG. 22B). After that, the resist masks 439 and 440 are removed.

Next, illustrated in FIG. 22C, the conductive layer 319 is formed.

Next, a resist mask is formed over the conductive layer 319. Next, the conductive layer 319 is etched using the resist mask in a manner similar to the aforementioned (method 1) to form wirings 451 to 458.

Next, part of each of the third semiconductor layers 469 to 473 and part of each of the impurity semiconductor layers 443 to 447 are etched in a manner similar to the aforementioned (method 1) using the resist mask. The third semiconductor layers 469 to 473, which each serves as a buffer layer, and the impurity semiconductor layers 459 to 467 are formed up to this step. After that, the resist mask is removed.

After removing the resist mask, dry etching is preferably performed. The surfaces of the third semiconductor layers 469 to 473 may be irradiated with water plasma, ammonia plasma, nitrogen plasma, or the like.

Figure 23A:
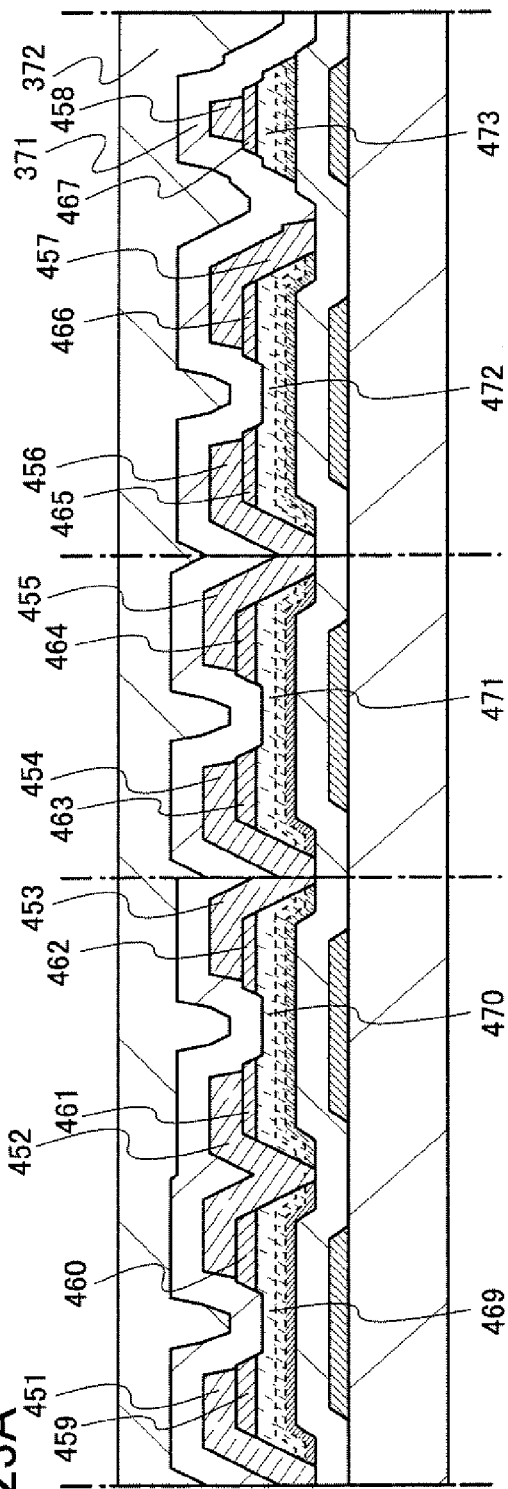
FIGS. 23A and 23B are cross-sectional views illustrating a method for manufacturing a display device according to an embodiment of the present invention.
Figure 23B:
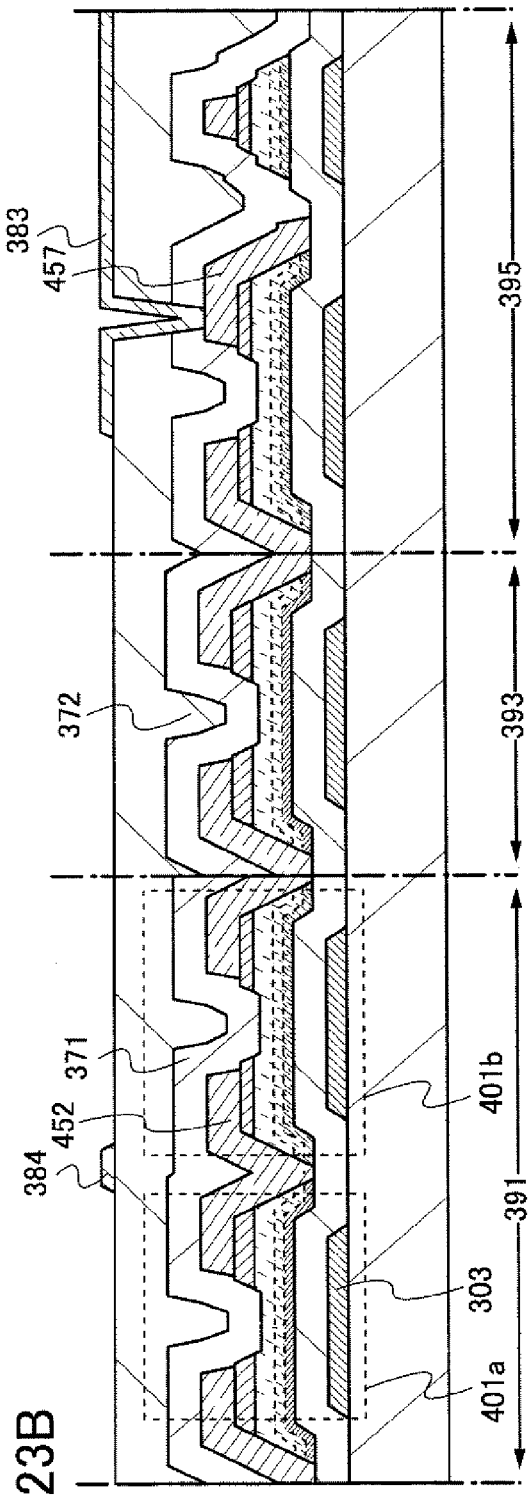

Next, the second gate insulating layer 371 and the insulating layer 372 are formed in a manner similar to the aforementioned (method 1) (see FIG. 23A).

Through the above-described steps, the thin film transistor can be manufactured.

Next, part of each of the second gate insulating layer 371 and the insulating layer 372 is etched to form an opening through which the wiring 452 of a TFT 401a of the logic circuit portion 391, the gate electrode 303, and the wiring 457 of the pixel portion 395 are exposed. The opening can be formed by photolithography. After that, a wiring 384 and a pixel electrode 383 are formed over the insulating layer 372. Through the opening, the wiring 384 connects the wiring 452 of the TFT 401a of the logic circuit portion 391 and the gate electrode 303, and the pixel electrode 383 is connected to the wiring 457 of the pixel portion 395 (see FIG. 23B, and see FIG. 11A about the connection of the wiring 384 and the gate electrode 303).

By connecting the wiring 452 of the TFT 401a of the logic circuit portion 391 and the gate electrode 303 through the wiring 384, an EDMOS circuit including the TFT 401a and the TFT 401b can be formed.

Embodiment 5

In this Embodiment, the protection circuits provided in a display device, which is an embodiment of the present invention, will be described with reference to the accompanying drawings. Examples of specific circuit structures of the protection circuits 134 to 136 of FIG. 2 in Embodiment 1 are described with reference to FIGS. 24A to 24E Although only a case of providing an n-type transistor will be described, the present invention is not limited thereto.

Figure 24A:
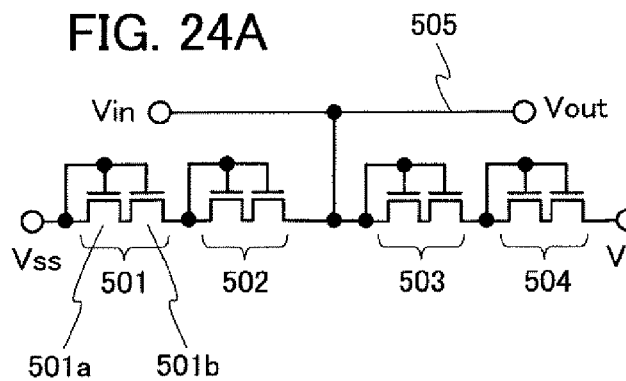
FIGS. 24A to 24F are equivalent circuit diagrams illustrating protection circuits which are applied to a display device according to an embodiment of the present invention.

A protection circuit illustrated in FIG. 24A includes protection diodes 501 to 504 each using a plurality of thin film transistors. The protection diode 501 includes an n-type thin film transistor 501a and an n-type thin film transistor 501b, which are connected in series. One of a source electrode and a drain electrode of the n-type thin film transistor 501a is connected to a gate electrode of the n-type thin film transistor 501a and a gate electrode of the n-type thin film transistor 501b and is kept at a potential $V_{ss}$. The other of the source electrode and the drain electrode of the n-type thin film transistor 501a is connected to one of a source electrode and a drain electrode of the n-type thin film transistor 501b. The other of the source electrode and the drain electrode of the n-type thin film transistor 501b is connected to the protection diode 502. Further, in a manner similar to the protection diode 501, the protection diodes 502 to 504 each include a plurality of thin film transistors connected in series, and an end of the plurality of thin film transistors connected in series is connected to gate electrodes of the plurality of thin film transistors.

Note that in the present invention, the number and polarity of the thin film transistors included in each of the protection diodes 501 to 504 are not limited to those illustrated in FIG. 24A. For example, the protection diode 501 may be formed including three thin film transistors connected in series.

The protection diodes 501 to 504 are sequentially connected in series, and a node between the protection diode 502 and the protection diode 503 is connected to a wiring 505. Note that the wiring 505 is a wiring electrically connected to a semiconductor element which is to be protected. Note that a wiring connected to the wiring 505 is not limited to the wiring between the protection diode 502 and the protection diode 503. That is, the wiring 505 may be connected between the protection diode 501 and the protection diode 502, or may be connected between the protection diode 503 and the protection diode 504.

One end of the protection diode 504 is kept at a power supply potential $V_{dd}$. In addition, each of the protection diodes 501 to 504 is connected so that a reverse bias voltage is applied thereto.

Figure 24B:
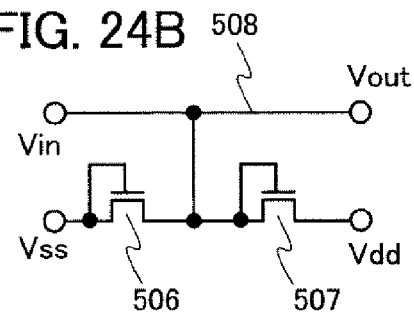

Note that the structure of the protection circuit illustrated in FIG. 24A can be changed as illustrated in FIG. 24B: the protection diodes 501 and 502 are replaced with a protection diode 506 and the protection diodes 503 and 504 are replaced with a protection diode 507.

Figure 24C:
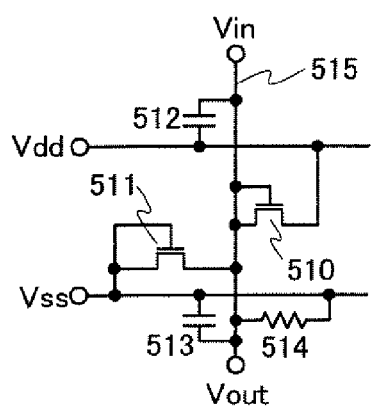

A protection circuit illustrated in FIG. 24C includes a protection diode 510, a protection diode 511, a capacitor 512, a capacitor 513, and a resistor 514. The resistor 514 is a resistor having two terminals. A potential $V_{in}$ is supplied to one of the terminals of the resistor 514 from a wiring 515. The potential $V_{ss}$ is supplied to the other of the terminals of the resistor 514. The resistor 514 is provided in order to make the potential of the wiring 515 $V_{ss}$ when the potential $V_{in}$ is not supplied, and the resistance value of the resistor 514 is set so as to be sufficiently larger than the wiring resistance of the wiring 515. A diode-connected n-type thin film transistor is used for each of the protection diode 510 and the protection diode 511.

Note that for the protection diodes illustrated in FIG. 24C, two or more thin film transistors may be connected in series.

Figure 24D:
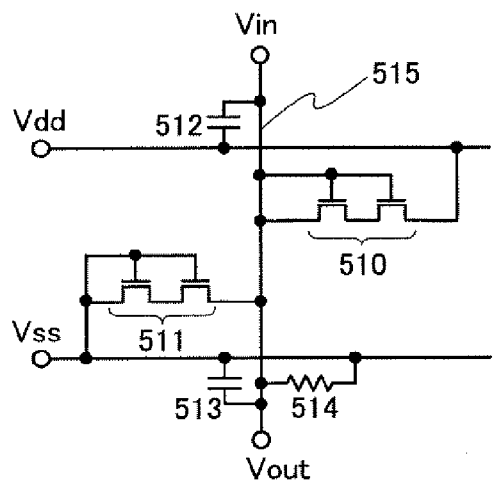

In a protection circuit illustrated in FIG. 24D, two n-type thin film transistors are used for each of the protection diode 510 and the protection diode 511.

Note that although diode-connected n-type thin film transistors are used for the protection diodes in the protection circuits illustrated in FIGS. 24C and 24D, this embodiment is not limited to this structure.

Figure 24E:
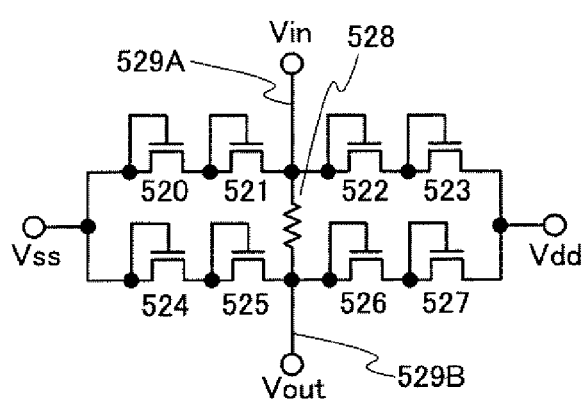

The protection circuit illustrated in FIG. 24E includes protection diodes 520 to 527 and a resistor 528. The resistor 528 is connected between a wiring 529A and a wiring 529B in series. A diode-connected n-type thin film transistor is used for each of the protection diodes 520 to 527.

The protection diode 520 and the protection diode 521 are connected in series, one end thereof is kept at the potential $V_{ss}$, and the other end thereof is connected to the wiring 529A of the potential $V_{in}$. The protection diode 522 and the protection diode 523 are connected in series, one end thereof is kept at the potential $V_{dd}$, and the other end thereof is connected to the wiring 529A of the potential $V_{in}$. The protection diode 524 and the protection diode 525 are connected in series, one end thereof is kept at the potential $V_{ss}$, and the other end thereof is connected to the wiring 529B of the potential $V_{out}$. The protection diode 526 and the protection diode 527 are connected in series, one end thereof is kept at the potential $V_{dd}$, and the other end thereof is connected to the wiring 5298 of the potential $V_{out}$.

Figure 24F:
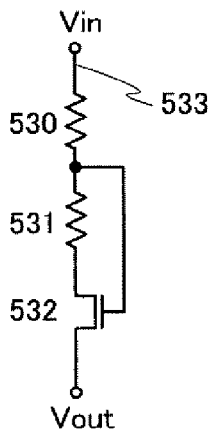

A protection circuit illustrated in FIG. 24F includes a resistor 530, a resistor 531, and a protection diode 532. Although a diode-connected n-type thin film transistor is used for the protection diode 532 in FIG. 24F, this embodiment is not limited to this structure. A plurality of diode-connected thin film transistors may be used. The resistor 530, the resistor 531, and the protection diode 532 are connected to a wiring 533 in series.

The resistor 530 and the resistor 531 can relieve a steep change in the potential of the wiring 533 and can prevent deterioration and damage of a semiconductor element. Further, the protection diode 532 can prevent a reverse bias current from flowing through the wiring 533 due to change in potential.

Note that when only the resistors are connected to the wiring in series, a steep change in the potential of the wiring can be relieved and deterioration and damage of a semiconductor element can be prevented. Further, only the protection diode is connected to the wiring in series, the protection diode can prevent a reverse bias current from flowing through the wiring due to change in potential.

Here, the case where the protection circuits illustrated in FIGS. 24A to 24F are operated is described. At this time, one of the electrodes of each of the protection diodes 501, 502, 506, 511, 520, 521, 524, and 525, which is kept at the potential $V_{ss}$, is a drain electrode, and the other electrode is a source electrode. One of the electrodes of each of the protection diodes 503, 504, 507, 510, 522, 523, 526, and 527, which is kept at the potential $V_{dd}$, is a source electrode, and the other electrode is a drain electrode. In addition, the threshold voltage of the thin film transistors included in the protection diodes is denoted by $V_{th}$.

Further, as for the protection diodes 501, 502, 506, 511, 520, 521, 524, and 525, when the potential $V_{in}$ is higher than the potential $V_{ss}$, a reverse bias voltage is applied thereto and current does not easily flow therethrough. Meanwhile, as for the protection diodes 503, 504, 507, 510, 522, 523, 526, and 527, when the potential $V_{in}$ is lower than the potential $V_{dd}$, a reverse bias voltage is applied thereto and current does not easily flow therethrough.

Here, operations of protection circuits in which a potential $V_{out}$ is set almost between the potential $V_{ss}$ and the potential $V_{dd}$ are described.

First, the case where the potential $V_{in}$ is higher than the potential $V_{dd}$ is described. When the potential $V_{in}$ is higher than the potential $V_{dd}$, the n-type thin film transistors are turned on when a potential difference between the gate electrodes and the source electrodes of the respective protection diodes 503, 504, 507, 510, 522, 523, 526, and 527 satisfies $V_{gs}=V_{in}-V_{dd}>V_{th}$. Here, since the case where $V_{in}$ is unusually high is assumed, the n-type thin film transistors are turned on. At this time, the n-type thin film transistors included in the protection diodes 501, 502, 506, 511, 520, 521, 524, and 525 are turned off. Then, the potentials of the wirings 505, 508, 515, 529A, and 529B become $V_{dd}$ through the protection diodes 503, 504, 507, 510, 522, 523, 526, and 527. Therefore, even when the potential $V_{in}$ is unusually higher than the potential $V_{dd}$ due to noise or the like, the potentials of the wirings 505, 508, 515, 529A, and 529B do not become higher than the potential $V_{dd}$.

On the other hand, in the case where the potential $V_{in}$ is lower than the potential $V_{ss}$, the n-type thin film transistors are turned on when a potential difference between the gate electrodes and the source electrodes of the respective protection diodes 501, 502, 506, 511, 520, 521, 524, and 525 satisfies $V_{gs}=V_{ss}-V_{in}>V_{th}$. Here, since the case where $V_{in}$ is unusually low is assumed, the n-type thin film transistors are turned on. At this time, the n-type thin film transistors included in the protection diodes 503, 504, 507, 510, 522, 523, 526, and 527 are turned off. Then, the potentials of the wirings 505, 508, 515, 529A, and 529B become $V_{ss}$ through the protection diodes 501, 502, 506, 511, 520, 521, 524, and 525. Therefore, even when the potential $V_{in}$ is unusually lower than the potential $V_{ss}$ due to noise or the like, the potentials of the wirings 505, 508, 515, 529A, and 529B do not become lower than the potential $V_{ss}$. Further, the capacitor 512 and the capacitor 513 reduce pulsed noise of the input potential $V_{in}$ and relieve a steep change in potential due to noise.

Note that when the potential $V_{in}$ is between $V_{ss}-V_{th}$ and $V_{dd}+V_{th}$, all the n-type thin film transistors included in the protection diodes are turned off, and the potential $V_{in}$ is outputted as the potential $V_{out}$.

When the protection circuits are provided as described above, the potentials of the wirings 505, 508, 515, 529A, and 529B are kept almost between the potential $V_{ss}$ and the potential $V_{dd}$. Therefore, the potentials of the wirings 505, 508, 515, 529A, and 529B can be prevented from deviating from this range greatly. That is, the potentials of the wirings 505, 508, 515, 529A, and 529B can be prevented from being unusually high or being unusually low, a circuit in the next stage of the protection circuits can be prevented from being damaged or deteriorating, and the circuit in the next stage can be protected.

Further, when the protection circuit including the resistor 514 is provided for an input terminal as illustrated in FIG. 24C, the potentials of all the wirings to which a signal is inputted can be kept constant (here the potential $V_{ss}$) when a signal is not inputted. That is, when a signal is not inputted, the protection circuit also has a function of a short-circuit ring capable of short-circuiting the wirings. Therefore, electrostatic discharge caused by a potential difference between the wirings can be prevented. In addition, since the resistance value of the resistor 514 is sufficiently larger than wiring resistance, a signal inputted to the wiring can be prevented from dropping to the potential $V_{ss}$ at the time of inputting the signal.

Here, as an example, the case is described in which n-type thin film transistors having a threshold voltage $V_{th}=0$ are used for the protection diode 501 and the protection diode 511 in FIG. 24C.

First, in the case of $V_{in}>V_{dd}$, the protection diode 510 is turned on because $V_{gs}=V_{in}-V_{dd}>0$ is satisfied. The protection diode 511 is turned off. Therefore, the potential of the wiring 515 becomes $V_{dd}$, so that $V_{out}=V_{dd}$ is satisfied.

On the other hand, in the case of $V_{in}<V_{ss}$, the protection diode 510 is turned off. The protection diode 511 is turned on because $V_{gs}=V_{ss}-V_{in}>0$ is satisfied. Therefore, the potential of the wiring 515 becomes $V_{ss}$ so that $V_{out}=V_{ss}$ is satisfied.

As described above even in the case of $V_{in}<V_{ss}$ or $V_{dd}<V_{in}$, operations can be performed in a range of $V_{ss}<V_{out}<V_{dd}$. Therefore, even in the case where $V_{in}$ is excessive or too low, $V_{out}$ can be prevented from being excessive or too low. Accordingly, even when the potential $V_{in}$ is lower than the potential $V_{ss}$ due to noise or the like, the potential of the wiring 515 does not become extremely lower than the potential V. Further, the capacitor 512 and the capacitor 513 reduce pulsed noise of the input potential $V_{in}$ and relieve a steep change in potential.

When the protection circuits are provided as described above, the potential of the wirings 515 is kept almost between the potential $V_{ss}$ and the potential $V_{dd}$. Therefore, the potential of the wiring 515 can be prevented from deviating from this range greatly, and a circuit in the next stage of the protection circuit (a circuit, an input portion of which is electrically connected to $V_{out}$) can be protected from being damaged or deteriorating. Further, when a protection circuit is provided for an input terminal, the potentials of all the wirings to which a signal is inputted can be kept constant (here, the potential $V_{ss}$) when a signal is not inputted. That is, when a signal is not inputted, the protection circuit also has a function of a short-circuit ring capable of short-circuiting the wirings. Therefore, electrostatic breakdown caused by a potential difference between the wirings can be prevented. In addition, since the resistance value of the resistor 514 is sufficiently large, a decrease in the potential of a signal inputted to the wiring 515 can be prevented at the time of inputting the signal.

Note that the protection circuit used in the present invention is not limited to the structures illustrated in FIGS. 24A to 24F, and the design of the protection circuit used in the present invention can be changed as appropriate as long as it has a circuit structure having a similar function.

As the protection diode included in the protection circuit of the present invention, a diode-connected thin film transistor can be used. By the use of the thin film transistor of the present invention for the protection circuit, the area occupied by the protection circuit can be reduced, so that the frame of the display device can be narrowed and the display device can be downsized and have higher performance.

Embodiment 6

In this Embodiment, a terminal portion of the display device of the present invention will be described with reference to FIGS. 25A to 25D.

Figure 25A:
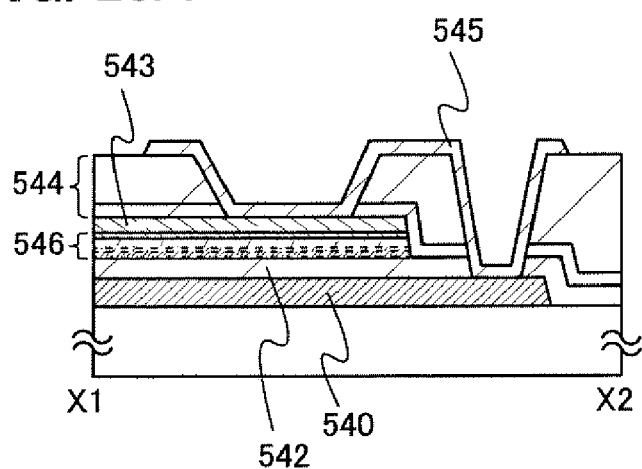
FIGS. 25A to 25D are views each illustrating a terminal portion of a display device according to an embodiment of the present invention.
Figure 25B:
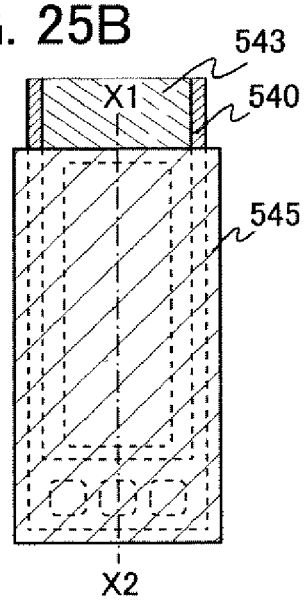

FIGS. 25A and 25B illustrate a cross-sectional view and a top view of a gate wiring terminal portion, respectively. FIG. 25A corresponds to a cross-sectional view taken along the line X1 to X2 in FIG. 25B. In FIG. 25A, a transparent conductive layer 545 stacked over a protective insulating layer 544 is a terminal electrode which functions as an input terminal. Further, in the terminal portion in FIG. 25A, a first terminal 540 which is formed with the same material as the gate wiring and a connection electrode 543 which is formed with the same material as a source wiring overlap with a gate insulating layer 542 interposed therebetween, and the first terminal 540 and the connection electrode 543 are connected (at least electrically) through a transparent conductive layer 545. A semiconductor layer 546 (an intrinsic semiconductor layer and a semiconductor layer including an impurity element imparting one conductivity type) is provided between the gate insulating layer 542 and the connection electrode 543.

Figure 25C:
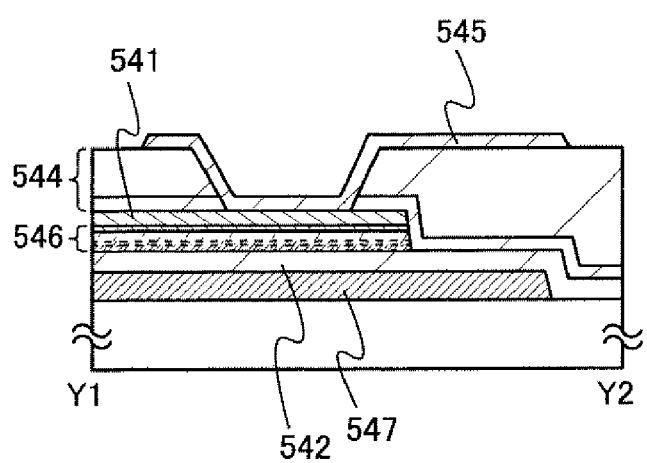
Figure 25D:
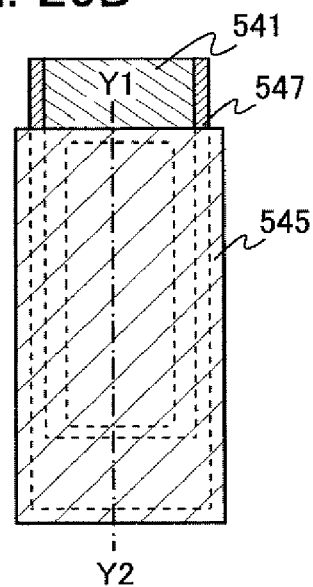

FIG. 25C and FIG. 25D illustrate a cross-sectional view and a top view of a source wiring terminal portion, respectively. FIG. 25C corresponds to a cross-sectional view taken along the line Y1 to Y2 in FIG. 25D. In FIG. 25C, the transparent conductive layer 545 stacked over the protective insulating layer 544 is a terminal electrode which functions as an input terminal. Further, in the terminal portion in FIG. 25C, a second terminal 541 which is (at least electrically) connected to the source wiring and an electrode 547 which is formed with the same material as the gate wiring overlap with the gate insulating layer 542 interposed therebetween. The electrode 547 is not connected to the second terminal 541 directly or electrically, and if the electrode 547 is set at a potential different from the second terminal 541, for example, floating, GND, or 0 V, capacitance for reducing noise or capacitance for preventing static electricity can be formed. The second terminal 541 is (at least electrically) connected to the transparent conductive layer 545. The semiconductor layer 546 (an intrinsic semiconductor layer and a semiconductor layer including an impurity element imparting one conductivity type) is provided between the gate insulating layer 542 and the second terminal 541.

A plurality of gate wirings, source wirings, and capacitor wirings are provided depending on the pixel density. In the terminal portion, the plurality of the first terminals at the same potential as the gate wiring, the second terminals at the same potential as the source wiring, and the third terminals at the same potential as the capacitor wiring are arranged. Each number of gate wirings, source wirings, and capacitor wirings may be determined as appropriate by a practitioner.

The terminal portion described in this Embodiment and an FPC terminal portion are connected through an anisotropic conductive paste or the like. Accordingly, signals and electric power can be supplied from outside.

Note that although FIGS. 25A to 25D show the case where the terminal portion is manufactured using a half-tone mask, the present invention is not limited to this case as described above. FIGS. 26A to 26D show the case where the terminal portion is manufactured without using a half-tone mask.

Figure 26A:
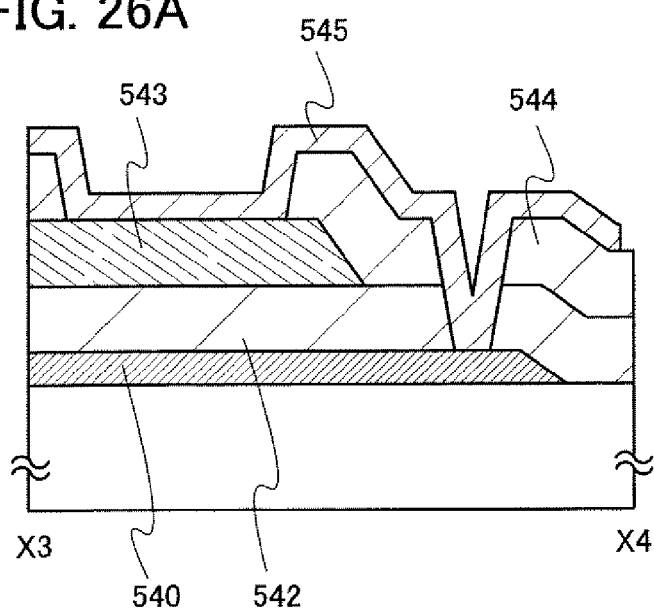
FIGS. 26A to 26D are views each illustrating a terminal portion of a display device according to an embodiment of the present invention.
Figure 26B:
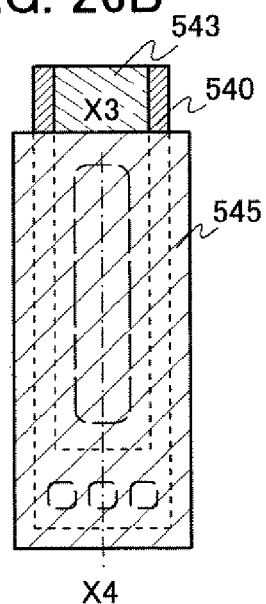

FIG. 26A and FIG. 26B illustrate a cross-sectional view and a top view of a gate wiring terminal portion, respectively, which is manufactured without using a half-tone mask. FIG. 26A corresponds to a cross-sectional view taken along the line X3 to X4 in FIG. 26B. In FIG. 26A, the transparent conductive layer 545 over the protective insulating layer 544 is a terminal electrode that functions as an input terminal. Further, in the terminal portion in FIG. 26A, the first terminal 540 which is formed with the same material as the gate wiring and the connection electrode 543 which is formed with the same material as the source wiring overlap with the gate insulating layer 542 interposed therebetween, and the first terminal 540 and the connection electrode 543 are connected (at least electrically) through the transparent conductive layer 545. The connection electrode 543 is provided on the gate insulating layer 542. FIG. 26A and FIG. 26B show a structure in which a semiconductor layer is not provided.

Figure 26C:
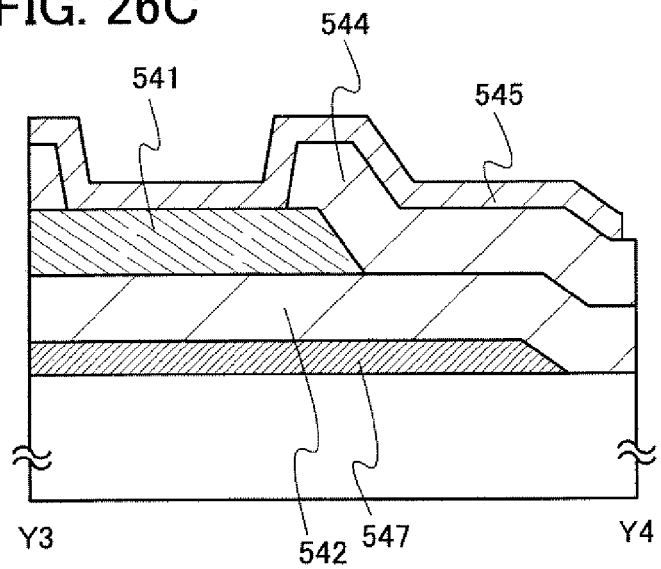
Figure 26D:
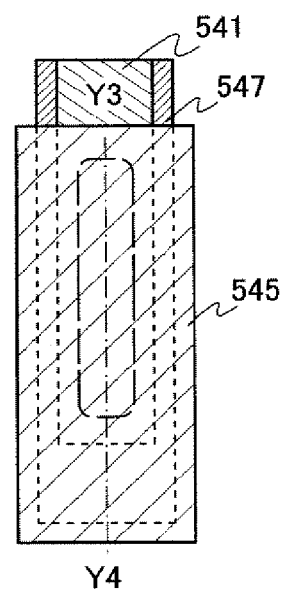

FIG. 26C and FIG. 26D illustrate a cross-sectional view and a top view of a source wiring terminal portion, respectively, which is manufactured without using a half-tone mask. FIG. 26C corresponds to a cross-sectional view taken along the line Y3 to Y4 in FIG. 26D. In FIG. 26C, the transparent conductive layer 545 over the protective insulating layer 544 is a terminal electrode that functions as an input terminal. Further, in the terminal portion in FIG. 26C, the second terminal 541 which is (at least electrically) connected to the source wiring and the electrode 547 which is formed with the same material as the gate wiring overlap with the gate insulating layer 542 interposed therebetween. The electrode 547 is not connected to the second terminal 541, and if the electrode 547 is set at a potential different from the second terminal 541, for example, floating, GND, or 0 V, capacitance for reducing noise or capacitance for preventing static electricity can be formed. The second terminal 541 is connected to the transparent conductive layer 545. The second terminal 541 is provided on the gate insulating layer 542. FIG. 26C and FIG. 26D show a structure in which a semiconductor layer is not provided. That is, the terminal portions illustrated in FIGS. 26A to 26D each have a structure without a semiconductor layer.

Embodiment 7

Next, an embodiment of a display panel or a light-emitting panel, which is incorporated in the liquid crystal display device and the light-emitting display device described in the above-mentioned embodiments, will be described with reference to the accompanying drawings (cross-sectional views).

Figure 27A:
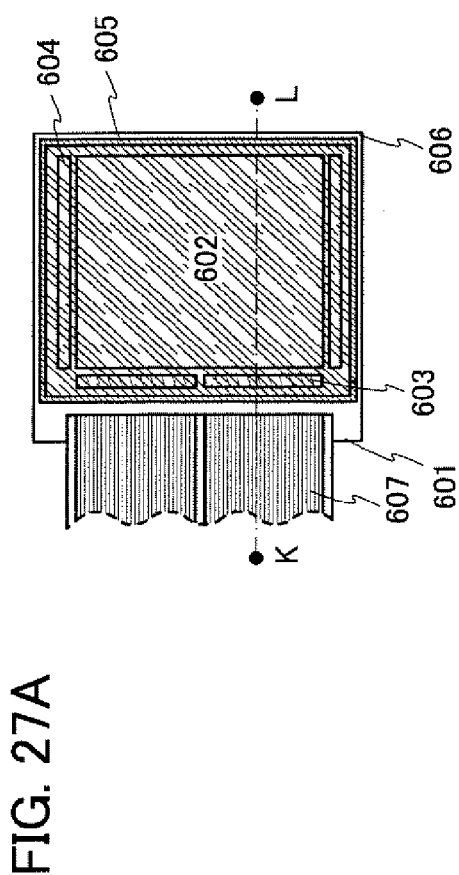
FIGS. 27A and 27B are a top view and a cross-sectional view, respectively, which illustrate an example of a liquid crystal display device according to an embodiment of the present invention.
Figure 27B:
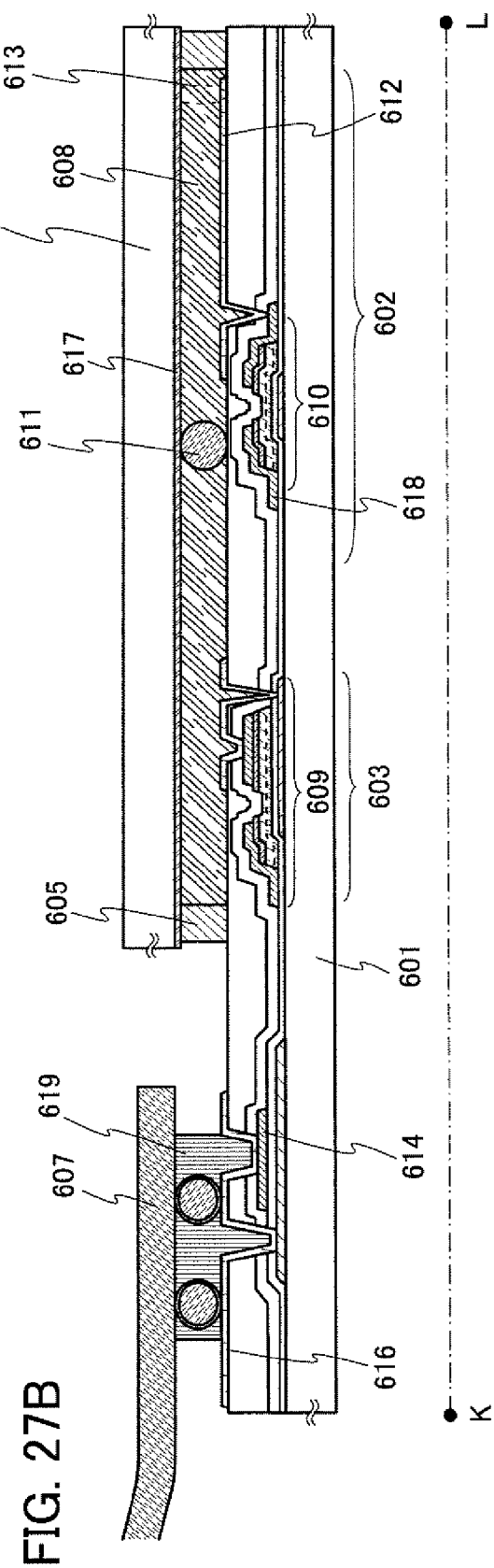

The appearance of the liquid crystal display device and the light-emitting display device which are one embodiment of the present invention is described with reference to FIGS. 27A and 27B and FIGS. 28A and 28B. FIG. 27A is a top view of a liquid crystal display panel, in which a thin film transistor 610 having a microcrystalline semiconductor layer and a liquid crystal element 613 which are formed over a first substrate 601 are sealed between the first substrate 601 and a second substrate 606 with a sealant 605. FIG. 27B is a cross-sectional view taken along the line K-L in FIG. 27A.

Each pixel of the liquid crystal display device includes a liquid crystal element. A liquid crystal element is an element that controls transmission or non-transmission of light by optical modulation action of a liquid crystal and includes a pair of electrodes and a liquid crystal. The optical modulation action of a liquid crystal is controlled by an electric filed applied to the liquid crystal (including a horizontal electric field, a vertical electric field, and an oblique electric field). Note that the following can be used for a liquid crystal element and a driving mode of the liquid crystal element: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a ferroelectric liquid crystal, an anti-ferroelectric liquid crystal, a main chain type liquid crystal, a side chain type high-molecular liquid crystal, a plasma address liquid crystal (PALC), a banana-shaped liquid crystal; a TN (Twisted Nematic) mode, an STN (Super Twisted Nematic) mode, an IPS (In-Plane-Switching) mode, an FFS (Fringe Field Switching) mode, an MVA (Multi-domain Vertical Alignment) mode, a PVA (Patterned Vertical Alignment), an ASV (Advanced Super View) mode, an ASM (Axially Symmetric aligned Micro-cell) mode, an OCB (Optical Compensated Birefringence) mode, an ECB (Electrically Controlled Birefringence) mode, an FLC (Ferroelectric Liquid Crystal) mode, an AFLC (Anti Ferroelectric Liquid Crystal) mode, a PDLC (Polymer Dispersed Liquid Crystal) mode, and a guest host mode. Note that the present invention is not limited thereto, and various kinds of liquid crystal elements can be used.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at greater than or equal to 5 wt % so as to improve the temperature range is used for the liquid crystal layer. The liquid crystal composition which includes liquid crystal exhibiting a blue phase and a chiral agent have such characteristics that the response time is 10 μs to 100 μs, which is short, the alignment process is unnecessary because the liquid crystal composition has optical isotropy, and viewing angle dependency is small.

The sealant 605 is provided so as to surround a pixel portion 602 and a scan line driver circuit 604 which are provided over the first substrate 601. The second substrate 606 is provided over the pixel portion 602 and the scan line driver circuit 604. Thus, the pixel portion 602 and the scan line driver circuit 604 are sealed together with a liquid crystal layer 608 by the first substrate 601, the sealant 605, and the second substrate 606. A signal line driver circuit 603 is provided in a region over the first substrate 601, which is surrounded by the sealant 605. Note that the signal line driver circuit 603 may be formed with thin film transistors having a polycrystalline semiconductor layer formed over a separately prepared substrate. Note that the signal line driver circuit 603 may be formed with transistors using a single-crystal semiconductor and attached to the first substrate 601.

The pixel portion 602 formed over the first substrate 601 includes a plurality of thin film transistors, and in FIG. 27B, the thin film transistor 610 included in the pixel portion 602 is exemplified. The scan line driver circuit 604 also includes a plurality of thin film transistors, and in FIG. 27B, a thin film transistor 609 included in the signal line driver circuit 603 is exemplified. The thin film transistor 610 corresponds to a thin film transistor using a microcrystalline semiconductor layer.

A pixel electrode 612 included in the liquid crystal element 613 is electrically connected to the thin film transistor 610 through a wiring 618. Further, the wiring 618 is electrically connected to a lead wiring 614. A counter electrode 617 of the liquid crystal element 613 is formed on the second substrate 906. A portion where the pixel electrode 612, the counter electrode 617, and the liquid crystal layer 608 overlap with each other corresponds to the liquid crystal element 613.

Note that as a material of each of the first substrate 601 and the second substrate 606, glass, metal (typically stainless steel), ceramics, plastics, or the like can be used. As plastics, an FRP (fiberglass-reinforced plastics) plate, a PVF (polyvinyl fluoride) film, a polyester film, an acrylic resin film, or the like can be used. Alternatively, a sheet in which aluminum foil is interposed between PVF films or polyester films may be used.

A spacer 611 is a bead spacer and is provided for controlling a distance (a cell gap) between the pixel electrode 612 and the counter electrode 617 to be constant. Note that a spacer obtained by selectively etching an insulating layer (a post spacer) may be used instead of the spacer 611 that is a bead spacer.

A variety of signals (potentials) supplied to the signal line driver circuit 603, the scan line driver circuit 604, and the pixel portion 602 are supplied from an FPC (flexible printed circuit) 607 through the lead wiring 614.

In this Embodiment, a connection terminal 616 is formed using the same conductive layer as the pixel electrode 612 included in the liquid crystal element 613. Further, the lead wiring 614 is formed using the same conductive layer as the wiring 618.

The connection terminal 616 is electrically connected to a terminal included in the FPC 607 through an anisotropic conductive layer 619.

Note that although not illustrated, the liquid crystal display device illustrated in this Embodiment includes alignment films and polarizing plates, and may further include a color filter, a light-shielding layer or the like.

An optical film such as a polarizing plate, a circular polarizing plate (including an elliptical polarizing plate), a retardation plate (a λ/4 plate, a λ/2 plate), or a color filter may be provided as appropriate over a light-emitting surface of the light-emitting element. Further, an anti-reflection layer may be provided over a polarizing plate or a circularly polarizing plate.

Figure 28A:
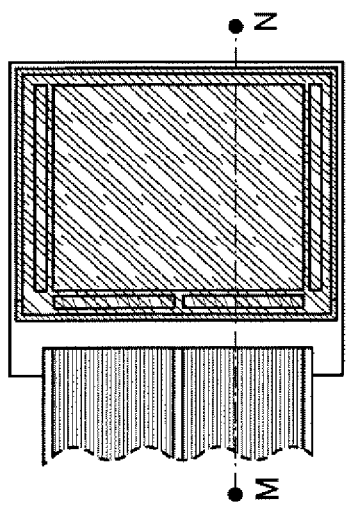
FIGS. 28A and 28B are a top view and a cross-sectional view, respectively, which illustrate an example of a light-emitting display device according to an embodiment of the present invention.
Figure 28B:
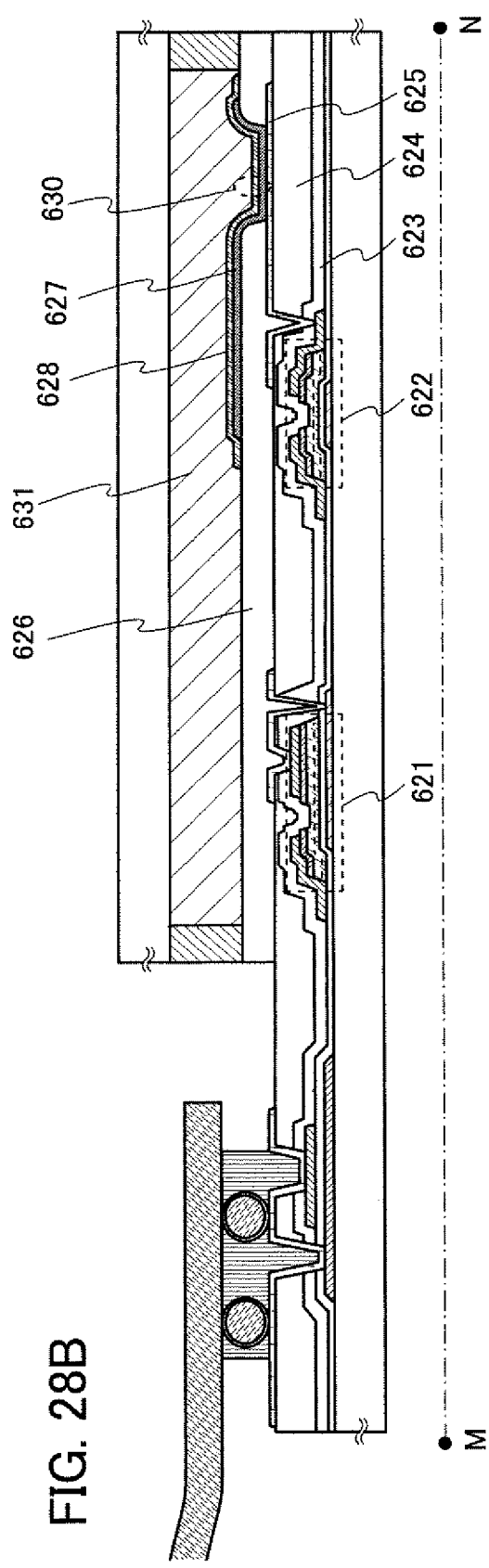

FIGS. 28A and 28B illustrate an example of the light-emitting device that is an embodiment of the present invention. Note that only the portions that are different from those in FIGS. 27A and 27B are denoted by reference numerals. A light-emitting element utilizing electroluminescence is used for the light-emitting device. Light-emitting elements utilizing electroluminescence are classified according to whether a light-emitting material is an organic compound or an inorganic compound. In general, the former is referred to as organic EL elements and the latter as inorganic EL elements.

In an organic EL element, when voltage is applied to a light-emitting element, carriers (electrons and holes) are injected from a pair of electrodes into a layer containing a light-emitting organic compound, and current flows therein. Then, recombination of these carriers (the electrons and holes) allows the light-emitting organic compound to form an excited state and to emit light when the carriers in the organic compound return from the excited state to a ground state. Due to such a mechanism, such a light-emitting element is referred to as a current-excitation type light-emitting element.

Inorganic EL elements are classified into a dispersion type inorganic EL element and a thin-film type inorganic EL element depending on their element structures. A dispersion type inorganic EL element has a light-emitting layer where particles of a light-emitting material are dispersed in a binder, and its light emission mechanism is donor-acceptor recombination type light emission, which utilizes a donor level and an acceptor level. A thin-film type inorganic EL element has a structure where a light-emitting layer is sandwiched between dielectric layers, which are further sandwiched between a pair of electrodes, and its light emission mechanism is localized type light emission which utilizes inner-shell electron transition of metal ions.

Note that here, an organic EL element is used as a light-emitting element. In addition, a thin film transistor formed according to any of the methods of the above-described embodiments is used as a thin film transistor that controls driving of a light-emitting element.

First, thin film transistors 621 and 622 are formed over the substrate. An insulating layer that functions as a protective layer is formed over the thin film transistors 621 and 622. The insulating layer is preferably formed by stacking an insulating layer 623 that is formed with an inorganic material and an insulating layer 624 that is formed with an organic material, and the top surface of the insulating layer is preferably flattened using the insulating layer that is formed with an organic material. Here, as examples of an inorganic material, silicon oxide, silicon nitride, and silicon oxynitride are given. As examples of an organic material, an organic resin such as acrylic, polyimide, or polyamide, and siloxane are given.

A conductive layer is formed over the insulating layer 624 that is formed with an organic material. This conductive layer is denoted by a first conductive layer 625. The first conductive layer 625 functions as a pixel electrode. In the case where the thin film transistor of a pixel is an n-type thin film transistor, it is preferable to form a cathode as the pixel electrode. On the other hand, in the case where the thin film transistor is a p-type thin film transistor, it is preferable to form an anode as the pixel electrode. Specifically, in the case where a cathode serves as a pixel electrode, a material with low work function, such as Ca, Al, MgAg, or AlLi, may be used.

Next, a partition 626 is formed on a side face (an end portion) of the first conductive layer 625 and over the insulating layer 624 that is formed with an organic material. The partition 626 has an opening portion and the first conductive layer 625 is exposed through the opening portion. The partition 626 is formed with an organic resin layer, an inorganic insulating layer, or organic polysiloxane. More preferably, the partition 626 is formed using a photosensitive material, and the partition 626 over the first conductive layer 625 is exposed to light so that an opening portion is formed. In this case, a sidewall of the opening portion is preferably formed as a tilted surface with continuous curvature.

Next, a light-emitting layer 627 is formed so as to be in contact with the first conductive layer 625 in the opening portion of the partition 626. The light-emitting layer 627 may be formed with either a single-layer structure or a stacked structure of a plurality of layers.

Then, a second conductive layer 628 is formed so as to cover the light-emitting layer 627. The second conductive layer 628 is referred to as a common electrode. In the case where the first conductive layer 625 is formed using a material for a cathode, the second conductive layer 628 is formed using a material for an anode. The second conductive layer 628 can be formed of a light-transmitting conductive layer using the light-transmitting conductive materials. As the second conductive layer 628, a titanium nitride layer or a titanium layer may be used. Here, indium tin oxide (ITO) is used for the second conductive layer 628. In the opening portion of the partition 626, a light-emitting element 630 is formed by overlapping of the first conductive layer 625, the light-emitting layer 627, and the second conductive layer 628. After that, it is preferable to form a protective layer over the partition 626 and the second conductive layer 627 so that oxygen, hydrogen, moisture, carbon dioxide, and the like cannot enter the light-emitting element 630. As the protective layer, a silicon nitride layer, a silicon nitride oxide layer, a DLC layer, or the like can be used. More preferably, packaging (encapsulation) is performed using a protective film (an ultraviolet curable resin film, or the like) or a cover material, which has high airtightness and causes less degassing so as to prevent exposure to air.

It is acceptable as long as the light-emitting element 630 has a transparent electrode for at least one of an anode and a cathode in order to extract light emission. There are light-emitting elements having the following structures: a top emission structure where the thin film transistors 621 and 622 and the light-emitting element 630 are formed over a substrate and light is extracted from a side opposite to the substrate; a bottom emission structure where light is extracted from the substrate side; and a dual emission structure where light is extracted from both the substrate side and the side opposite to the substrate. The light-emitting device that is an embodiment of the present invention can employ a light-emitting element with any of the above-mentioned emission structures.

In the light-emitting element 630 of the top emission structure, a light-emitting layer and an anode are sequentially stacked over the cathode. The cathode may be formed using a conductive material that has a low work function and can reflect light (for example, Ca, Al, MgAg, or AlLi). In the case where the light-emitting layer is formed using a plurality of layers, for example, an electron injection layer, an electron transport layer, a light-emitting layer, a hole transport layer, and/or a hole injection layer are stacked in that order over the cathode. Note that all these layers are not necessarily provided. The anode is formed using a light-transmitting conductive material which transmits light, and for example, a light-transmitting conductive layer of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like may be used. Light generated from the light-emitting layer is emitted to the anode side.

In the light-emitting element 630 of the bottom emission structure, a light-emitting layer and an anode are sequentially stacked over the cathode. Note that in the case where the anode has a light-transmitting property, a light-shielding layer for reflecting or shielding light may be formed so as to cover the anode. In a manner similar to the case of the top emission structure, the cathode may be a conductive layer formed using a material having a low work function, and a known material can be used therefor. Note that the thickness is set so that light can be transmitted therethrough (preferably about 5 nm to 30 nm). For example, aluminum having a thickness of 20 nm can be used as the cathode. In a manner similar to the case of the top emission structure, the light-emitting layer may be formed using either a single-layer structure or a stacked structure of a plurality of layers. Although the anode does not need to transmit light, the anode can be formed using a light-transmitting conductive material in a manner similar to that of the case of the top emission structure. The light-shielding layer can be formed using, for example, a metal layer that reflects light or a resin to which a black pigment is added. Light generated from the light-emitting layer is emitted to the cathode side.

In addition, a pixel electrode included in the light-emitting element 630 is electrically connected to a source electrode or a drain electrode of the thin film transistor 622 through a wiring. In addition, in this Embodiment, a common electrode of the light-emitting element 630 and a light-transmitting conductive material layer are electrically connected.

Note that the structure of the light-emitting element 630 is not limited to the structure shown in this Embodiment. The structure of the light-emitting element 630 can be changed as appropriate in accordance with a direction of light extracted from the light-emitting element 630, polarity of the thin film transistor 622, or the like.

Note that in the case where the light-emitting element 630 has the top emission structure, the second substrate that is in a direction from which light from the light-emitting element 630 is extracted should have a light-transmitting property. In this case, a substrate formed of a light-transmitting material such as a glass substrate, a plastic substrate, a polyester film, or an acrylic film is used.

As a filler 631 that is provided between the two substrate, an inert gas such as nitrogen or argon, an ultraviolet curable resin, a thermosetting resin, or the like can be used. For example, PVC (polyvinyl chloride), acrylic, polyimide, an epoxy resin, a silicone resin, PVB (polyvinyl butyral), or EVA (ethylene vinyl acetate) can be used. Here, for example, nitrogen may be used as the filler.

Note that although the example in which the thin film transistor 622 (the driving transistor) which controls driving of the light-emitting element 630 is directly connected to the light-emitting element is described in this Embodiment, a thin film transistor for controlling current may be connected between the driving thin film transistor and the light-emitting element.

Note that the light-emitting device described in this Embodiment is not limited to the structures that are illustrated in the drawings, and can be modified in various ways based on the technical idea.

This Embodiment can be combined with any of the structures described in other embodiments.

Embodiment 8

A semiconductor device including the thin film transistor according to the present invention can be applied to a variety of electronic appliances (including game machines). As the electronic appliances, for example, there are a television device (also called a TV or a television receiver), a monitor for a computer, electronic paper, a digital camera, a digital video camera, a digital photo frame, a cellular phone (also called a mobile phone or a portable telephone device), a portable game machine, a portable information terminal, an audio playback device, and a large game machine such as a pachinko machine.

A semiconductor device including the thin film transistor according to the present invention can be applied to electronic paper. Electronic paper can be used for electronic appliances of every field for displaying information. For example, electronic paper can be used for electronic books (e-book), posters, advertisement in vehicles such as trains, or display in a variety of cards such as credit cards. Examples of such electronic appliances are illustrated in FIGS. 29A to 29D.

Figure 29A:
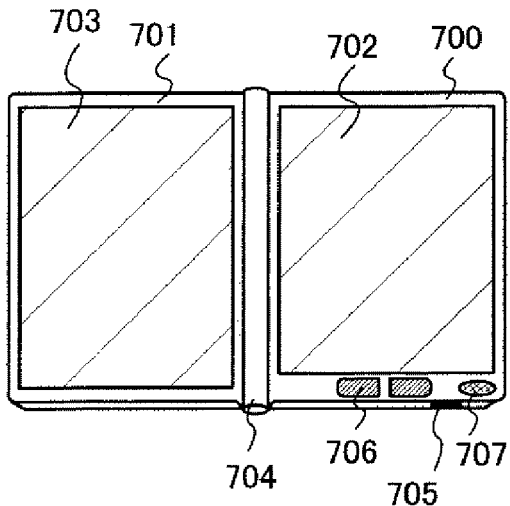
FIGS. 29A to 29D are diagrams each illustrating an example of electronic devices to which an embodiment of the present invention is applied.

FIG. 29A illustrates an example of an electronic book. The electronic book illustrated in FIG. 29A includes two housings, a housing 700 and a housing 701. The housing 700 and the housing 701 are combined with each other by a hinge 704 so that the electronic book can be opened and closed. With such a structure, operation as a paper book can be achieved.

A display portion 702 is incorporated in the housing 700 and a display portion 703 is incorporated in the housing 701. The display portion 702 and the display portion 703 may display a series of images, or may display different images. In the structure where different images are displayed in different display portions, for example, the right display portion (the display portion 702 in FIG. 29A) displays text and the left display portion (the display portion 703 in FIG. 29A) displays images.

FIG. 29A illustrates an example in which the housing 700 is provided with an operation portion and the like. For example, the housing 700 is provided with a power supply input terminal 705, an operation key 706, a speaker 707, and the like. The page can be turned with the operation key 706. Note that a keyboard, a pointing device, and the like may be provided on the same plane as the display portion of the housing. Further, a rear surface or a side surface of the housing may be provided with an external connection terminal (an earphone terminal, a USB terminal, a terminal that can be connected to a variety of cables such as a USB cable, and the like), a recording medium inserting portion, or the like. Moreover, the electronic book illustrated in FIG. 29A may have a function of an electronic dictionary.

Further, the electronic book illustrated in FIG. 29A may be configured to send and receive information wirelessly. Desired book data can be purchased and downloaded from an electronic book server by wireless communication.

Figure 29B:
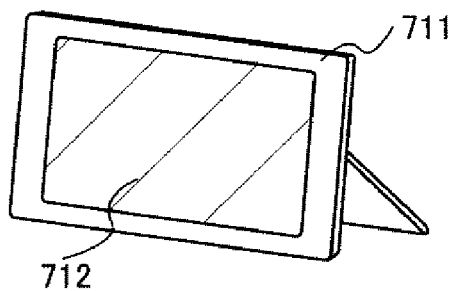

FIG. 29B illustrates an example of a digital photo frame. For example, a display portion 712 is incorporated in a housing 711 of the digital photo frame illustrated in FIG. 29B. The display portion 712 can display a variety of images. For example, the display portion 712 can display data of an image taken with a digital camera or the like, so that the digital photo frame can function in a manner similar to a normal photo frame.

Note that the digital photo frame in FIG. 29B is provided with an operation portion, an external connection terminal (a USB terminal, a terminal which can be connected to a variety of cables such as a USB cable, and the like), a recording medium inserting portion, and the like. These elements may be incorporated on the same plane as the display portion; however, they are preferably provided on the side surface or rear surface of the display portion to improve the design of the digital photo frame. For example, a memory including image data taken with a digital camera is inserted into the recording medium inserting portion of the digital photo frame and the image data is imported. Then, the imported image data can be displayed in the display portion 712.

The digital photo frame in FIG. 29B may be configured to send and receive information wirelessly. In this case, desired image data can be wirelessly imported into the digital photo frame and can be displayed therein.

Figure 29C:
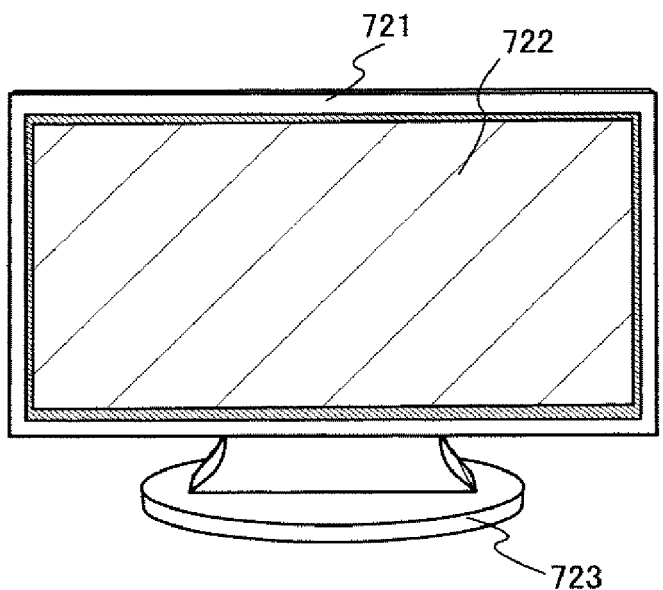

FIG. 29C illustrates an example of a television device. A display portion 722 is incorporated in a housing 721 of the television device in FIG. 29C. The display portion 722 can display images. Here, the housing 721 is supported by a stand 723. The display device shown in Embodiment 7 can be applied to the display portion 722.

The television device illustrated in FIG. 29C can be operated by an operation switch of the housing 721 or a separate remote controller. The channel and volume can be controlled with operation keys of the remote controller and the images displayed in the display portion 722 can be controlled. Moreover, the remote controller may have a display portion in which the information outgoing from the remote controller is displayed.

Note that the television device illustrated in FIG. 29C is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 29D:
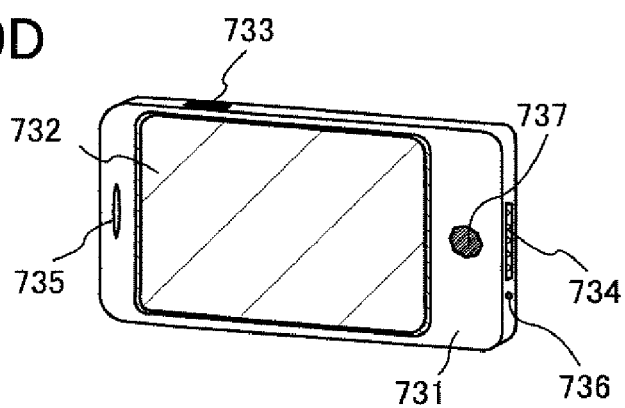

FIG. 29D illustrates an example of a cellular phone. The cellular phone in FIG. 29D includes a housing 731 in which a display portion 732 is incorporated, and further, includes an operation button 733, an operation button 737, an external connection port 734, a speaker 735, a microphone 736, and the like.

A display portion 732 of the cellular phone in FIG. 29D is a touch panel, and display contents of the display portion 732 can be operated by touching with a finger or the like. Further, making a call or text messaging can be performed by touching the display portion 732 with a finger or the like.

There are mainly three screen modes of the display portion 732. The first mode is a display mode mainly for displaying an image. The second mode is an input mode mainly for inputting information such as text. The third mode is a display-and-input mode in which two modes of the display mode and the input mode are mixed.

For example, in the case of making a call or text messaging, the display portion 732 is set to a text input mode where text input is mainly performed, and text input operation can be performed on a screen. In this case, it is preferable to display a keyboard or number buttons on almost the entire screen of the display portion 732.

When a detection device including a sensor for detecting inclination, such as a gyroscope or an acceleration sensor, is provided inside the cellular phone illustrated in FIG. 29D, display information of the display portion 732 can be automatically switched by judging the direction of the cellular phone (whether the cellular phone is placed horizontally or vertically for a landscape mode or a portrait mode).

Further, the screen modes are switched by touching the display portion 732 or operating the operation button 737 of the housing 731. Alternatively, the screen modes can be switched depending on kinds of images displayed in the display portion 732. For example, when a signal for an image displayed in the display portion is data of moving images, the screen mode can be switched to the display mode. When the signal is text data, the screen mode can be switched to the input mode.

Further, in the input mode, when input by touching the display portion 732 is not performed within a specified period while a signal detected by an optical sensor in the display portion 732 is detected, the screen mode may be controlled to be switched from the input mode to the display mode.

The display portion 732 can also function as an image sensor. For example, an image of a palm print, a fingerprint, or the like is taken by touching the display portion 732 with the palm or the finger, whereby personal authentication can be performed. Further, when a backlight that emits near-infrared light or a sensing light source that emits near-infrared light is provided in the display portion, a finger vein, a palm vein, or the like can be taken.

This Embodiment can be combined with any of the structures described in other embodiments as appropriate.

This application is based on Japanese Patent Application serial no. 2008-252418 filed with Japan Patent Office on Sep. 30, 2008, the entire contents of which are hereby incorporated by reference.

What is claimed is:

1. A display device comprising:
 a driver circuit portion including a logic circuit portion and a switch portion; and
 a pixel portion,
 wherein the pixel portion includes a first inverted staggered thin film transistor and a pixel electrode electrically connected to the first inverted staggered thin film transistor,
 wherein the switch portion includes a second inverted staggered thin film transistor in which a microcrystalline semiconductor is used,
 wherein the logic circuit portion includes an inverter circuit including a third inverted staggered thin film transistor and a fourth inverted staggered thin film transistor,
 wherein the first to fourth inverted staggered thin film transistors have the same polarity, and
 wherein the second inverted staggered thin film transistor comprises a first insulating layer, the microcrystalline semiconductor, and a second insulating layer interposed between a first gate electrode and a second gate electrode.

2. The display device according to claim 1, wherein the third inverted staggered thin film transistor comprises a third insulating layer, a semiconductor layer, and a fourth insulating layer between a third gate electrode and a fourth gate electrode.

3. The display device according to claim 1, wherein the third inverted staggered thin film transistor is a depletion type thin film transistor.

4. The display device according to claim 3, wherein the third inverted staggered thin film transistor includes a channel formation region using a microcrystalline semiconductor layer including an impurity element serving as a donor.

5. The display device according to claim 1, wherein the third inverted staggered thin film transistor is an enhancement type thin film transistor.

6. The display device according to claim 5, wherein the third inverted staggered thin film transistor includes a channel formation region using a microcrystalline semiconductor layer including an impurity element serving as an acceptor.

7. The display device according to claim 1,
 wherein each of the first to fourth inverted staggered thin film transistors includes a gate insulating layer, a first semiconductor layer, between a source region and a drain region, which is in contact with the gate insulating layer, and a second semiconductor layer which is in contact with the first semiconductor layer,
wherein the first semiconductor layer is formed using a microcrystalline semiconductor layer, and
wherein the second semiconductor layer includes a microcrystalline semiconductor region and an amorphous semiconductor region.

8. The display device according to claim 7, wherein a cross-sectional shape of the microcrystalline semiconductor region is conical or pyramidal.

9. The display device according to claim 1,
wherein the inverter circuit is an EDMOS circuit.

10. The display device according to claim 1, wherein the driver circuit portion further includes a buffer portion.

11. A display device comprising:
a driver circuit portion including a logic circuit portion and a switch portion; and
a pixel portion,
wherein the pixel portion includes a first inverted staggered thin film transistor and a pixel electrode electrically connected to the first inverted staggered thin film transistor,
wherein the switch portion includes a second inverted staggered thin film transistor in which a microcrystalline semiconductor is used,
wherein the logic circuit portion includes an inverter circuit including a third inverted staggered thin film transistor and a fourth inverted staggered thin film transistor,
wherein the first to fourth inverted staggered thin film transistors have the same polarity, and
wherein the second inverted staggered thin film transistor includes an impurity element serving as a donor in a channel formation region.

12. The display device according to claim 11, wherein the third inverted staggered thin film transistor comprises a first insulating layer, a semiconductor layer, and a second insulating layer between a first gate electrode and a second gate electrode.

13. The display device according to claim 11, wherein the third inverted staggered thin film transistor is a depletion type thin film transistor.

14. The display device according to claim 13, wherein the third inverted staggered thin film transistor includes a channel formation region using a microcrystalline semiconductor layer including an impurity element serving as a donor.

15. The display device according to claim 11, wherein the third inverted staggered thin film transistor is an enhancement type thin film transistor.

16. The display device according to claim 15, wherein the third inverted staggered thin film transistor includes a channel formation region using a microcrystalline semiconductor layer including an impurity element serving as an acceptor.

17. The display device according to claim 1
wherein each of the first to fourth inverted staggered thin film transistors includes a gate insulating layer, a first semiconductor layer, between a source region and a drain region, which is in contact with the gate insulating layer, and a second semiconductor layer which is in contact with the first semiconductor layer,
wherein the first semiconductor layer is formed using a microcrystalline semiconductor layer, and
wherein the second semiconductor layer includes a microcrystalline semiconductor region and an amorphous semiconductor region.

18. The display device according to claim 17, wherein a cross-sectional shape of the microcrystalline semiconductor region is conical or pyramidal.

19. The display device according to claim 11,
wherein the inverter circuit is an EDMOS circuit.

20. The display device according to claim 11, wherein the driver circuit portion further includes a buffer portion.

21. A display device comprising:
a driver circuit portion including a logic circuit portion and a switch portion;
a pixel portion; and
a protection circuit configured to transfer charge to a common wiring when a surge voltage is applied,
wherein the pixel portion includes a first inverted staggered thin film transistor and a pixel electrode electrically connected to the first inverted staggered thin film transistor,
wherein the switch portion includes a second inverted staggered thin film transistor in which a microcrystalline semiconductor is used,
wherein the logic circuit portion includes an inverter circuit including a third inverted staggered thin film transistor and a fourth inverted staggered thin film transistor,
wherein the first to fourth inverted staggered thin film transistors have the same polarity, and
wherein the second inverted staggered thin film transistor comprises a first insulating layer, the microcrystalline semiconductor, and a second insulating layer interposed between a first gate electrode and a second gate electrode.

22. The display device according to claim 21, wherein the third inverted staggered thin film transistor comprises a third insulating layer, a semiconductor layer, and a fourth insulating layer between a third gate electrode and a fourth gate electrode.

23. The display device according to claim 21, wherein the third inverted staggered thin film transistor is a depletion type thin film transistor.

24. The display device according to claim 23, wherein the third inverted staggered thin film transistor includes a channel formation region using a microcrystalline semiconductor layer including an impurity element serving as a donor.

25. The display device according to claim 21, wherein the third inverted staggered thin film transistor is an enhancement type thin film transistor.

26. The display device according to claim 25, wherein the third inverted staggered thin film transistor includes a channel formation region using a microcrystalline semiconductor layer including an impurity element serving as an acceptor.

27. The display device according to claim 21,
wherein each of the first to fourth inverted staggered thin film transistors includes a gate insulating layer, a first semiconductor layer, between a source region and a drain region, which is in contact with the gate insulating layer, and a second semiconductor layer which is in contact with the first semiconductor layer,
wherein the first semiconductor layer is formed using a microcrystalline semiconductor layer, and
wherein the second semiconductor layer includes a microcrystalline semiconductor region and an amorphous semiconductor region.

28. The display device according to claim 27, wherein a cross-sectional shape of the microcrystalline semiconductor region is conical or pyramidal.

29. The display device according to claim 28,
wherein the inverter circuit is an EDMOS circuit.

30. The display device according to claim 21, wherein the inverter circuit is an EDMOS circuit.

31. The display device according to claim 21, wherein the driver circuit portion further includes a buffer portion.

32. A display device comprising:
a driver circuit portion including a logic circuit portion and a switch portion;
a pixel portion; and
a protection circuit configured to transfer charge to a common wiring when a surge voltage is applied,
wherein the pixel portion includes a first inverted staggered thin film transistor and a pixel electrode electrically connected to the first inverted staggered thin film transistor,
wherein the switch portion includes a second inverted staggered thin film transistor in which a microcrystalline semiconductor is used,
wherein the logic circuit portion includes an inverter circuit including a third inverted staggered thin film transistor and a fourth inverted staggered thin film transistor,
wherein the first to fourth inverted staggered thin film transistors have the same polarity, and
wherein the second inverted staggered thin film transistor includes an impurity element serving as a donor in a channel formation region.

33. The display device according to claim 32, wherein the third inverted staggered thin film transistor comprises a first insulating layer, a semiconductor layer, and a second insulating layer between a first gate electrode and a second gate electrode.

34. The display device according to claim 32, wherein the third inverted staggered thin film transistor is a depletion type thin film transistor.

35. The display device according to claim 34, wherein the third inverted staggered thin film transistor includes a channel formation region using a microcrystalline semiconductor layer including an impurity element serving as a donor.

36. The display device according to claim 32, wherein the third inverted staggered thin film transistor is an enhancement type thin film transistor.

37. The display device according to claim 36, wherein the third inverted staggered thin film transistor includes a channel formation region using a microcrystalline semiconductor layer including an impurity element serving as an acceptor.

38. The display device according to claim 32,
wherein each of the first to fourth inverted staggered thin film transistors includes a gate insulating layer, a first semiconductor layer, between a source region and a drain region, which is in contact with the gate insulating layer, and a second semiconductor layer which is in contact with the first semiconductor layer,
wherein the first semiconductor layer is formed using a microcrystalline semiconductor layer, and
wherein the second semiconductor layer includes a microcrystalline semiconductor region and an amorphous semiconductor region.

39. The display device according to claim 38, wherein a cross-sectional shape of the microcrystalline semiconductor region is conical or pyramidal.

40. The display device according to claim 32, wherein the driver circuit portion further includes a buffer portion.

* * * * *

UNITED STATES PATENT AND TRADEMARK OFFICE
CERTIFICATE OF CORRECTION

PATENT NO. : 8,284,142 B2  Page 1 of 1
APPLICATION NO. : 12/567413
DATED : October 9, 2012
INVENTOR(S) : Shunpei Yamazaki et al.

It is certified that error appears in the above-identified patent and that said Letters Patent is hereby corrected as shown below:

In the Specification:

Column 6, line 5, "line 323" should read "line 123"

Column 9, line 48, "switching on and of" should read "switching on and off"

Column 11, line 25, "period 15," should read "period T5,"

Column 13, line 8, "layer 379 is farmed," should read "layer 379 is formed"

Column 15, line 56, "335b are fanned" should read "335b are formed"

Column 30, line 42, "formed in a mariner" should read "formed in a manner"

Column 31, line 53, "FIGS. 24A to 24E Although" should read
          "FIGS. 24A to 24F. Although"

Column 33, line 6, "the wiring 5298" should read "the wiring 529B"

Column 34, line 67 to Column 35, line 1, "potential V." should read
          "potential $V_{ss}$."

In the Claims:

Column 45, line 56, Claim 17, line 1, "The display device according to claim 1" should read
          "The display device according to claim 11,"

Signed and Sealed this
Twenty-third Day of April, 2013

Teresa Stanek Rea
*Acting Director of the United States Patent and Trademark Office*